(12) United States Patent
Ouchi et al.

(10) Patent No.: US 7,005,948 B2
(45) Date of Patent: Feb. 28, 2006

(54) SURFACE ACOUSTIC WAVE DEVICE AND COMMUNICATION APPARATUS USING THE SAME

(75) Inventors: Minefumi Ouchi, Ishikawa-ken (JP); Norihiko Nakahashi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 42 days.

(21) Appl. No.: 10/774,632

(22) Filed: Feb. 10, 2004

(65) Prior Publication Data

US 2004/0201435 A1 Oct. 14, 2004

(30) Foreign Application Priority Data

Apr. 10, 2003 (JP) .............................. 2003-106002

(51) Int. Cl.
*H03H 9/64* (2006.01)
*H03H 9/72* (2006.01)

(52) U.S. Cl. .................. 333/195; 333/133; 310/313 D

(58) Field of Classification Search ........ 333/193–196, 333/133; 310/313 B, 313 D
See application file for complete search history.

(56) References Cited

U.S. PATENT DOCUMENTS

| | | | | |
|---|---|---|---|---|
| 6,621,380 B1 * | 9/2003 | Takamine | .................... | 333/195 |
| 6,717,489 B1 * | 4/2004 | Takamine | .................... | 333/193 |
| 6,762,657 B1 * | 7/2004 | Takamine | .................... | 333/193 |
| 6,771,145 B1 * | 8/2004 | Ouchi et al. | ................ | 333/195 |
| 2002/0000898 A1 * | 1/2002 | Takamine | .................... | 333/195 |
| 2002/0017969 A1 * | 2/2002 | Takamine | .................... | 333/193 |
| 2002/0021195 A1 | 2/2002 | Takamine | .................... | 333/195 |

FOREIGN PATENT DOCUMENTS

| | | |
|---|---|---|
| EP | 1 168 614 | 1/2002 |
| EP | 1 249 934 | 10/2002 |
| EP | 1 251 638 | 10/2002 |
| JP | 9-321574 | 12/1997 |
| JP | 10-117123 | 5/1998 |
| JP | 2001-144574 | 5/2001 |
| JP | 2001-217680 | 8/2001 |

OTHER PUBLICATIONS

Official Communication issued in the corresponding European Application No. 04290950.7; dated Jul. 27, 2005.

* cited by examiner

*Primary Examiner*—Barbara Summons
(74) *Attorney, Agent, or Firm*—Keating & Bennett, LLP

(57) ABSTRACT

A surface acoustic wave device includes first stage longitudinally coupled resonator type surface acoustic wave elements and second stage longitudinally coupled resonator type surface acoustic wave elements that are cascaded to each other and are arranged on a piezoelectric substrate. Each of the first and second stage longitudinally coupled resonator type surface acoustic wave elements is provided with at least three IDTs arranged along the direction of transmission of a surface acoustic wave. The central IDT of each of the longitudinally coupled resonator type surface acoustic wave elements includes narrow pitch electrode finger portions. At least one of the number and the pitch of the electrode fingers of the narrow pitch electrode finger portions of the first stage longitudinally coupled resonator type surface acoustic wave elements is set to be different from that of the second stage longitudinally coupled resonator type surface acoustic wave elements.

27 Claims, 42 Drawing Sheets

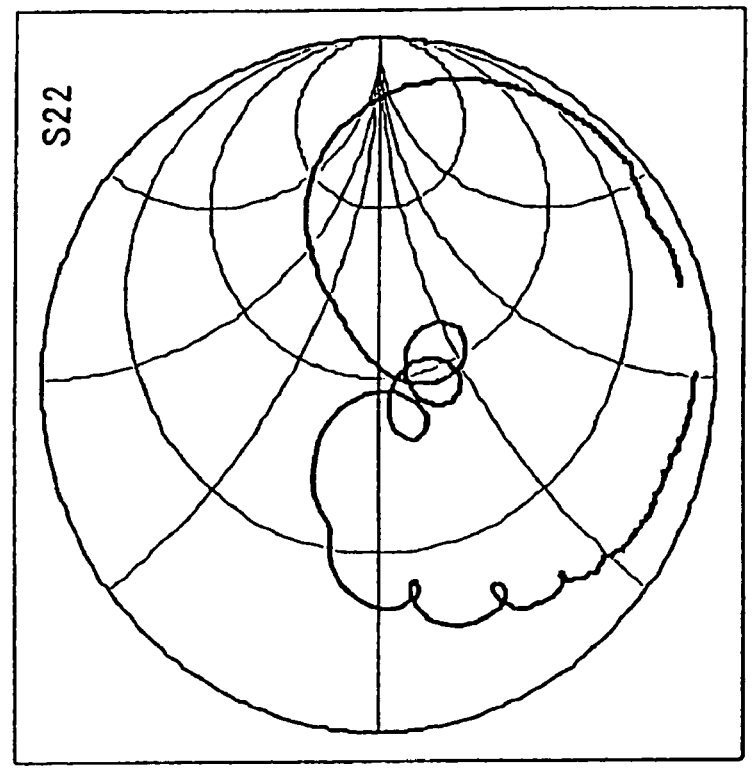
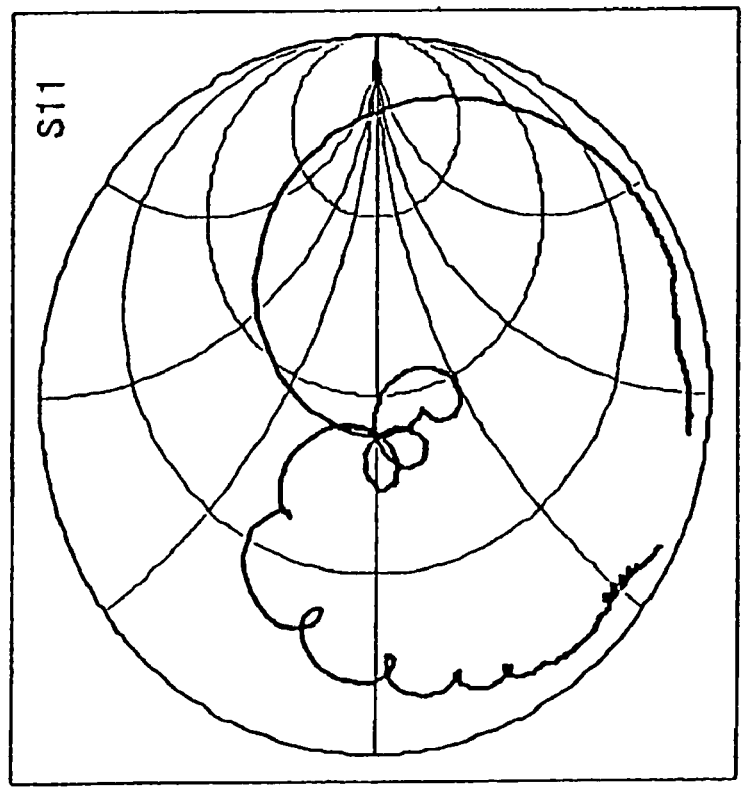
FIG. 3

FIG. 6
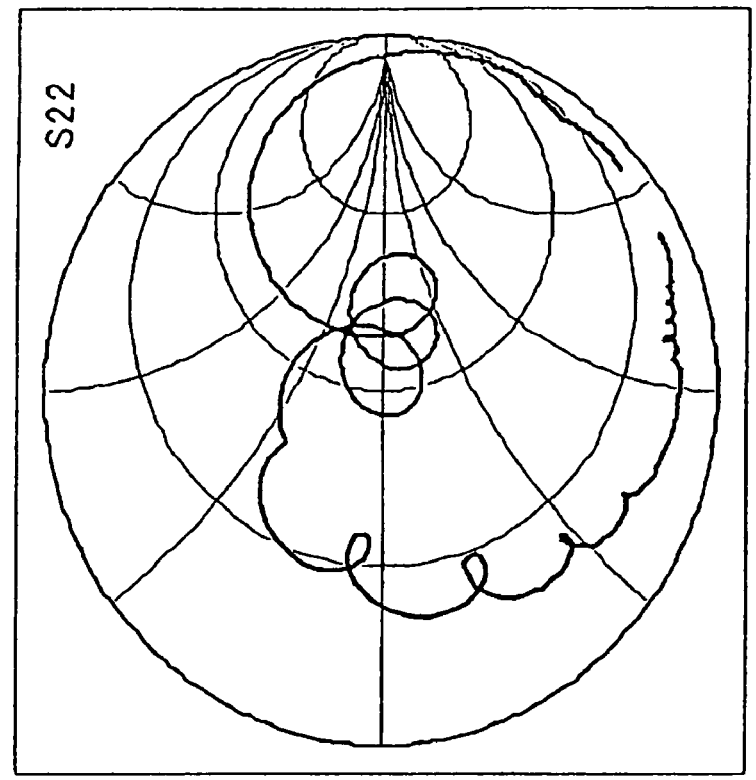
S22
CHARACTERISTIC IMPEDANCE 100 Ω
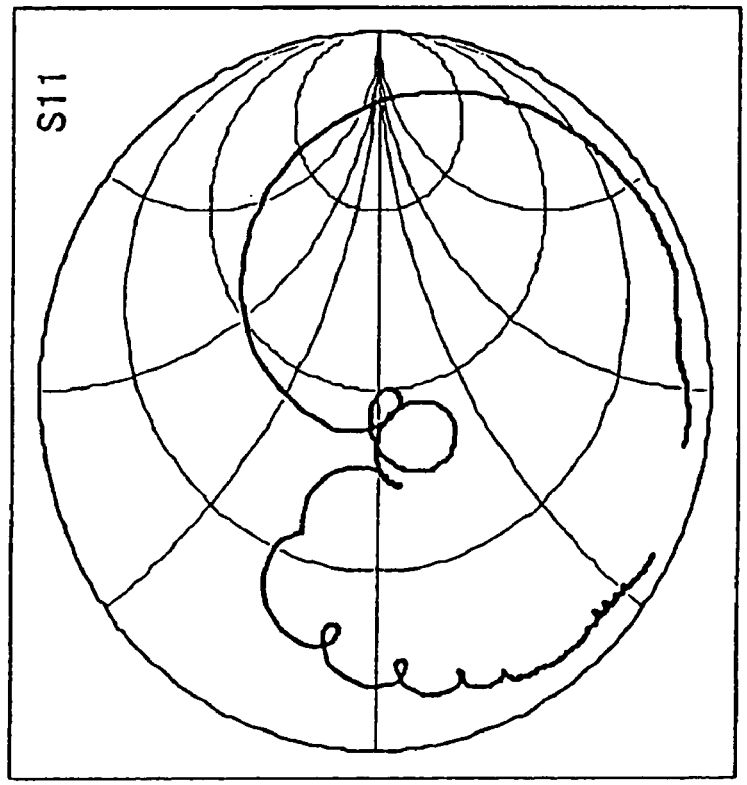
S11
CHARACTERISTIC IMPEDANCE 50 Ω

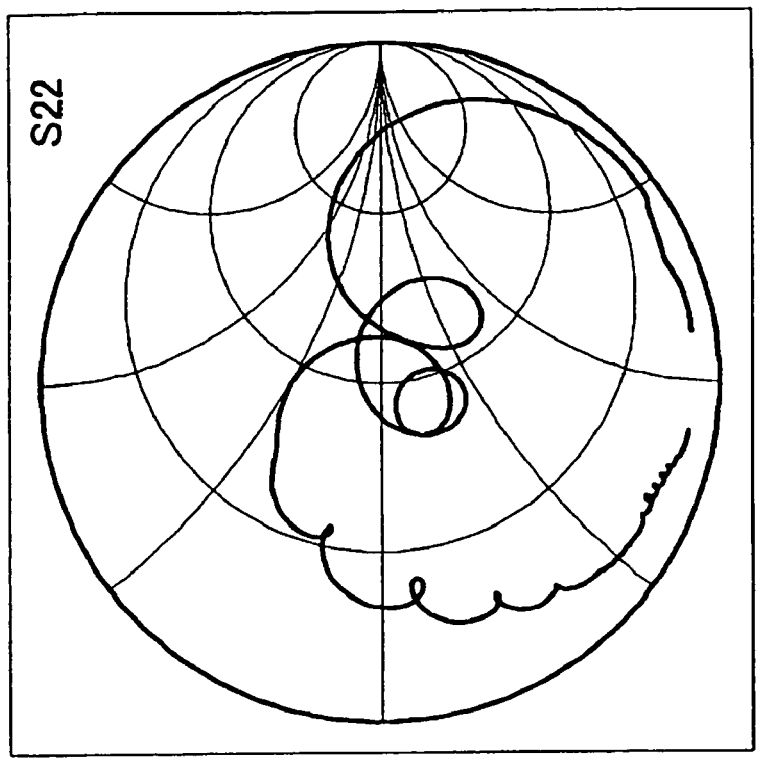
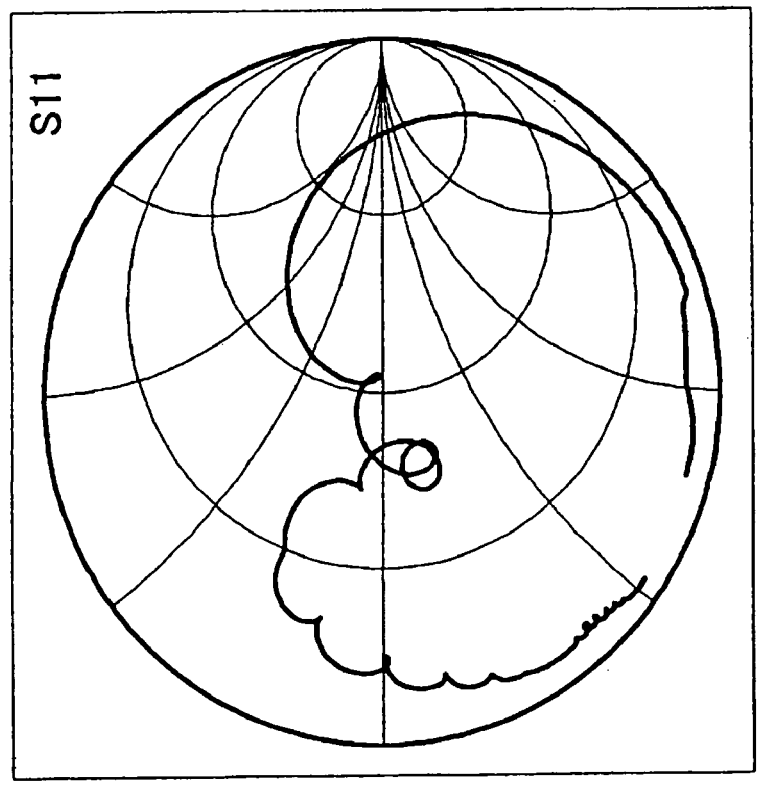
FIG. 9

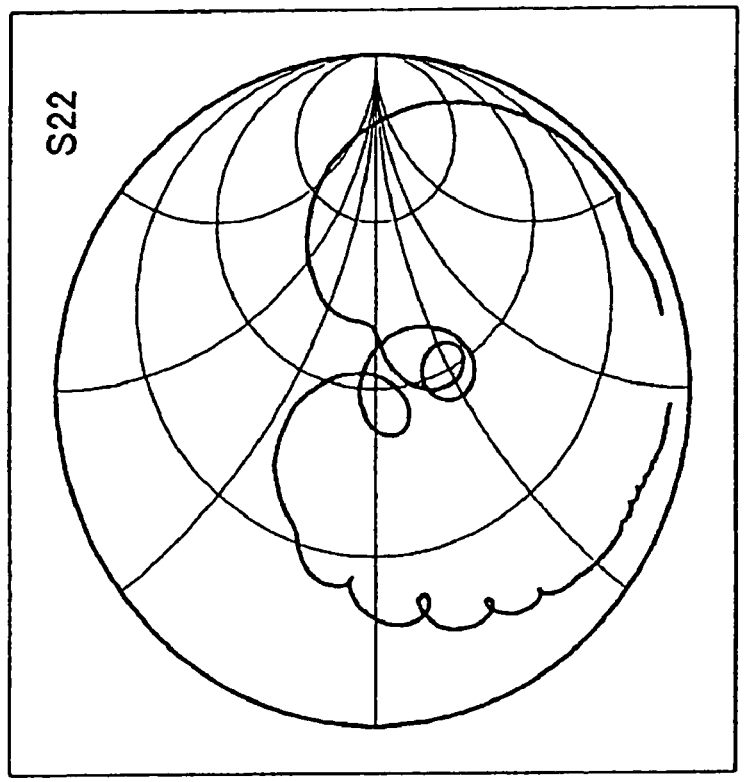
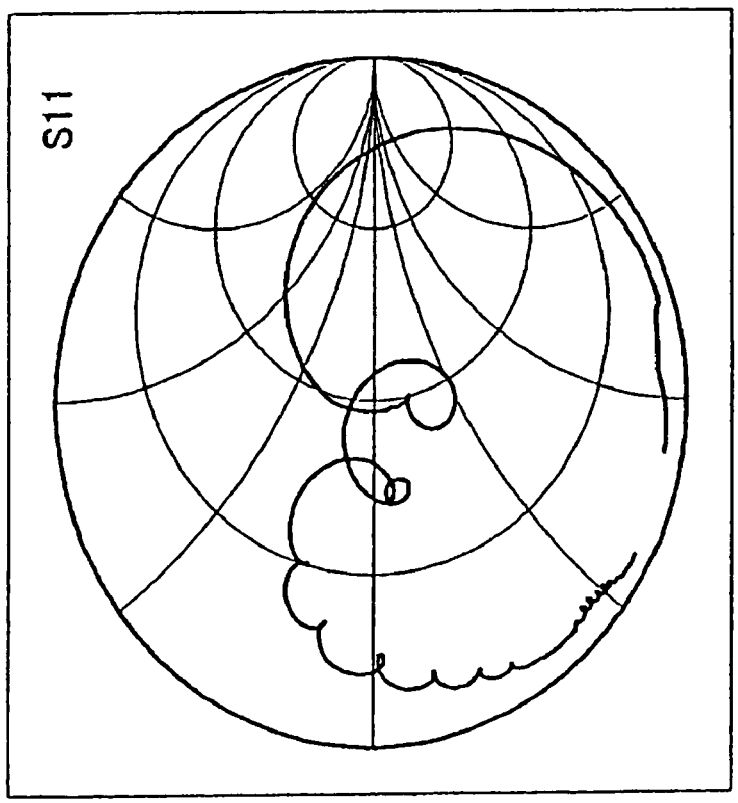
FIG. 12

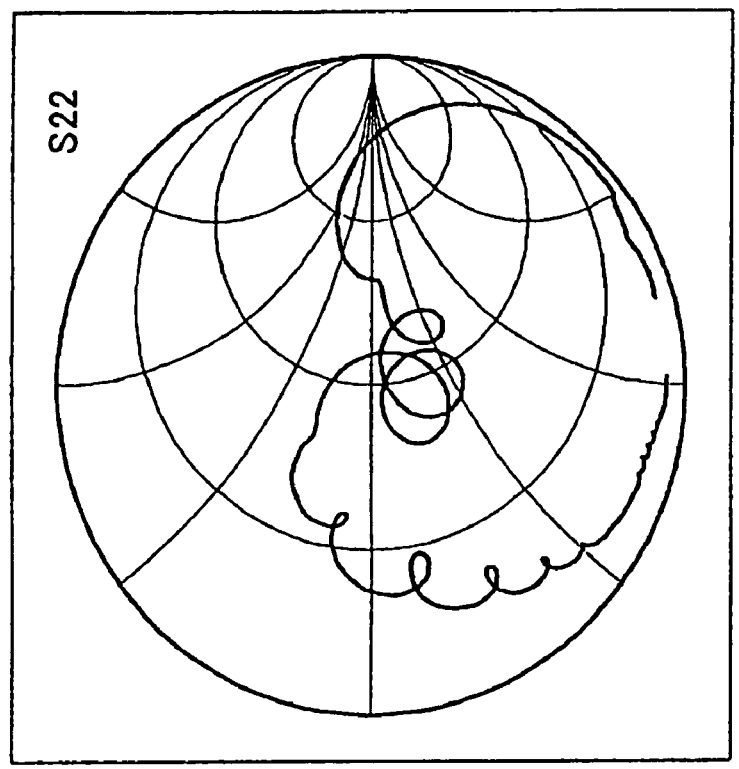
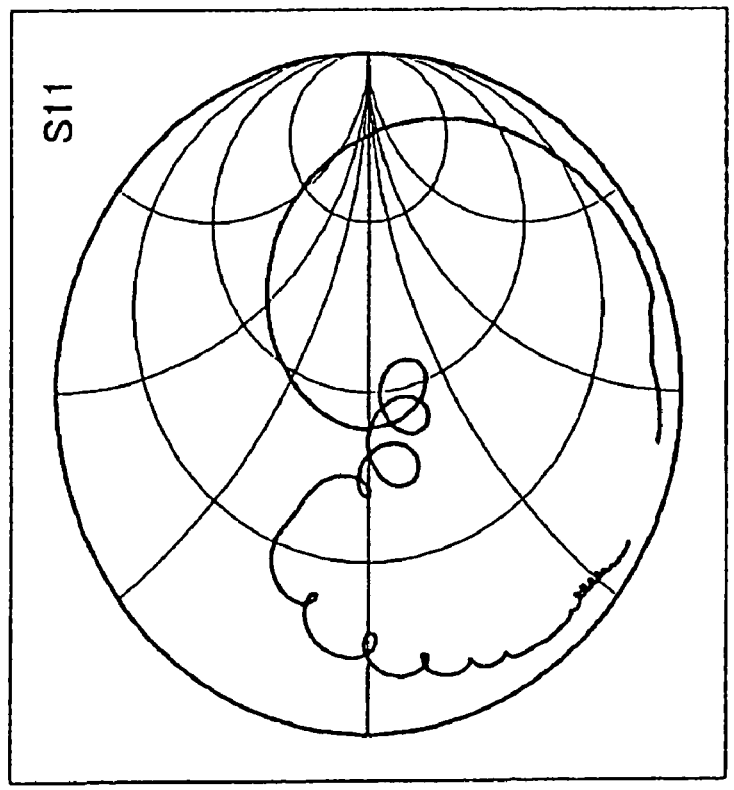
FIG. 15

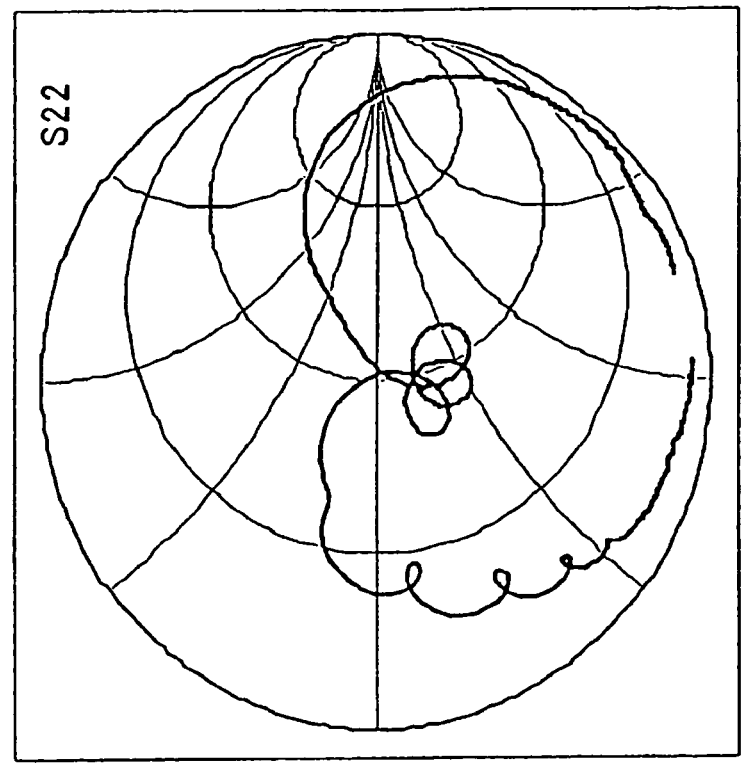
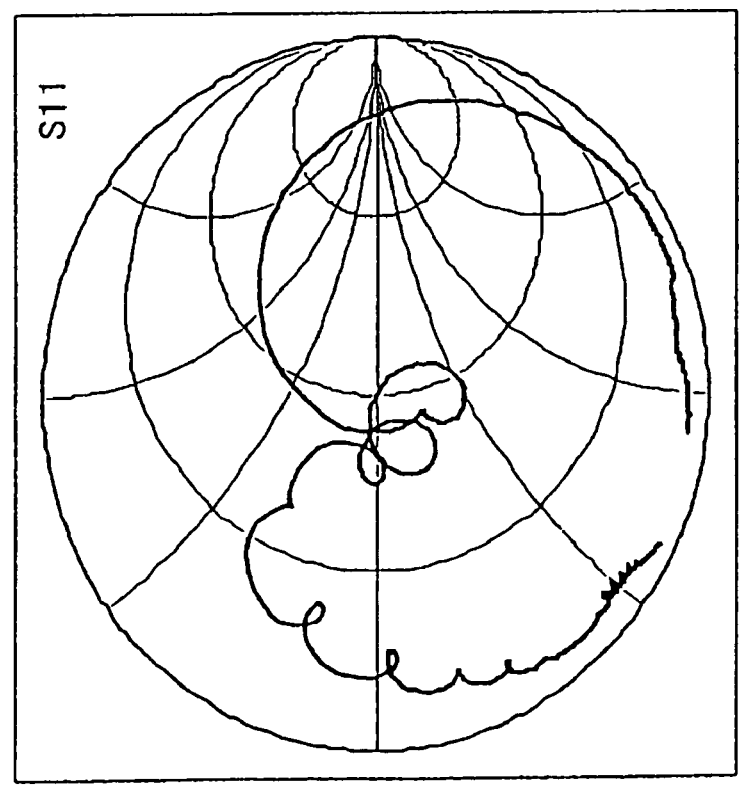
FIG. 18

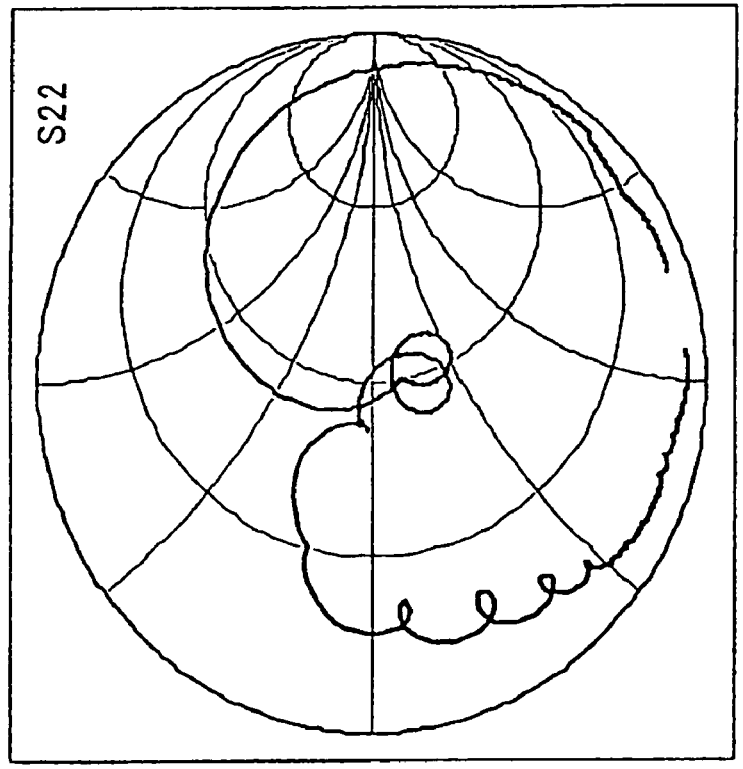
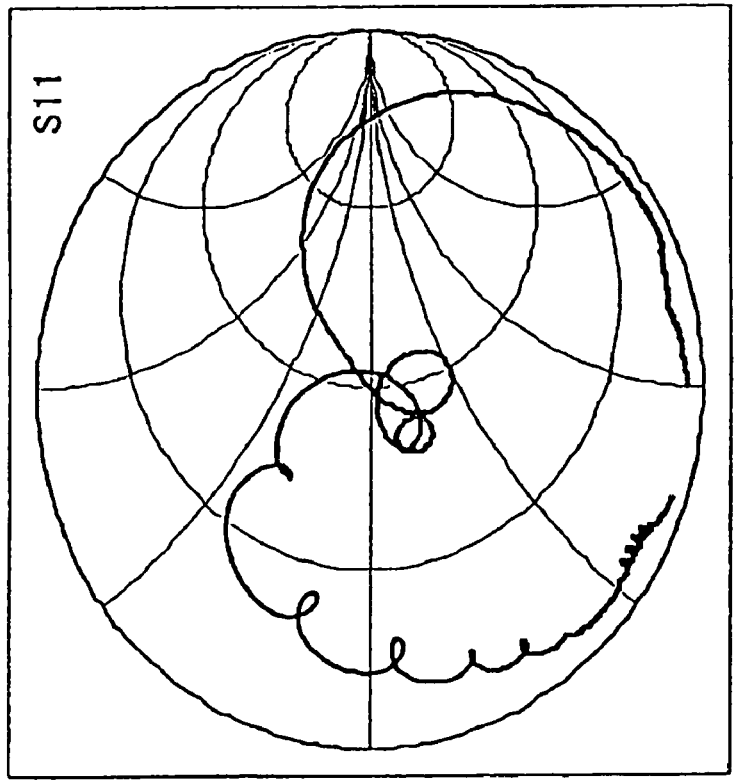
FIG. 21

FIG. 28
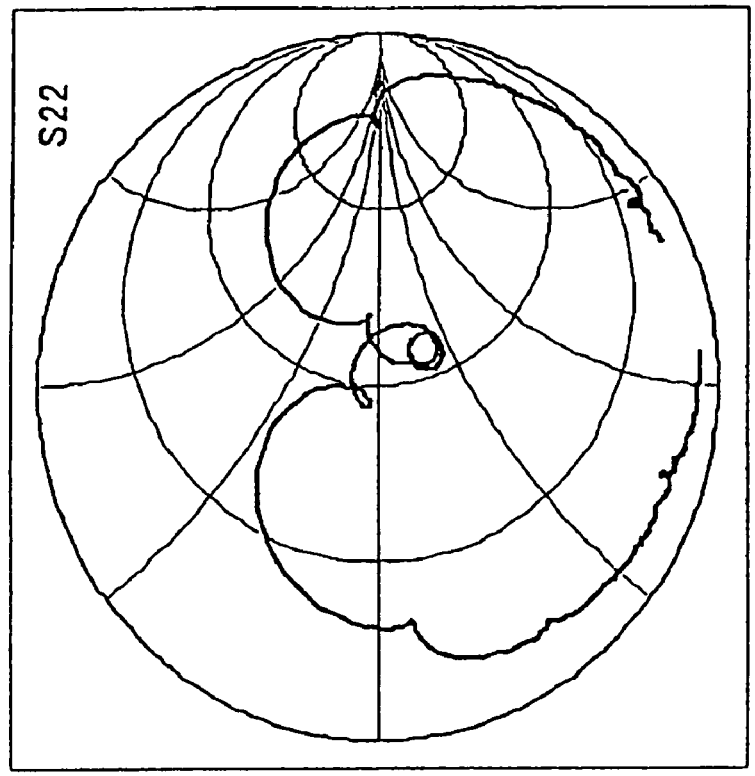
S22
CHARACTERISTIC IMPEDANCE 100 Ω
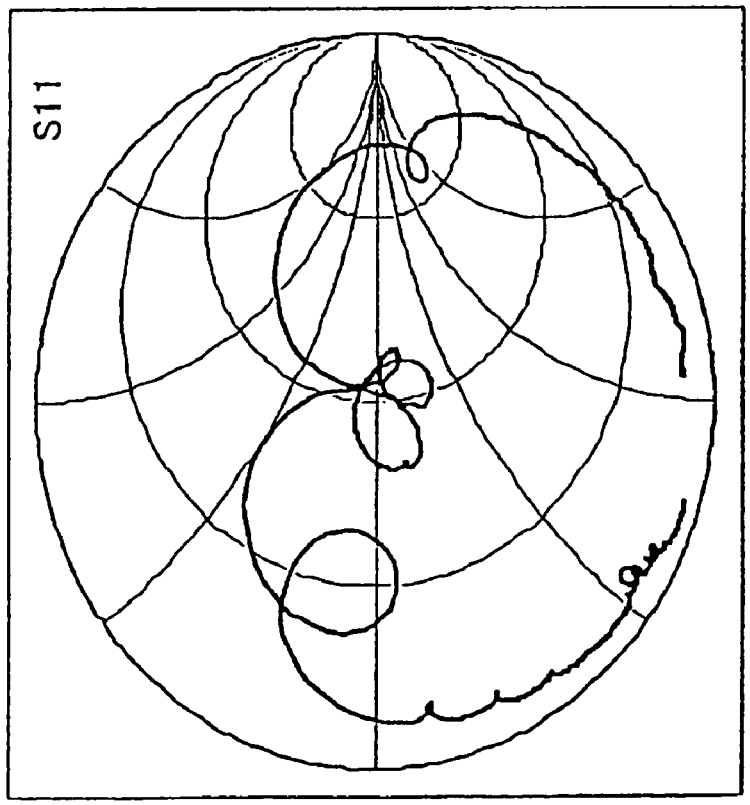
S11
CHARACTERISTIC IMPEDANCE 50 Ω

FIG. 31
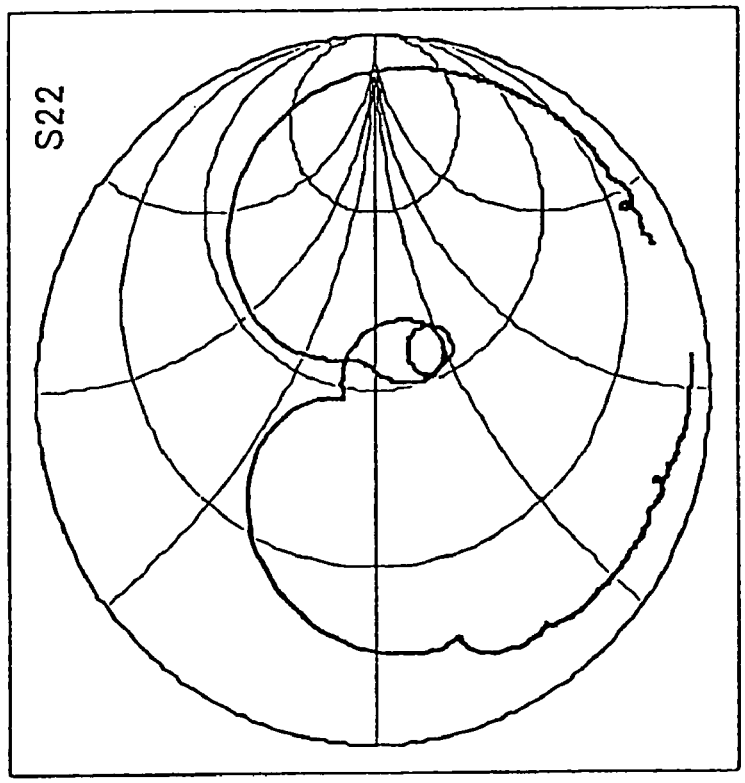
S22
CHARACTERISTIC IMPEDANCE 100 Ω
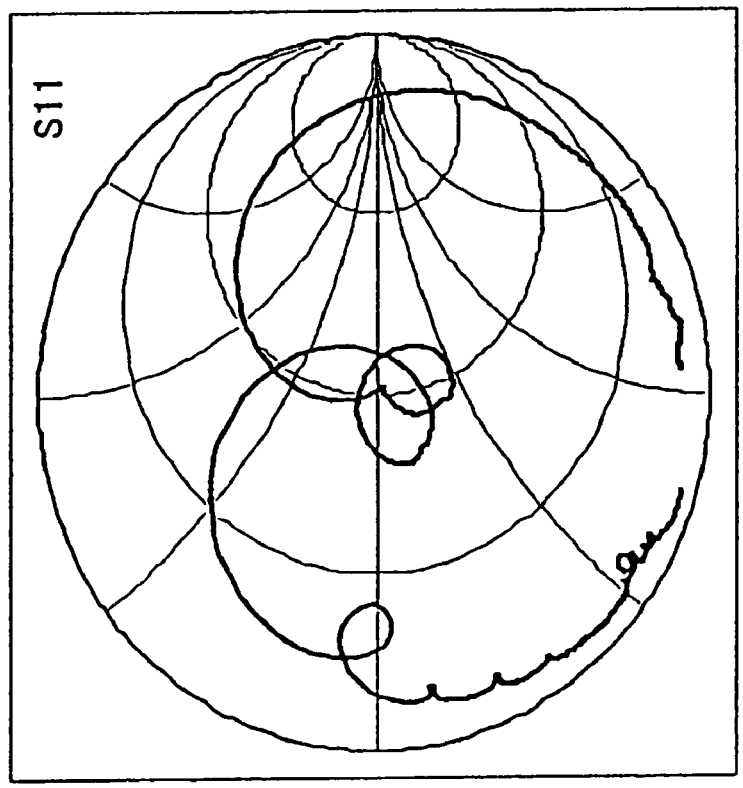
S11
CHARACTERISTIC IMPEDANCE 50 Ω

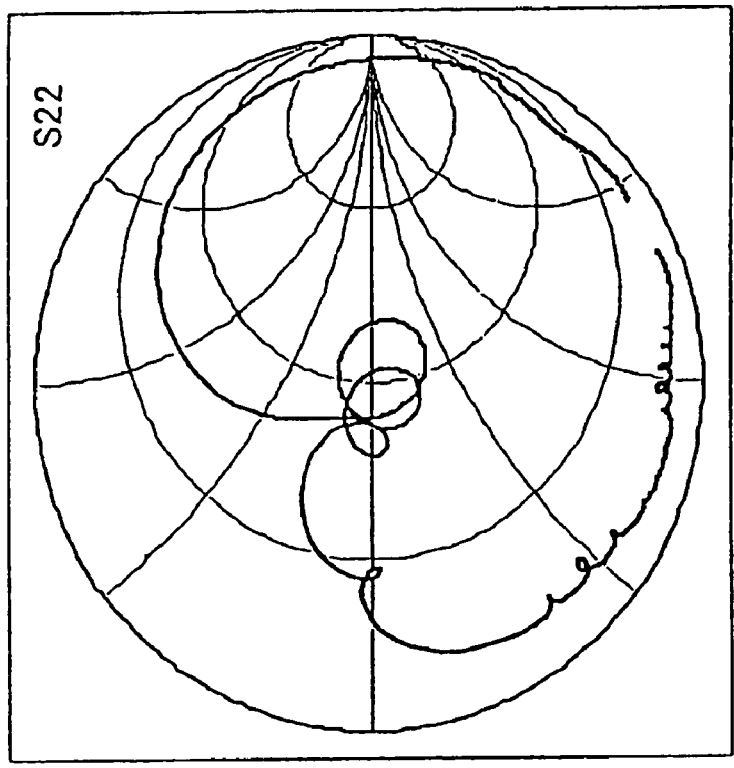
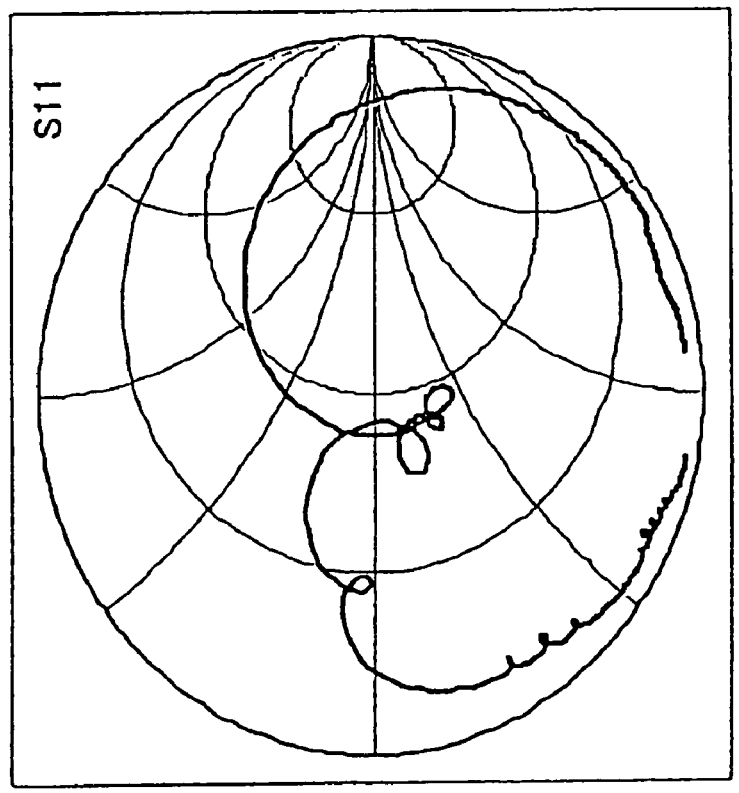
FIG. 38
PRIOR ART

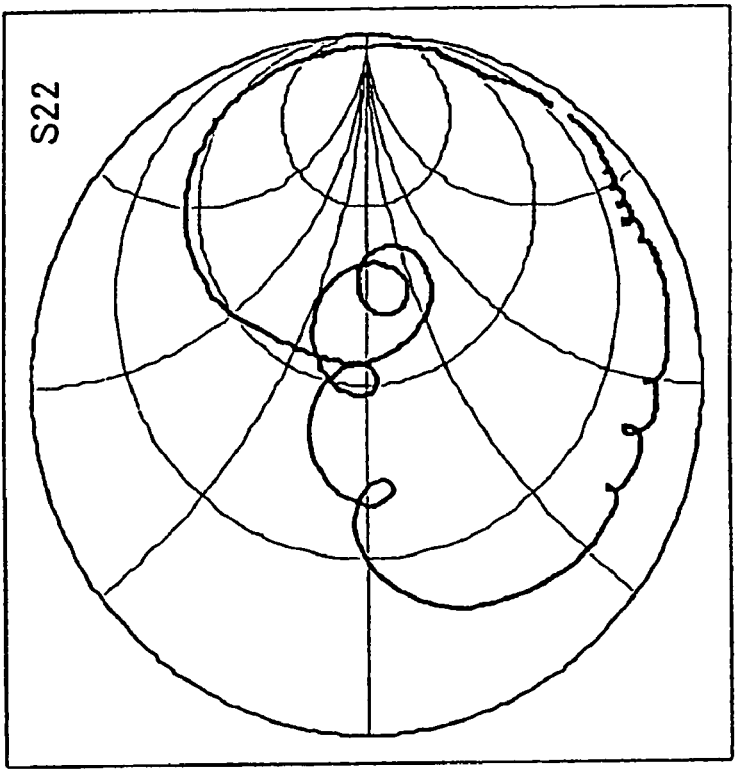
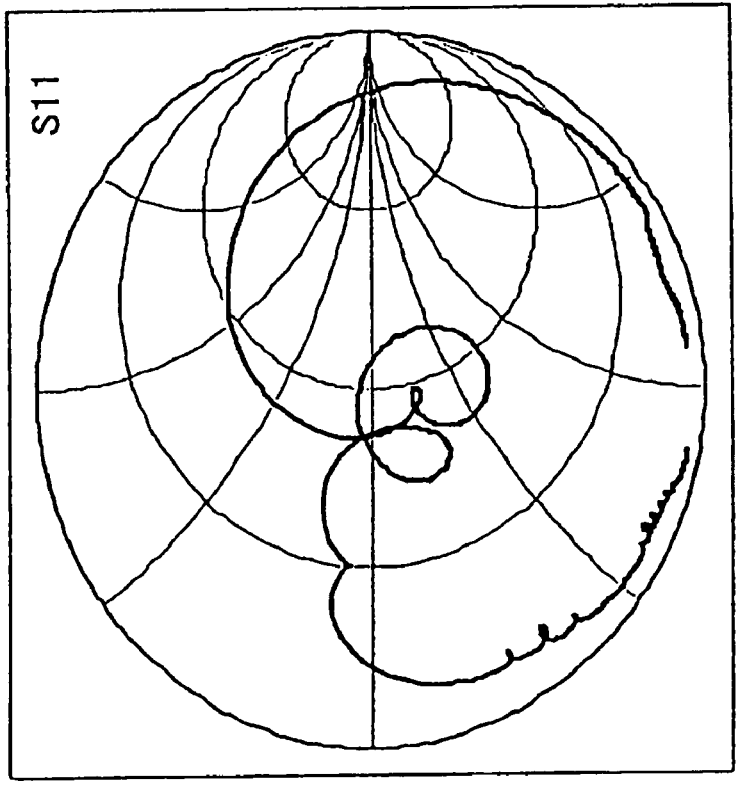
FIG. 41
PRIOR ART

US 7,005,948 B2

SURFACE ACOUSTIC WAVE DEVICE AND COMMUNICATION APPARATUS USING THE SAME

BACKGROUND OF THE INVENTION

1. Field of the Invention

The present invention relates to surface acoustic wave devices and communication apparatuses, and more particularly, to a surface acoustic wave device for use in, for example, a communication apparatus, such as a portable telephone set, and a communication apparatus including the surface acoustic wave device.

2. Description of the Related Art

In recent years, the demand for providing surface acoustic wave filters used for an RF stage of portable telephone sets with a balanced-unbalanced conversion function, the so-called balun function, has been increasing. In particular, longitudinally coupled resonator type surface acoustic wave filters that are easily adaptable to balanced-unbalanced signal conversion have become mainstream as band pass filters for an RF stage of portable telephone sets. The longitudinally coupled resonator type surface acoustic wave filter with such a balanced-unbalanced conversion function is connected to a mixer IC (hereinafter, referred to as a balanced mixer IC) having balanced or differential input and output. The use of such a balanced mixer IC achieves a reduction in susceptibility to noise and realizes output stabilization. Thus, the characteristics of a portable telephone set are also improved. Therefore, recently, the balanced mixer IC has been used frequently.

Although a surface acoustic wave filter used for an RF stage normally has an impedance of 50 Ω, the balanced mixer IC mostly has a high impedance, such as approximately 100 to 200 Ω. Since an impedance of 200 Ω has been mainstream, a characteristic exhibiting an approximately four times difference between an input impedance and an output impedance has been required for a longitudinally coupled resonator type surface acoustic wave filter. Also, characteristics exhibiting low loss and high attenuation are often required for a band pass filter for an RF stage.

In order to make an approximately four times difference between an input impedance and an output impedance and to achieve high attenuation, a method disclosed in Patent Document 1: Japanese Unexamined Patent Application Publication No. 10-117123 is widely used. A surface acoustic wave device (Conventional Example 1) disclosed in Patent Document 1 includes two two-stage connection surface acoustic wave filters 105 and 106, as shown in FIG. 35. In the two-stage connection surface acoustic wave filter 105, surface acoustic wave elements 101 and 103 are cascaded to each other. In the two-stage connection surface acoustic wave filter 106, surface acoustic wave elements 102 and 104 are cascaded to each other. The two-stage connection surface acoustic wave filters 105 and 106 have a balanced-unbalanced conversion function by changing the phase of the surface acoustic wave element 104 by 180 degrees. Also, one terminal of the two-stage connection surface acoustic wave filter 105 and one terminal of the two-stage connection surface acoustic wave filter 106 are electrically connected in parallel to an unbalanced terminal 111. The other terminal of the two-stage connection surface acoustic wave filter 105 and the other terminal of the two-stage connection surface acoustic wave filter 106 are connected in series to balanced terminals 112 and 113, respectively.

Not only is the balanced mixer IC required to have an impedance of 200 Ω, the range of a required impedance is being extended to 100 Ω or 150 Ω. In accordance with such a requirement, there is a necessity to design a longitudinally coupled resonator type surface acoustic wave filter with a balanced-unbalanced conversion function such that the input to output impedance ratio is 1:2 or 1:3. For example, in a surface acoustic wave device (Conventional Example 2) according to Patent Document 2: Japanese Patent No. 3239064 (Japanese Unexamined Patent Application Publication No. 9-321574), the impedance ratio of input terminal to output terminal can be set to a desired value by making a cross width W1 of a surface acoustic wave element 201 including interdigital transducers (hereinafter, referred to as IDTs) 203 to 205 different from a cross width W2 of a surface acoustic wave element 202 including IDTs 206 to 208, as shown in FIG. 36. In the surface acoustic wave elements 201 and 202, the IDTs 203 and 206 are cascaded to each other, and the IDTs 205 and 208 are cascaded to each other. Also, the surface acoustic wave elements 201 and 202 are connected to an input terminal 211 and an output terminal 212, respectively.

However, the arrangement of the surface acoustic wave device shown in FIG. 36 has a problem in that the voltage standing wave ratio (VSWR) is deteriorated. One of the causes of this problem is that making the cross width W1 of the surface acoustic wave element 201 different from the cross width W2 of the surface acoustic wave element 202 causes the difference in the impedances of the cascaded IDTs 203 and 206 and the difference in the impedances of the cascaded IDTs 205 and 208 and that the impedance differences cause mismatching in a joined surface of the surface acoustic wave elements 201 and 202. Thus, ideally, it is desirable that only the impedance of the IDT 204, which is connected to the input terminal 211 of the surface acoustic wave device, and the impedance of the IDT 207, which is connected to the output terminal 212 of the surface acoustic wave device, shown in FIG. 36, be adjusted. However, in a case where an impedance adjustment is performed by changing the cross widths only of the IDTs 204 and 207, a leakage of a surface acoustic wave is caused in a transmission path for surface acoustic waves, thus deteriorating the characteristics. Accordingly, it is difficult to set the impedance ratio of the input and output terminals 211 and 212 to a desired value without deteriorating the characteristics by making the cross width W1 of the surface acoustic wave element 201 different from the cross width W2 of the surface acoustic wave element 202.

An adjustment of the impedance ratio of unbalanced terminal to balanced terminal performed by applying the arrangement of the surface acoustic wave device shown in FIG. 36 to the surface acoustic wave device shown in FIG. 35 will now be studied.

FIGS. 37 to 39 show characteristics of the longitudinally coupled resonator type surface acoustic wave filters shown in FIG. 35 having a balanced-unbalanced conversion function with an unbalanced terminal impedance of 50 Ω and a balanced terminal impedance of 200 Ω. These characteristics are provided by the surface acoustic wave device shown in FIG. 35 designed as a personal communication system (PCS) receiving filter and the frequency range necessary for the passband is between 1,930 MHz and 1,990 MHz. Here, the cross width W1 of the surface acoustic wave elements of the longitudinally coupled resonator type surface acoustic wave filters connected on the unbalanced terminal side is set to be equal to the cross width W2 of the surface acoustic wave elements of the longitudinally coupled resonator type surface acoustic wave filters connected on the balanced terminal side. FIG. 37, FIG. 38, and FIG. 39 show the transmission characteristics, the impedance characteristics, and the VSWR, respectively, near the pass band. In FIGS. 38 and 39, reference numeral S11 represents an input side and reference numeral S22 represents an output side. As is clear from FIG. 38, the impedance ratio of unbalanced terminal to balanced terminal is approximately 1:4. Also, as is clear from FIG. 39, excellent characteristics exhibiting a VSWR of approximately 1.7 in the pass band can be achieved.

FIGS. 40 to 42 show the characteristics of the surface acoustic wave device shown in FIG. 35 when the cross width W1 of the surface acoustic wave elements of the longitudinally coupled resonator type surface acoustic wave filters connected on the unbalanced terminal side is set to be different from the cross width W2 of the surface acoustic wave elements of the longitudinally coupled resonator type surface acoustic wave filters connected on the balanced terminal side, as disclosed in Patent Document 2, in order to set the impedance ratio of unbalanced terminal to balanced terminal to 1:3. In order to set the impedance ratio of unbalanced terminal to balanced terminal to 1:4 and 1:3, the cross width W1 must be smaller than the cross width W2. Here, the cross widths W1 and W2 are set so as to satisfy the condition W2/W1≈1.57. FIG. 40, FIG. 41, and FIG. 42 show the transmission characteristics, the impedance characteristics, and the VSWR, respectively, near the pass band. In FIGS. 41 and 42, reference numeral S11 represents an input side and reference numeral S22 represents an output side. As is clear from FIG. 42, the VSWR is deteriorated to approximately 2.3 in the pass band since matching cannot be achieved with a desired impedance ratio of unbalanced terminal to balanced terminal (50 Ω:100 Ω).

Accordingly, it is also difficult for the surface acoustic wave device with the arrangement of a combination of the arrangement shown in FIG. 35 (Conventional Example 1) and the arrangement shown in FIG. 36 (Conventional Example 2) to set the impedance ratio of unbalanced terminal to balanced terminal to 1:2 or 1:3. One of the causes of this problem is that, similarly to the problem caused in the surface acoustic wave device shown in FIG. 36, making the cross widths of the surface acoustic wave elements different from each other causes the difference in the impedances of the cascaded IDTs and that the impedance difference causes impedance mismatching in a joined surface of the two surface acoustic wave elements. Thus, similarly to the surface acoustic wave device with the arrangement shown in FIG. 36, it is also difficult for the surface acoustic wave device with the arrangement of a combination of the arrangement shown in FIG. 35 and the arrangement shown in FIG. 36 to set the impedance ratio of input terminal and output terminal to a desired value without deteriorating the characteristics by making the cross widths different from each other.

Thus, a method for achieving matching with an approximately two or three times difference between the impedances of an unbalanced terminal and a balanced terminal by adding a matching element outside a surface acoustic wave device, such as, adding an inductance element in parallel and a capacitance element in series on a balanced terminal side, apart from the design of the surface acoustic wave device, has been used. However, this method has a problem in that the number of component elements is increased due to addition of an external element and the miniaturization is thus prevented. Thus, this is inappropriate for current requirements.

SUMMARY OF THE INVENTION

In order to overcome the problems described above, preferred embodiments of the present invention provide a surface acoustic wave device having an excellent VSWR and exhibiting a desired impedance ratio of input terminal to output terminal and a communication apparatus including such a novel surface acoustic wave device.

A surface acoustic wave device according to a preferred embodiment of the present invention includes a first longitudinally coupled resonator type surface acoustic wave element including at least three interdigital transducers arranged along the direction of transmission of a surface acoustic wave, each of the interdigital transducers being provided with a plurality of electrode fingers, and a second longitudinally coupled resonator type surface acoustic wave element including at least three interdigital transducers arranged along the direction of transmission of the surface acoustic wave, each of the interdigital transducers being provided with a plurality of electrode fingers. The first longitudinally coupled resonator type surface acoustic wave element and the second longitudinally coupled resonator type surface acoustic wave element are cascaded to each other and are arranged on a piezoelectric substrate. At least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers. The number and the pitch of the electrode fingers of the narrow pitch electrode finger portion of the first longitudinally coupled resonator type surface acoustic wave element are different from the number and the pitch of the electrode fingers of the narrow pitch electrode finger portion of the second longitudinally coupled resonator type surface acoustic wave element.

A surface acoustic wave device according to another preferred embodiment of the present invention includes a first longitudinally coupled resonator type surface acoustic wave element including at least three interdigital transducers arranged along the direction of transmission of a surface acoustic wave, each of the interdigital transducers being provided with a plurality of electrode fingers, and a second longitudinally coupled resonator type surface acoustic wave element including at least three interdigital transducers arranged along the direction of transmission of the surface acoustic wave, each of the interdigital transducers being provided with a plurality of electrode fingers. The first longitudinally coupled resonator type surface acoustic wave element and the second longitudinally coupled resonator type surface acoustic wave element are cascaded to each other and are arranged on a piezoelectric substrate. At least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers. N1 is not equal to N2, where N1 represents the number of the electrode fingers of the narrow pitch electrode finger portion of the first longitudinally coupled resonator type surface acoustic wave element and N2 represents the number of the electrode fingers of the narrow pitch electrode finger portion of the second longitudinally coupled resonator type surface acoustic wave element.

A surface acoustic wave device according to yet another preferred embodiment of the present invention includes a first longitudinally coupled resonator type surface acoustic wave element including at least three interdigital transducers arranged along the direction of transmission of a surface acoustic wave, each of the interdigital transducers being provided with a plurality of electrode fingers, and a second longitudinally coupled resonator type surface acoustic wave element including at least three interdigital transducers arranged along the direction of transmission of the surface acoustic wave, each of the interdigital transducers being provided with a plurality of electrode fingers. The first longitudinally coupled resonator type surface acoustic wave element and the second longitudinally coupled resonator type surface acoustic wave element are cascaded to each other and are arranged on a piezoelectric substrate. At least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers. P1 is not equal to P2, where P1 represents the pitch of the electrode fingers of the narrow pitch electrode finger portion of the first longitudinally coupled resonator type surface acoustic wave element and P2 represents the pitch of the electrode fingers of the narrow pitch electrode finger portion of the second longitudinally coupled resonator type surface acoustic wave element.

In other words, in the two-stage cascaded surface acoustic wave device according to various preferred embodiments of the present invention including cascaded two longitudinally coupled surface acoustic wave elements, at least one of the number and the pitch of the electrode fingers of the narrow pitch electrode finger portion of a first longitudinally coupled resonator type surface acoustic wave element is different from that of the second longitudinally coupled resonator type surface acoustic wave element.

With the arrangement described above, a surface acoustic wave device exhibiting an excellent VSWR and capable of setting the impedance ratio of input terminal to output terminal to a desired value can be provided. Also, the surface acoustic wave device described above can be miniaturized since the impedance ratio of input terminal to output terminal can be matched without adding an inductance element or the like.

Also, in the surface acoustic wave device according to various preferred embodiments of the present invention having the arrangement described above, it is preferable that each of the first and second longitudinally coupled resonator type surface acoustic wave elements include three interdigital transducers. It is also preferable that the number of the electrode fingers of the central interdigital transducer of the first longitudinally coupled resonator type surface acoustic wave element be different from the number of the electrode fingers of the central interdigital transducer of the second longitudinally coupled resonator type surface acoustic wave element.

Also, in the surface acoustic wave device according to preferred embodiments of the present invention having the arrangement described above, it is preferable that at least one surface acoustic wave resonator be cascaded between the first longitudinally coupled resonator type surface acoustic wave element and the second longitudinally coupled resonator type surface acoustic wave element. By providing the surface acoustic wave resonator, a surface acoustic wave device having characteristics in which, particularly, the attenuation in an area higher than the pass band is ensured and in which the attenuation changes abruptly can be provided.

A surface acoustic wave device according to another preferred embodiment of the present invention includes a first surface acoustic wave filter element including a first longitudinally coupled resonator type surface acoustic wave element provided with at least three interdigital transducers arranged along the direction of transmission of a surface acoustic wave, each of the interdigital transducers being provided with a plurality of electrode fingers, and a second longitudinally coupled resonator type surface acoustic wave element provided with at least three interdigital transducers arranged along the direction of transmission of the surface acoustic wave, each of the interdigital transducers being provided with a plurality of electrode fingers, the first longitudinally coupled resonator type surface acoustic wave element and the second longitudinally coupled resonator type surface acoustic wave element being cascaded to each other and being arranged on a piezoelectric substrate. The surface acoustic wave device also includes a second surface acoustic wave filter element including a third longitudinally coupled resonator type surface acoustic wave element provided with at least three interdigital transducers arranged along the direction of transmission of the surface acoustic wave, each of the interdigital transducers being provided with a plurality of electrode fingers, and a fourth longitudinally coupled resonator type surface acoustic wave element provided with at least three interdigital transducers arranged along the direction of transmission of the surface acoustic wave, each of the interdigital transducers being provided with a plurality of electrode fingers, the third longitudinally coupled resonator type surface acoustic wave element and the fourth longitudinally coupled resonator type surface acoustic wave element being cascaded to each other and being arranged on the piezoelectric substrate, the phase of input and output signals of the second surface acoustic wave filter element being approximately 180 degrees different from the phase of input and output signals of the first surface acoustic wave filter element. One terminal of the first surface acoustic wave filter element and one terminal of the second surface acoustic wave filter element are electrically connected in parallel. The other terminal of the first surface acoustic wave filter element and the other terminal of the second surface acoustic wave filter element are electrically connected in series. At least one of the interdigital transducers of each of the first, second, third, and fourth longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers. The number and the pitch of the electrode fingers of the narrow pitch electrode finger portion of the first longitudinally coupled resonator type surface acoustic wave element are different from the number and the pitch of the electrode fingers of the narrow pitch electrode finger portion of the second longitudinally coupled resonator type surface acoustic wave element. The number and the pitch of the electrode fingers of the narrow pitch electrode finger portion of the third longitudinally coupled resonator type surface acoustic wave element are different from the number and the pitch of the electrode fingers of the narrow pitch electrode finger portion of the fourth longitudinally coupled resonator type surface acoustic wave element.

A surface acoustic wave device according to yet another preferred embodiment of the present invention includes a first surface acoustic wave filter element including a first longitudinally coupled resonator type surface acoustic wave element provided with at least three interdigital transducers arranged along the direction of transmission of a surface acoustic wave, each of the interdigital transducers being provided with a plurality of electrode fingers, and a second longitudinally coupled resonator type surface acoustic wave element provided with at least three interdigital transducers arranged along the direction of transmission of the surface acoustic wave, each of the interdigital transducers being provided with a plurality of electrode fingers, the first longitudinally coupled resonator type surface acoustic wave element and the second longitudinally coupled resonator type surface acoustic wave element being cascaded to each other and being arranged on a piezoelectric substrate. The surface acoustic wave device also includes a second surface acoustic wave filter element including a third longitudinally coupled resonator type surface acoustic wave element provided with at least three interdigital transducers arranged along the direction of transmission of the surface acoustic wave, each of the interdigital transducers being provided with a plurality of electrode fingers, and a fourth longitudinally coupled resonator type surface acoustic wave element provided with at least three interdigital transducers arranged along the direction of transmission of the surface acoustic wave, each of the interdigital transducers being provided with a plurality of electrode fingers, the third longitudinally coupled resonator type surface acoustic wave element and the fourth longitudinally coupled resonator type surface acoustic wave element being cascaded to each other and being arranged on the piezoelectric substrate, the phase of input and output signals of the second surface acoustic wave filter element being approximately 180 degrees different from the phase of input and output signals of the first surface acoustic wave filter element. One terminal of the first surface acoustic wave filter element and one terminal of the second surface acoustic wave filter element are electrically connected in parallel. The other terminal of the first surface acoustic wave filter element and the other terminal of the second surface acoustic wave filter element are electrically connected in series. At least one of the interdigital transducers of each of the first, second, third, and fourth longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers. The number of the electrode fingers of the narrow pitch electrode finger portion of the first longitudinally coupled resonator type surface acoustic wave element is different from the number of the electrode fingers of the narrow pitch electrode finger portion of the second longitudinally coupled resonator type surface acoustic wave element. The number of the electrode fingers of the narrow pitch electrode finger portion of the third longitudinally coupled resonator type surface acoustic wave element is different from the number of the electrode fingers of the narrow pitch electrode finger portion of the fourth longitudinally coupled resonator type surface acoustic wave element.

A surface acoustic wave device according to another preferred embodiment of the present invention includes a first surface acoustic wave filter element including a first longitudinally coupled resonator type surface acoustic wave element provided with at least three interdigital transducers arranged along the direction of transmission of a surface acoustic wave, each of the interdigital transducers being provided with a plurality of electrode fingers, and a second longitudinally coupled resonator type surface acoustic wave element provided with at least three interdigital transducers arranged along the direction of transmission of the surface acoustic wave, each of the interdigital transducers being provided with a plurality of electrode fingers, the first longitudinally coupled resonator type surface acoustic wave element and the second longitudinally coupled resonator type surface acoustic wave element being cascaded to each other and being arranged on a piezoelectric substrate. The surface acoustic wave device also includes a second surface acoustic wave filter element including a third longitudinally coupled resonator type surface acoustic wave element provided with at least three interdigital transducers arranged along the direction of transmission of the surface acoustic wave, each of the interdigital transducers being provided with a plurality of electrode fingers, and a fourth longitudinally coupled resonator type surface acoustic wave element provided with at least three interdigital transducers arranged along the direction of transmission of the surface acoustic wave, each of the interdigital transducers being provided with a plurality of electrode fingers, the third longitudinally coupled resonator type surface acoustic wave element and the fourth longitudinally coupled resonator type surface acoustic wave element being cascaded to each other and being arranged on the piezoelectric substrate, the phase of input and output signals of the second surface acoustic wave filter element being approximately 180 degrees different from the phase of input and output signals of the first surface acoustic wave filter element. One terminal of the first surface acoustic wave filter element and one terminal of the second surface acoustic wave filter element are electrically connected in parallel. The other terminal of the first surface acoustic wave filter element and the other terminal of the second surface acoustic wave filter element are electrically connected in series. At least one of the interdigital transducers of each of the first, second, third, and fourth longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers. The pitch of the electrode fingers of the narrow pitch electrode finger portion of the first longitudinally coupled resonator type surface acoustic wave element is different from the pitch of the electrode fingers of the narrow pitch electrode finger portion of the second longitudinally coupled resonator type surface acoustic wave element. The pitch of the electrode fingers of the narrow pitch electrode finger portion of the third longitudinally coupled resonator type surface acoustic wave element is different from the pitch of the electrode fingers of the narrow pitch electrode finger portion of the fourth longitudinally coupled resonator type surface acoustic wave element.

In other words, in the surface acoustic wave device according to various preferred embodiments of the present invention including two two-stage cascaded surface acoustic wave filter elements each including two longitudinally coupled surface acoustic wave elements, at least one of the number and the pitch of the electrode fingers of the narrow pitch electrode finger portion of one longitudinally coupled resonator type surface acoustic wave element is different from that of the other longitudinally coupled resonator type surface acoustic wave element in each of the surface acoustic wave filter elements.

With the arrangement described above, a surface acoustic wave device exhibiting an excellent VSWR and capable of setting the impedance ratio of input terminal to output terminal to a desired value can be provided. Also, the surface acoustic wave device described above can be miniaturized since the impedance ratio of input terminal to output terminal can be matched without adding an inductance element or the like.

Also, in the surface acoustic wave device according to various preferred embodiments of the present invention having the arrangement described above, it is preferable that each of the first, second, third, and fourth longitudinally coupled resonator type surface acoustic wave elements include three interdigital transducers. It is also preferable that the number of the electrode fingers of the central interdigital transducer of the first longitudinally coupled resonator type surface acoustic wave element be different from the number of the electrode fingers of the central interdigital transducer of the second longitudinally coupled resonator type surface acoustic wave element and that the number of the electrode fingers of the central interdigital transducer of the third longitudinally coupled resonator type surface acoustic wave element be different from the number of the electrode fingers of the central interdigital transducer of the fourth longitudinally coupled resonator type surface acoustic wave element.

In addition, in the surface acoustic wave device according to preferred embodiments of the present invention with the arrangement described above, it is preferable that at least one surface acoustic wave resonator be cascaded between the first longitudinally coupled resonator type surface acoustic wave element and the second longitudinally coupled resonator type surface acoustic wave element and between the third longitudinally coupled resonator type surface acoustic wave element and the fourth longitudinally coupled resonator type surface acoustic wave element. By providing the surface acoustic wave resonator, a surface acoustic wave device having characteristics in which, particularly, the attenuation in an area higher than the pass band is ensured and in which the attenuation changes abruptly can be provided.

Also, in the surface acoustic wave device according to preferred embodiments of the present invention with the arrangement described above, it is preferable that the ratio of input impedance to output impedance be approximately 1:2 or approximately 1:3 or the ratio of output impedance to input impedance be approximately 1:2 or approximately 1:3.

Also, in the surface acoustic wave device according to various preferred embodiments of the present invention having the arrangement described above, it is preferable that a balanced-unbalanced conversion function be provided.

According to another preferred embodiment of the present invention, a communication apparatus includes any one of the surface acoustic wave devices described above. With the arrangement described above, by including the surface acoustic wave device having excellent characteristics in which impedance matching is achieved, the communication apparatus is capable of improving the transmission characteristics.

As described above, the surface acoustic wave device according to various preferred embodiments of the present invention includes a first longitudinally coupled resonator type surface acoustic wave element and a second longitudinally coupled resonator type surface acoustic wave element cascaded to each other and arranged on a piezoelectric substrate. Each of the first and second longitudinally coupled resonator type surface acoustic wave elements is provided with at least three IDTs arranged along the direction of transmission of a surface acoustic wave. At least one of the IDTs of each of the first and second longitudinally coupled resonator type surface acoustic wave elements has so-called narrow pitch electrode fingers located near the adjacent IDT, the electrode finger period of the narrow pitch electrode fingers being different from that of the other portions. The number or the pitch of the narrow pitch electrode fingers of the first longitudinally coupled resonator type surface acoustic wave element is different from the number or the pitch of the narrow pitch electrode fingers of the second longitudinally coupled resonator type surface acoustic wave element. Thus, a surface acoustic wave device capable of setting the impedance ratio of input terminal to output terminal to a desired value can be provided.

Other features, elements, characteristics and advantages of the present invention will become more apparent from the following detailed description of preferred embodiments thereof with reference to the attached drawings.

BRIEF DESCRIPTION OF THE DRAWINGS

FIG. 3 is a Smith chart showing the impedance characteristics of the surface acoustic wave device according to Working Example 1 of the first preferred embodiment of the present invention;

FIG. 6 is a Smith chart showing the impedance characteristics of the surface acoustic wave device according to Comparative Example 1 of the first preferred embodiment of the present invention;

FIG. 9 is a Smith chart showing the impedance characteristics of the surface acoustic wave device according to Comparative Example 2 of the first preferred embodiment of the present invention;

FIG. 12 is a Smith chart showing the impedance characteristics of the surface acoustic wave device according to Working Example 2 of the first preferred embodiment of the present invention;

FIG. 15 is a Smith chart showing the impedance characteristics of the surface acoustic wave device according to Working Example 3 of the first preferred embodiment of the present invention;

FIG. 18 is a Smith chart showing the impedance characteristics of the surface acoustic wave device according to Working Example 4 of the first preferred embodiment of the present invention;

FIG. 21 is a Smith chart showing the impedance characteristics of the surface acoustic wave device according to Working Example 5 of the first preferred embodiment of the present invention;

FIG. 28 is a Smith chart showing the impedance characteristics of the surface acoustic wave device according to Working Example 6 of the second preferred embodiment of the present invention;

FIG. 31 is a Smith chart showing the impedance characteristics of the surface acoustic wave device when the surface acoustic wave resonators are eliminated from the surface acoustic wave device according to Working Example 6 of the second preferred embodiment of the present invention;

FIG. 38 is a Smith chart showing the impedance characteristics of the surface acoustic wave device according to Conventional Example 1;

FIG. 41 is a Smith chart showing the impedance characteristics of the surface acoustic wave device arranged by the combination of Conventional Example 1 and Conventional Example 2.

DETAILED DESCRIPTION OF PREFERRED EMBODIMENTS

First Preferred Embodiment

A first preferred embodiment of the present invention will be described with reference to FIGS. 1 to 25.

In the first preferred embodiment, a personal communication system (PCS) receiving filter (surface acoustic wave device) having a balanced-unbalanced conversion function and including two longitudinally coupled resonator type surface acoustic wave filter elements is explained as an example.

Figure 1:
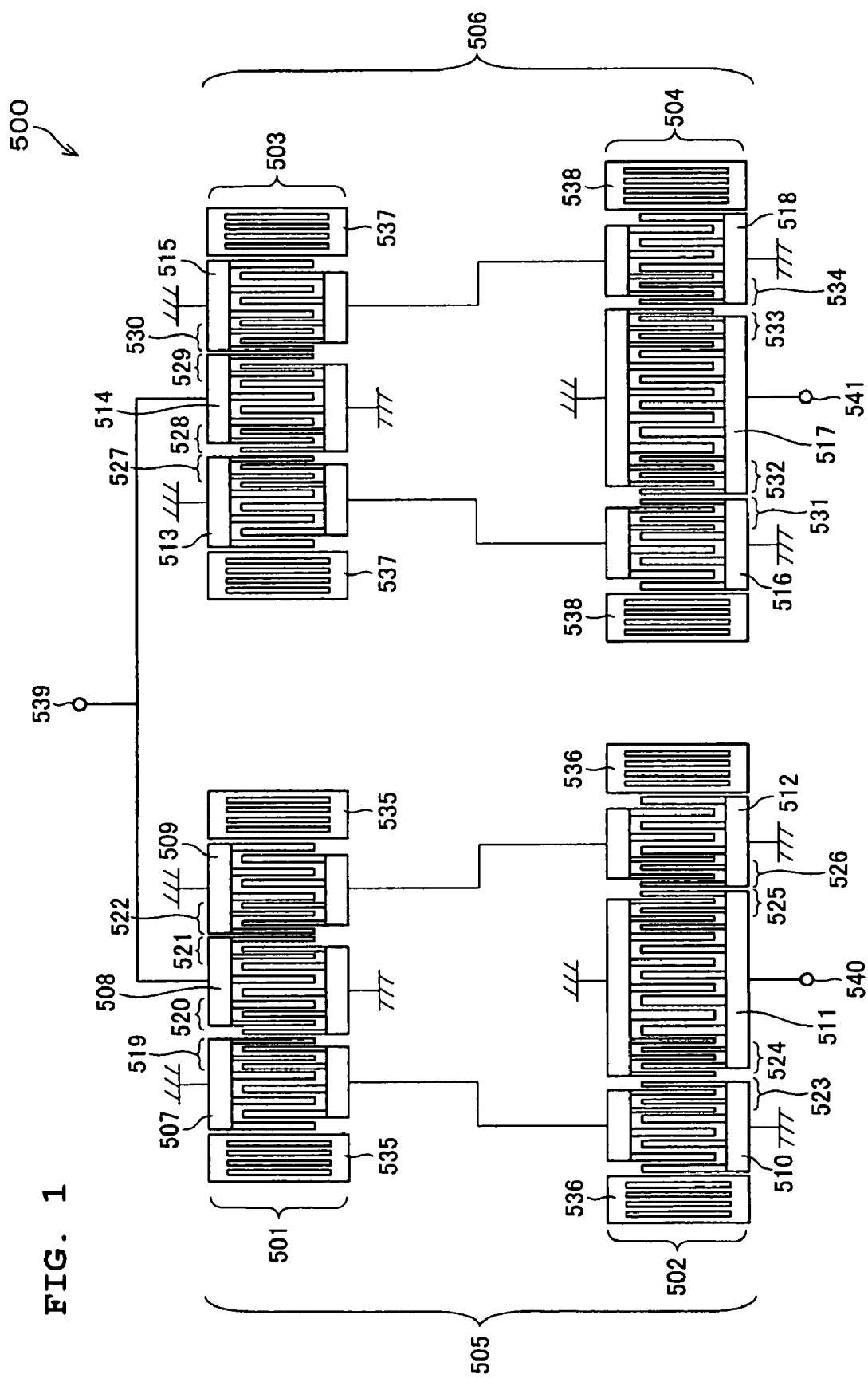
FIG. 1 is a circuit diagram showing a surface acoustic wave device according to a first preferred embodiment of the present invention.

Referring to FIG. 1, a surface acoustic wave device 500 according to the first preferred embodiment includes a longitudinally coupled resonator type surface acoustic wave filter element (first surface acoustic wave filter element) 505 and a longitudinally coupled resonator type surface acoustic wave filter element (second surface acoustic wave filter element) 506 arranged on a piezoelectric substrate (not shown). The longitudinally coupled resonator type surface acoustic wave filter elements 505 and 506 are preferably formed by Al electrodes. In the first preferred embodiment, a 40±5° Y-cut X-propagation LiTaO$_3$ substrate is preferably used as the piezoelectric substrate.

The longitudinally coupled resonator type surface acoustic wave filter element 505 includes a longitudinally coupled resonator type surface acoustic wave element (first stage longitudinally coupled resonator type surface acoustic wave element) 501 and a longitudinally coupled resonator type surface acoustic wave element (second stage longitudinally coupled resonator type surface acoustic wave element) 502.

The longitudinally coupled resonator type surface acoustic wave element 501 includes an interdigital transducer (hereinafter referred to as IDT) 508 provided with a plurality of electrode fingers, IDTs 507 and 509 arranged so as to sandwich the IDT 508, and reflectors 535 provided on the left and right sides of the IDTs 507 to 509. Also, as shown in FIG. 1, some electrode fingers between the adjacent IDTs 507 and 508 and between the adjacent IDTs 508 and 509, in other words, narrow pitch electrode finger portions 519, 520, 521, and 522 have a pitch (electrode finger period) smaller than that of the other portions of each of the IDTs 507 to 509.

Similarly, the longitudinally coupled resonator type surface acoustic wave element 502 includes an IDT 511, IDTs 510 and 512 arranged so as to sandwich the IDT 511, and reflectors 536 provided on the left and right sides of the IDTs 510 to 512. Also, as shown in FIG. 1, some electrode fingers between the adjacent IDTs 510 and 511 and between the adjacent IDTs 511 and 512, in other words, narrow pitch electrode finger portions 523, 524, 525, and 526 have a pitch smaller than that of the other portion of each of the IDTs 510 to 512. The phase relationship of input and output signals of the longitudinally coupled resonator type surface acoustic wave element 502 is approximately the same as that of the longitudinally coupled resonator type surface acoustic wave element 501.

Also, in the longitudinally coupled resonator type surface acoustic wave filter element 505, the IDT 507 is cascaded to the IDT 510 and the IDT 509 is cascaded to the IDT 512. In other words, the longitudinally coupled resonator type surface acoustic wave filter element 505 is a two-stage connection surface acoustic wave filter.

The longitudinally coupled resonator type surface acoustic wave filter element 506 includes a longitudinally coupled resonator type surface acoustic wave element (first stage longitudinally coupled resonator type surface acoustic wave element) 503 and a longitudinally coupled resonator type surface acoustic wave element (second stage longitudinally coupled resonator type surface acoustic wave element) 504.

The longitudinally coupled resonator type surface acoustic wave element 503 includes an IDT 514, IDTs 513 and 515 arranged so as to sandwich the IDT 514, and reflectors 537 provided on the left and right sides of the IDTs 513 to 515. Also, as shown in FIG. 1, some electrode fingers between the adjacent IDTs 513 and 514 and between the adjacent IDTs 514 and 515, in other words, narrow pitch electrode finger portions 527, 528, 529, and 530 have a pitch smaller than that of the other portion of each of the IDTs 513 to 515. The phase relationship of input and output signals of the longitudinally coupled resonator type surface acoustic wave element 503 is approximately the same as that of the longitudinally coupled resonator type surface acoustic wave element 501.

The longitudinally coupled resonator type surface acoustic wave element 504 includes an IDT 517, IDTs 516 and 518 arranged so as to sandwich the IDT 517, and reflectors 538 provided on the left and right sides of the IDTs 516 to 518. Also, as shown in FIG. 1, some electrode fingers between the adjacent IDTs 516 and 517 and between the adjacent IDTs 517 and 518, in other words, narrow pitch electrode finger portions 531, 532, 533, and 534 have a pitch smaller than that of the other portion of each of the IDTs 516 to 518. The IDTs 516 to 518 are arranged such that the phase relationship of input and output signals of the longitudinally coupled resonator type surface acoustic wave element 504 is set to be approximately 180 degrees different from the longitudinally coupled resonator type surface acoustic wave element 501.

Also, in the longitudinally coupled resonator type surface acoustic wave filter element 506, the IDT 513 is cascaded to the IDT 516 and the IDT 515 is cascaded to the IDT 518. In other words, the longitudinally coupled resonator type surface acoustic wave filter element 506 is a two-stage connection surface acoustic wave filter.

The IDT 508 of the longitudinally coupled resonator type surface acoustic wave filter element 505 and the IDT 514 of the longitudinally coupled resonator type surface acoustic wave filter element 506 are connected in parallel to an unbalanced signal terminal (input terminal) 539. Also, the IDT 511 of the longitudinally coupled resonator type surface acoustic wave filter element 505 and the IDT 517 of the longitudinally coupled resonator type surface acoustic wave filter element 506 are connected to balanced signal terminals (output terminals) 540 and 541, respectively.

In FIG. 1, for the sake of a simple explanation, the number of the electrode fingers is smaller than in actuality.

An example of a detailed design of the first stage longitudinally coupled resonator type surface acoustic wave elements 501 and 503 and the second stage longitudinally coupled resonator type surface acoustic wave elements 502 and 504 in the surface acoustic wave device 500 according to Working Example 1 of the first preferred embodiment will now be described.

The detailed design of the first stage longitudinally coupled resonator type surface acoustic wave elements 501 and 503 is as described below.

Cross width: about 74 µm

Number of electrode fingers of IDTs (507 and 513/508 and 514/509 and 515): 23/28/23

Number of electrode fingers of narrow pitch electrode finger portions (519 and 527/520 and 528/521 and 529/522 and 530): 4/3/3/4

Pitch P1 of narrow pitch electrode finger portions (519 and 527/520 and 528/521 and 529/522 and 530): about 0.9360 µm The detailed design of the second stage longitudinally coupled resonator type surface acoustic wave elements 502 and 504 is as described below.

Cross width: about 74 µm

Number of electrode fingers of IDTs (510 and 516/511 and 517/512 and 518): 23/30/23

Number of electrode fingers of narrow pitch electrode finger portions (523 and 531/524 and 532/525 and 533/526 and 534): 4/6/6/4

Pitch P2 of narrow pitch electrode finger portions (523 and 531/524 and 532/525 and 533/526 and 534): about 0.9535 µm The intervals between the IDTs are set to be periodically continuous. Also, in the surface acoustic wave device according to Working Example 1, in accordance with the design parameters described above, the input impedance is preferably set to about 50 Ω and the output impedance is preferably set to about 100 Ω. In other words, the input to output impedance ratio is set to 1:2. Also, in the surface acoustic wave device according to Working Example 1, the number NA of the electrode fingers of the central IDTs 508 and 514 of the longitudinally coupled resonator type surface acoustic wave elements 501 and 503, respectively, is different from the number NB of the electrode fingers of the central IDTs 511 and 517 of the longitudinally coupled resonator type surface acoustic wave elements 502 and 504, respectively, (in Working Example 1, the number NA is set to be smaller than the number NB), and both the numbers NA and NB are preferably set to even numbers.

Figure 2:
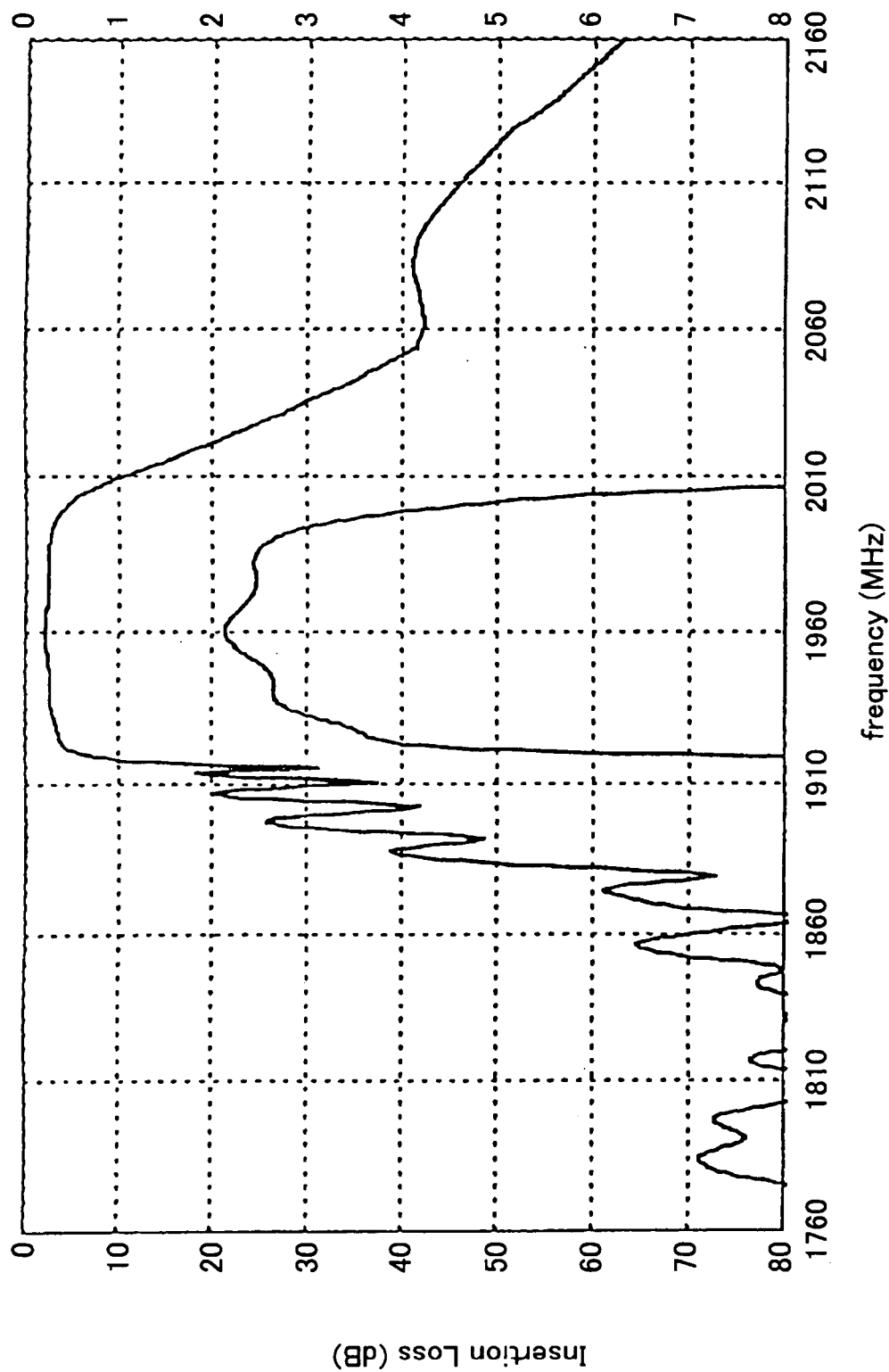
FIG. 2 is a graph showing the transmission characteristics (input to output impedance ratio of 1:2) near the pass band of a surface acoustic wave device according to Working Example 1 of the first preferred embodiment of the present invention.
Figure 4:
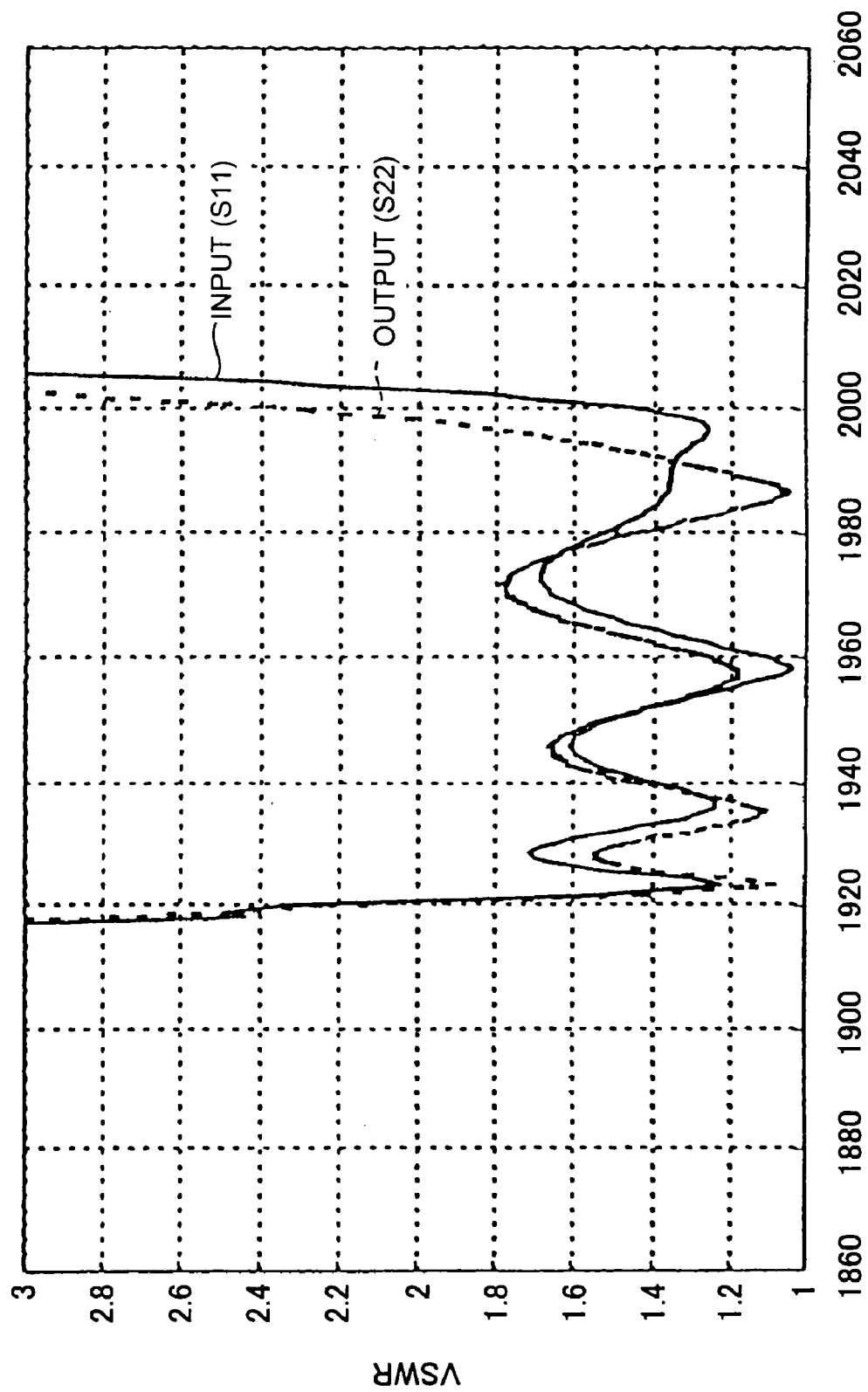
FIG. 4 is a graph showing the VSWR of the surface acoustic wave device according to Working Example 1 of the first preferred embodiment of the present invention.

The transmission characteristics, the impedance characteristics, and the VSWR near the pass band of the surface acoustic wave device 500 according to Working Example 1 are shown in FIGS. 2, 3, and 4, respectively. In FIGS. 3 and 4, reference numeral S11 represents an input side and reference numeral S22 represents an output side.

In surface acoustic wave devices, it is preferable that the impedance in a pass band be as close to the terminal impedance as possible. When the terminal impedance is represented by $Z_L$ and the characteristic impedance of a surface acoustic wave device is represented by $Z_0$, a reflection coefficient $\Gamma$ is represented by the equation $\Gamma=(Z_L+Z_0)/(Z_L-Z_0)$ and the VSWR is represented by $(1+|\Gamma|)/(1-|\Gamma|)$. Thus, the VSWR can be used as an indicator of a shift from the terminal impedance of the surface acoustic wave device. In terms of the needs of the market, the VSWR is preferably at least about 2 or less.

By way of comparison with the surface acoustic wave device 500 according to Working Example 1 of the first preferred embodiment, a surface acoustic wave device according to Comparative Example 1 in which the design parameters are different from those in Working Example 1 will now be described. The design parameters of the surface acoustic wave device according to Comparative Example 1 are as described below. Since the arrangement of the surface acoustic wave device itself is almost the same as in Working Example 1, the same reference numerals used for the surface acoustic wave device 500 are used here.

The detailed design of the first stage longitudinally coupled resonator type surface acoustic wave elements 501 and 503 of the surface acoustic wave device according to Comparative Example 1 is as described below.

Cross width: 74 μm

Number of electrode fingers of IDTs (507 and 513/508 and 514/509 and 515): 23/28/23

Number of electrode fingers of narrow pitch electrode finger portions (519 and 527/520 and 528/521 and 529/522 and 530): 4/4/4/4

Pitch P1 of narrow pitch electrode finger portions (519 and 527/520 and 528/521 and 529/522 and 530): 0.9432 μm The detailed design of the second stage longitudinally coupled resonator type surface acoustic wave elements 502 and 504 of the surface acoustic wave device according Comparative Example 1 is as described below.

Cross width: 74 μm

Number of electrode fingers of IDTs (510 and 516/511 and 517/512 and 518): 23/28/23

Number of electrode fingers of narrow pitch electrode finger portions (523 and 531/524 and 532/525 and 533/526 and 534): 4/4/4/4

Pitch P2 of narrow pitch electrode finger portions (523 and 531/524 and 532/525 and 533/526 and 534): 0.9432 μm In the surface acoustic wave device according to Comparative Example 1, the input impedance and the output impedance are set to 50 Ω and 100 Ω, respectively, in other words, the input to output impedance ratio is set to 1:2, due to matching achieved by connecting an inductance element in parallel to the balanced output terminals. In other words, the surface acoustic wave device according to Comparative Example 1 is arranged as in the surface acoustic wave device according to Working Example 1 with the exception that the first stage longitudinally coupled resonator type surface acoustic wave elements and the second stage longitudinally coupled resonator type surface acoustic wave elements are arranged with the same design parameters and the inductance element is added.

Figure 5:
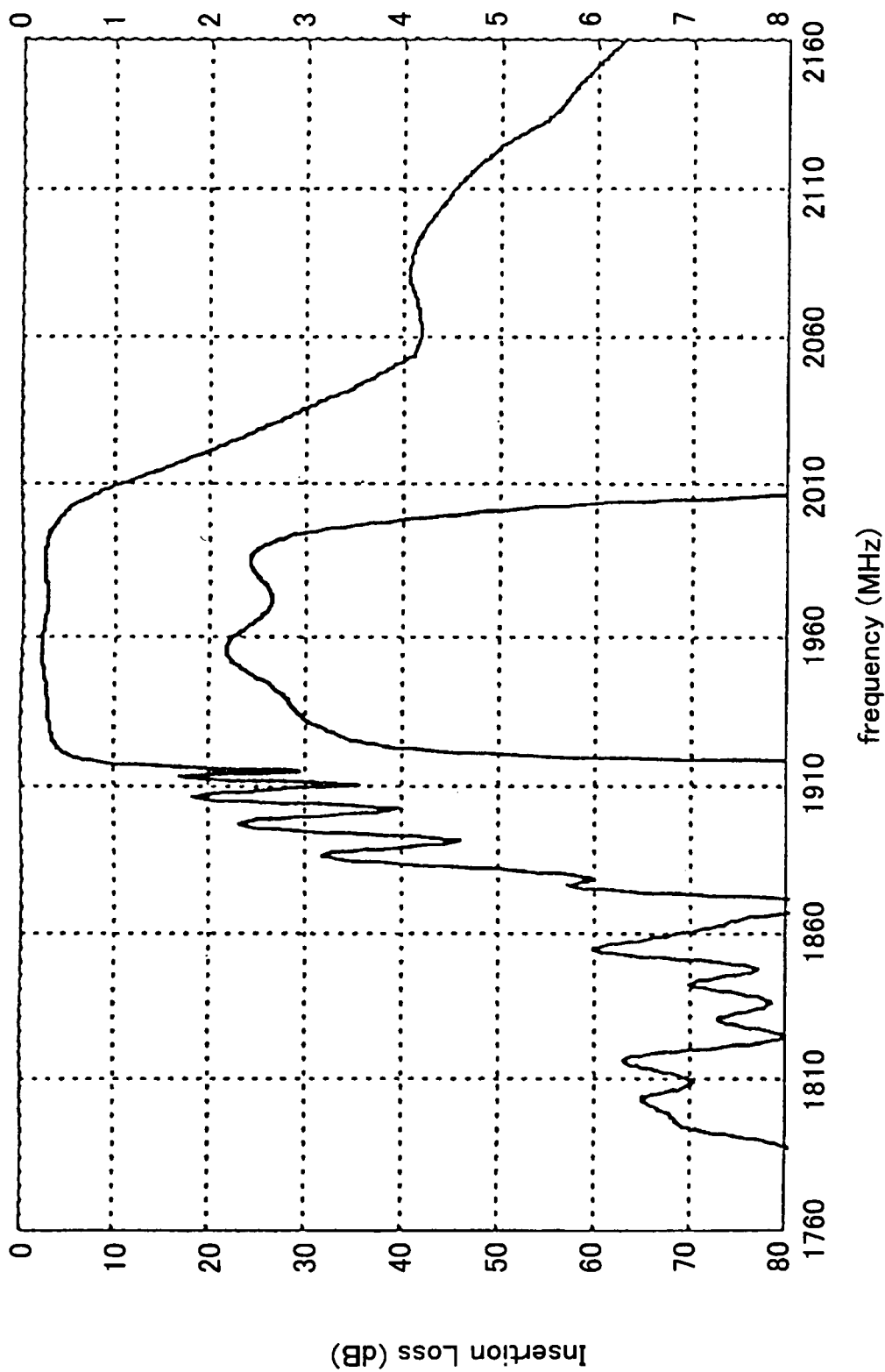
FIG. 5 is a graph showing the transmission characteristics (input to output impedance ratio of 1:2) near the pass band of a surface acoustic wave device according to Comparative Example 1 of the first preferred embodiment of the present invention.
Figure 7:
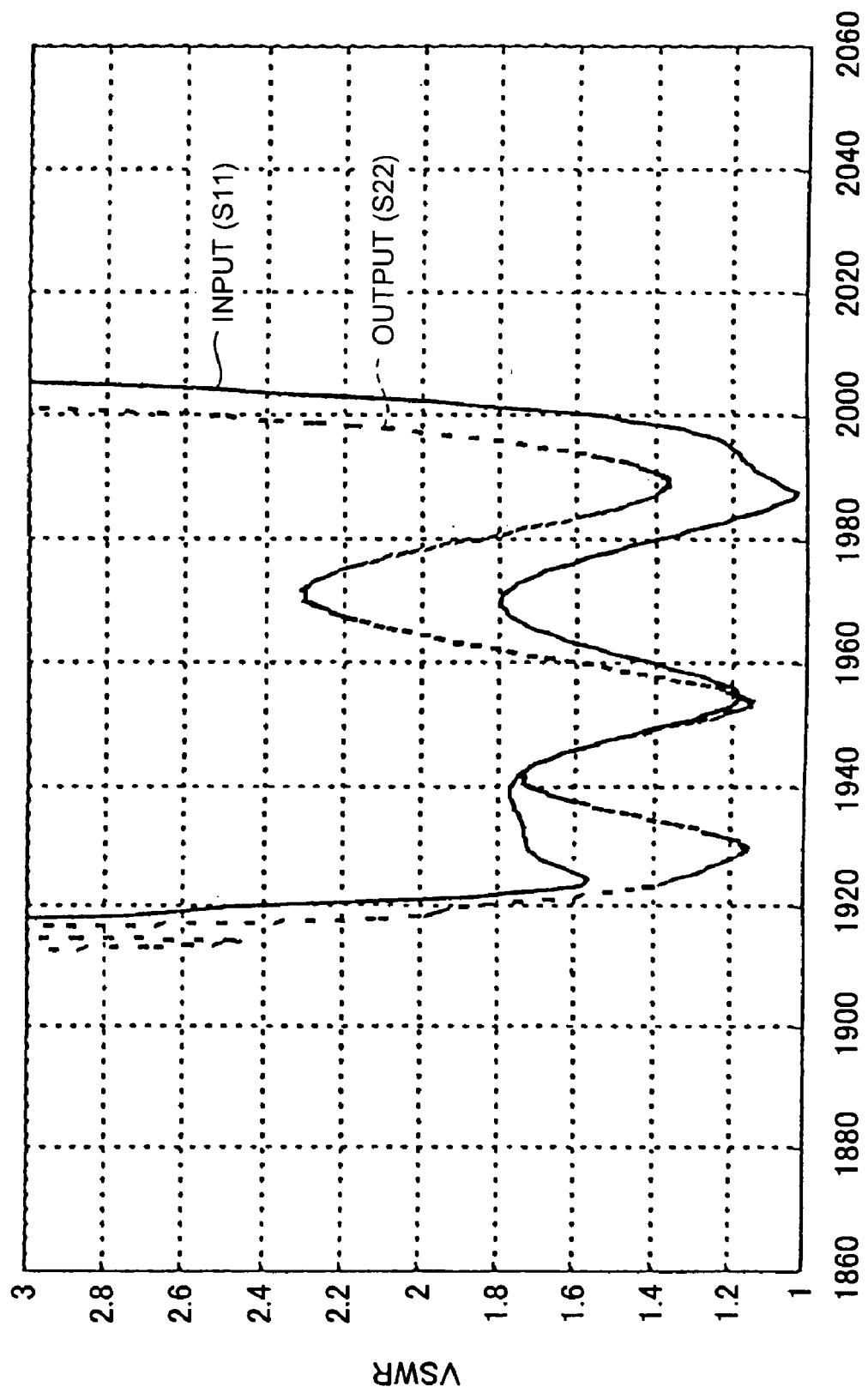
FIG. 7 is a graph showing the VSWR of the surface acoustic wave device according to Comparative Example 1 of the first preferred embodiment of the present invention.

The transmission characteristics, the impedance characteristics, and the VSWR near the pass band of the surface acoustic wave device according to Comparative Example 1 are shown in FIGS. 5, 6, and 7, respectively. In FIGS. 6 and 7, reference numeral S11 represents an input side and reference numeral S22 represents an output side.

When compared with FIG. 4 and FIG. 7, the surface acoustic wave device according to Comparative Example 1 exhibits a maximum VSWR of about 2.3 in the pass band, and the surface acoustic wave device according to Working Example 1 exhibits an improved VSWR of about 1.8 in the pass band. This is due to the effects of arranging the surface acoustic wave device 500 according to Working Example 1 such that, for the narrow pitch electrode finger portions 520 and 521 of the IDT 508 of the longitudinally coupled resonator type surface acoustic wave element 501 and the narrow pitch electrode finger portions 528 and 529 of the IDT 514 of the longitudinally coupled resonator type surface acoustic wave element 503, the IDTs 514 and 508 being connected to the unbalanced signal terminal 539, the number N1 of the electrode fingers is set to 3 and the pitch P1 of the electrode fingers is set to about 0.9360 μm, and for the narrow pitch electrode finger portions 524 and 525 of the IDT 511 of the longitudinally coupled resonator type surface acoustic wave element 502, the IDT 511 being connected to the balanced signal terminal 540, and for the narrow pitch electrode finger portions 532 and 533 of the IDT 517 of the longitudinally coupled resonator type surface acoustic wave element 504, the IDT 517 being connected to the balanced signal terminal 541, the number N2 of the electrode fingers is set to 6 and the pitch P2 of the electrode fingers is set to about 0.9535 μm. In other words, by setting the number N1 to be smaller than the number N2 and setting the pitch P1 to be smaller than the pitch P2, a surface acoustic wave device exhibiting an excellent VSWR can be provided.

By way of comparison with the surface acoustic wave device 500 according to Working Example 1 of the first preferred embodiment, a surface acoustic wave device according to Comparative Example 2 in which the design parameters are different from those in Working Example 1 will now be described. The design parameters of the surface acoustic wave device according to Comparative Example 2 are as described below. Since the arrangement of the surface acoustic wave device itself is almost the same as in Working Example 1, the same reference numerals used for the surface acoustic wave device 500 are used here.

The detailed design of the first stage longitudinally coupled resonator type surface acoustic wave elements 501 and 503 of the surface acoustic wave device according to Comparative Example 2 is as described below.

Cross width: 82 μm

Number of electrode fingers of IDTs (507 and 513/508 and 514/509 and 515): 23/28/23

Number of electrode fingers of narrow pitch electrode finger portions (519 and 527/520 and 528/521 and 529/522 and 530): 4/4/4/4

Pitch P1 of narrow pitch electrode finger portions (519 and 527/520 and 528/521 and 529/522 and 530): 0.9432 μm The detailed design of the second stage longitudinally coupled resonator type surface acoustic wave elements 502 and 504 of the surface acoustic wave device according Comparative Example 2 is as described below.

Cross width: 103 μm

Number of electrode fingers of IDTs (510 and 516/511 and 517/512 and 518): 23/28/23

Number of electrode fingers of narrow pitch electrode finger portions (523 and 531/524 and 532/525 and 533/526 and 534): 4/4/4/4

Pitch P2 of narrow pitch electrode finger portions (523 and 531/524 and 532/525 and 533/526 and 534): 0.9432 μm In the surface acoustic wave device according to Comparative Example 2, the first stage longitudinally coupled resonator type surface acoustic wave elements 501 and 503 are different from the second stage longitudinally coupled resonator type surface acoustic wave elements 502 and 504 only in the cross width, and the number of the electrode fingers of the IDTs, the number of the electrode fingers of the narrow pitch electrode finger portions, and the pitch of the narrow pitch electrode finger portions of the first stage longitudinally coupled resonator type surface acoustic wave elements 501 and 503 are arranged with the same design parameters as those of the second stage longitudinally coupled resonator type surface acoustic wave elements 502 and 504. In the surface acoustic wave device according to Comparative Example 2, in accordance with the design parameters described above, the input impedance is set to 50 Ω and the output impedance is set to 100 Ω. In other words, the input to output impedance ratio is set to 1:2.

Figure 8:
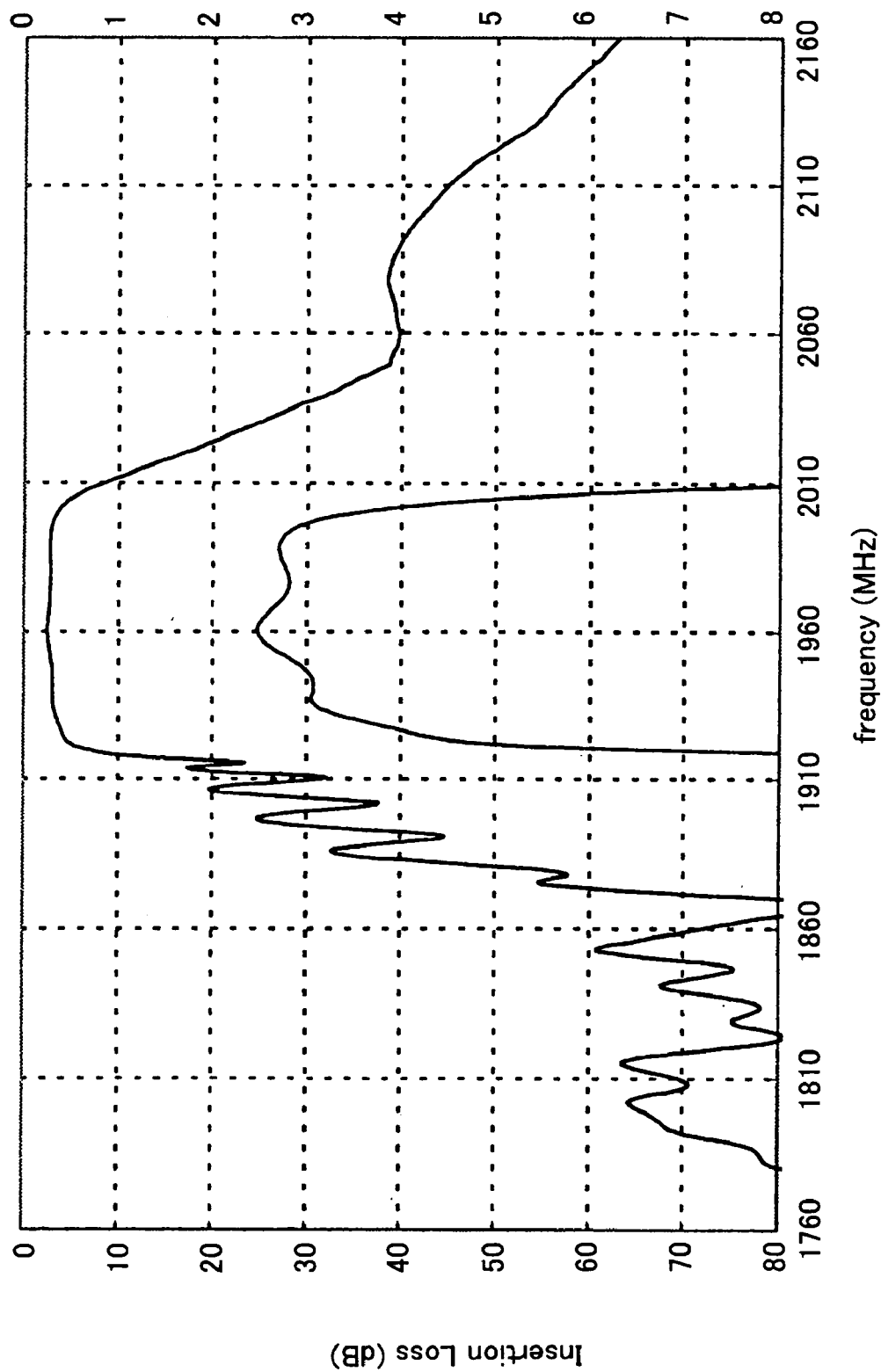
FIG. 8 is a graph showing the transmission characteristics (input to output impedance ratio of 1:2) near the pass band of a surface acoustic wave device according to Comparative Example 2 of the first preferred embodiment of the present invention.
Figure 10:
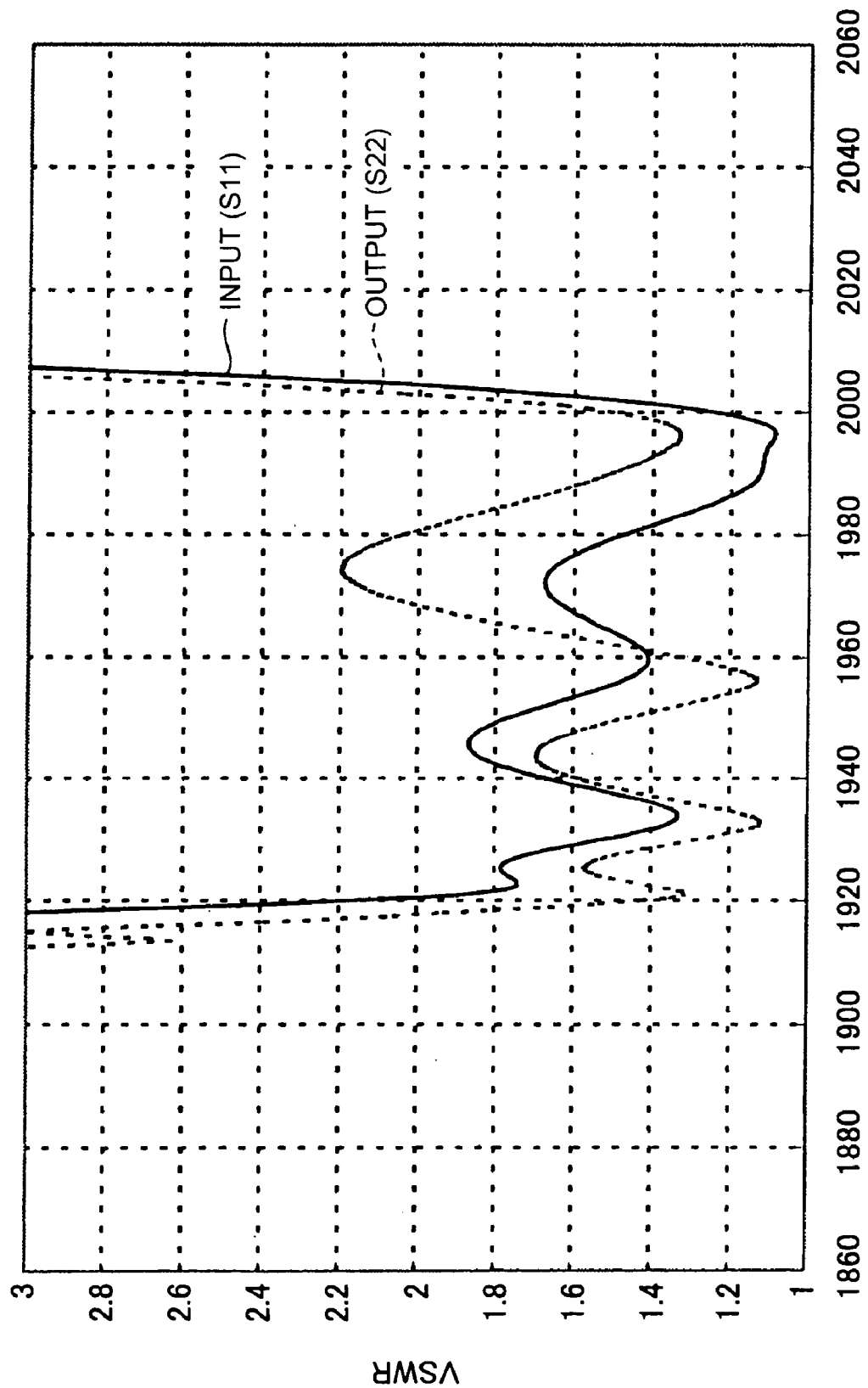
FIG. 10 is a graph showing the VSWR of the surface acoustic wave device according to Comparative Example 2 of the first preferred embodiment of the present invention.

The transmission characteristics, the impedance characteristics, and the VSWR near the pass band of the surface acoustic wave device according to Comparative Example 2 are shown in FIGS. 8, 9, and 10, respectively. In FIGS. 9 and 10, reference numeral S11 represents an input side and reference numeral S22 represents an output side. In particular, as shown in FIG. 10, in the surface acoustic wave device according to Comparative Example 2, the VSWR is deteriorated.

A surface acoustic wave device according to Working Example 2 of the first preferred embodiment in which the number N1 is set to be smaller than the number N2 and the pitch P1 is set to be equal to the pitch P2 with the same arrangement of the surface acoustic wave device 500 according to Working Example 1 will now be described. With respect to the design parameters for the surface acoustic wave device 500 according to Working Example 1, the surface acoustic wave device according to Working Example 2 is arranged such that the pitch of the narrow pitch electrode finger portions 519 to 522 of the first stage longitudinally coupled resonator type surface acoustic wave element 501, the narrow pitch electrode finger portions 527 to 530 of the first stage longitudinally coupled resonator type surface acoustic wave element 503, the narrow pitch electrode finger portions 523 to 526 of the second stage longitudinally coupled resonator type surface acoustic wave element 502, and the narrow pitch electrode finger portions 531 to 534 of the second stage longitudinally coupled resonator type surface acoustic wave element 504 is set to about 0.9454 μm.

Figure 11:
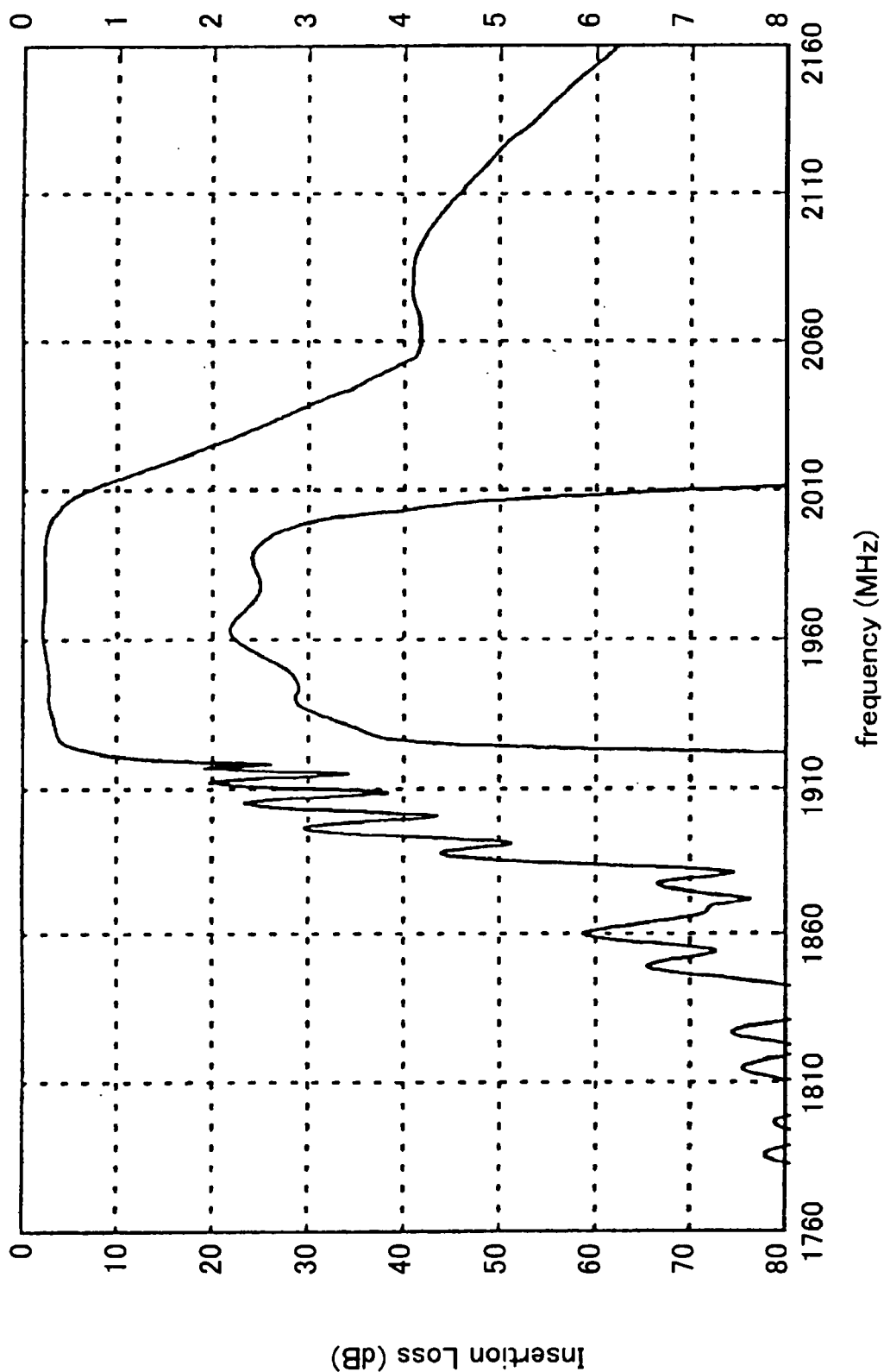
FIG. 11 is a graph showing the transmission characteristics (input to output impedance ratio of 1:2) near the pass band of a surface acoustic wave device according to Working Example 2 of the first preferred embodiment of the present invention.
Figure 13:
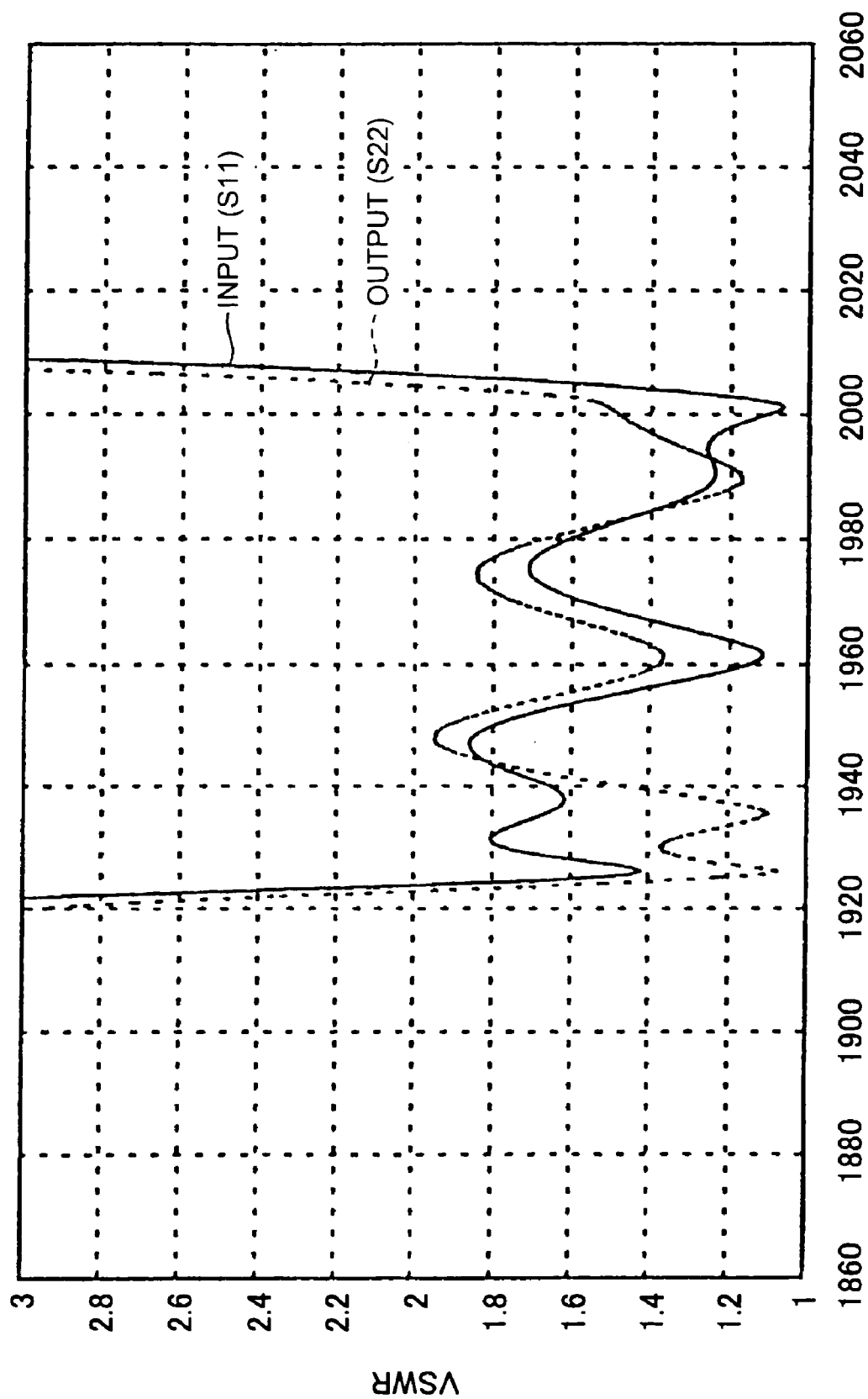
FIG. 13 is a graph showing the VSWR of the surface acoustic wave device according to Working Example 2 of the first preferred embodiment of the present invention.

The transmission characteristics, the impedance characteristics, and the VSWR near the pass band of the surface acoustic wave device according to Working Example 2 are shown in FIGS. 11, 12, and 13, respectively. In FIGS. 12 and 13, reference numeral S11 represents an input side and reference numeral S22 represents an output side.

As is clear from FIG. 13, the surface acoustic wave device according to Working Example 2 exhibits a VSWR of about 1.9. In other words, in the surface acoustic wave device according to Working Example 2, by setting the number N1 to be smaller than the number N2 and by setting the pitch P1 to be equal to the pitch P2, a VSWR of less than 2 can be achieved. Thus, it can be seen that the impedance matching in the surface acoustic wave device can be realized by way of designing. In other words, by setting the number of the electrode fingers of the narrow pitch electrode finger portions of the first stage longitudinally coupled resonator type surface acoustic wave elements to be different from the number of the electrode fingers of the narrow pitch electrode finger portions of the second stage longitudinally coupled resonator type surface acoustic wave elements, the impedance matching in the surface acoustic wave device can be achieved.

A surface acoustic wave device according to Working Example 3 of the first preferred embodiment in which the number N1 is set to be equal to the number N2 and the pitch P1 is set to be smaller than the pitch P2 with the same arrangement of the surface acoustic wave device according to Working Example 1 will now be described. With respect to the design parameters for the surface acoustic wave device 500 according to Working Example 1, the surface acoustic wave device according to Working Example 3 is arranged such that the number of the electrode fingers of the IDTs 508 and 514 is preferably set to 28, the number of the electrode fingers of the narrow pitch electrode finger portions 520 and 521 of the first stage longitudinally coupled resonator type surface acoustic wave element 501 and the narrow pitch electrode finger portions 528 and 529 of the first stage longitudinally coupled resonator type surface acoustic wave element 503 is preferably set to 4, the pitch of the electrode fingers of the narrow pitch electrode finger portions 520, 521, 528, and 529 is preferably set to about 0.9423 μm, the number of the electrode fingers of the narrow pitch electrode finger portions 524 and 525 of the second stage longitudinally coupled resonator type surface acoustic wave element 502 and the narrow pitch electrode finger portions 532 and 533 of the second stage longitudinally coupled resonator type surface acoustic wave element 504 is preferably set to 4, and the pitch of the electrode fingers of the narrow pitch electrode finger portions 524, 525, 532, and 533 is preferably set to about 0.9564 μm.

Figure 14:
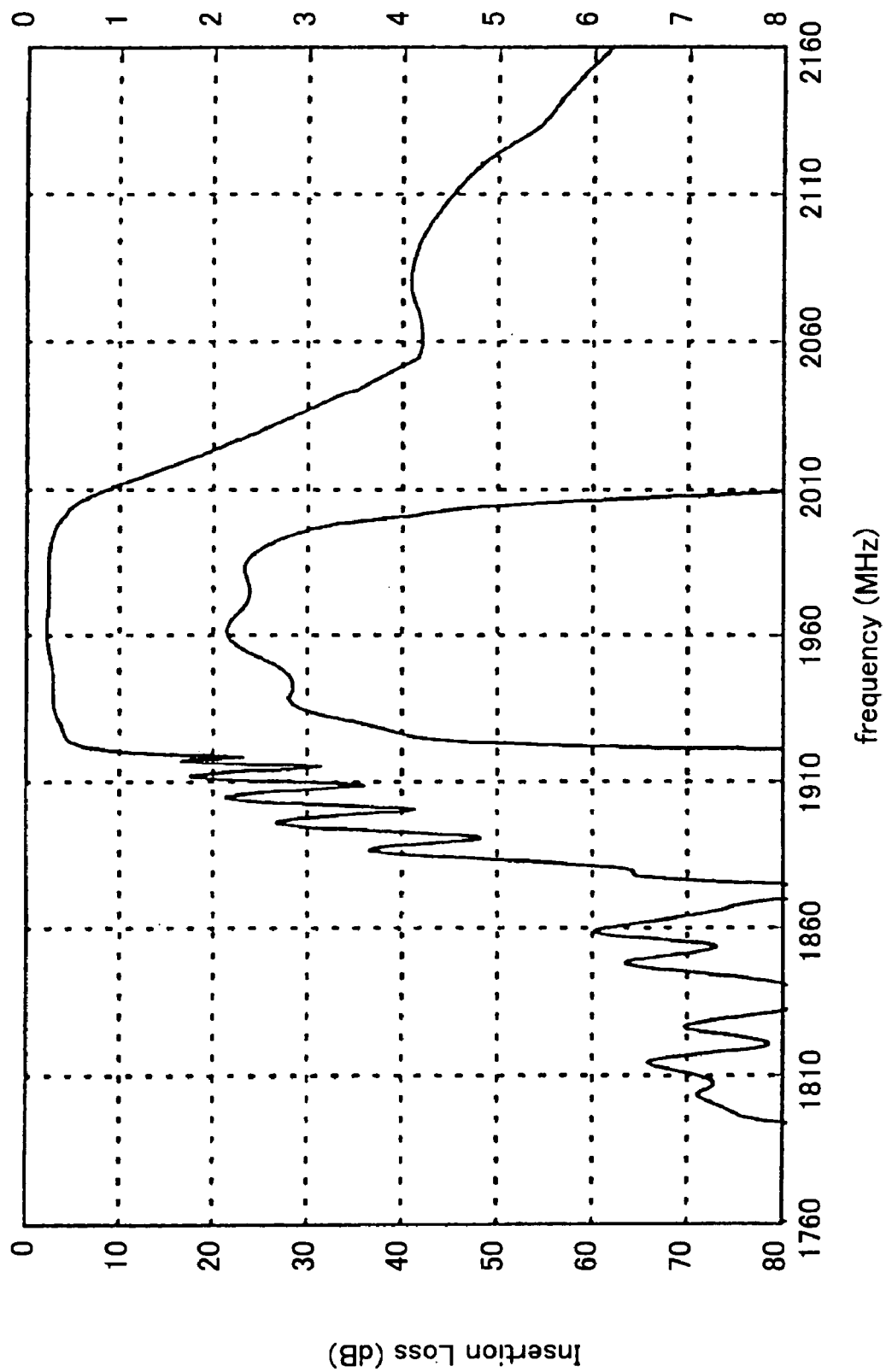
FIG. 14 is a graph showing the transmission characteristics (input to output impedance ratio of 1:2) near the pass band of a surface acoustic wave device according to Working Example 3 of the first preferred embodiment of the present invention.
Figure 16:
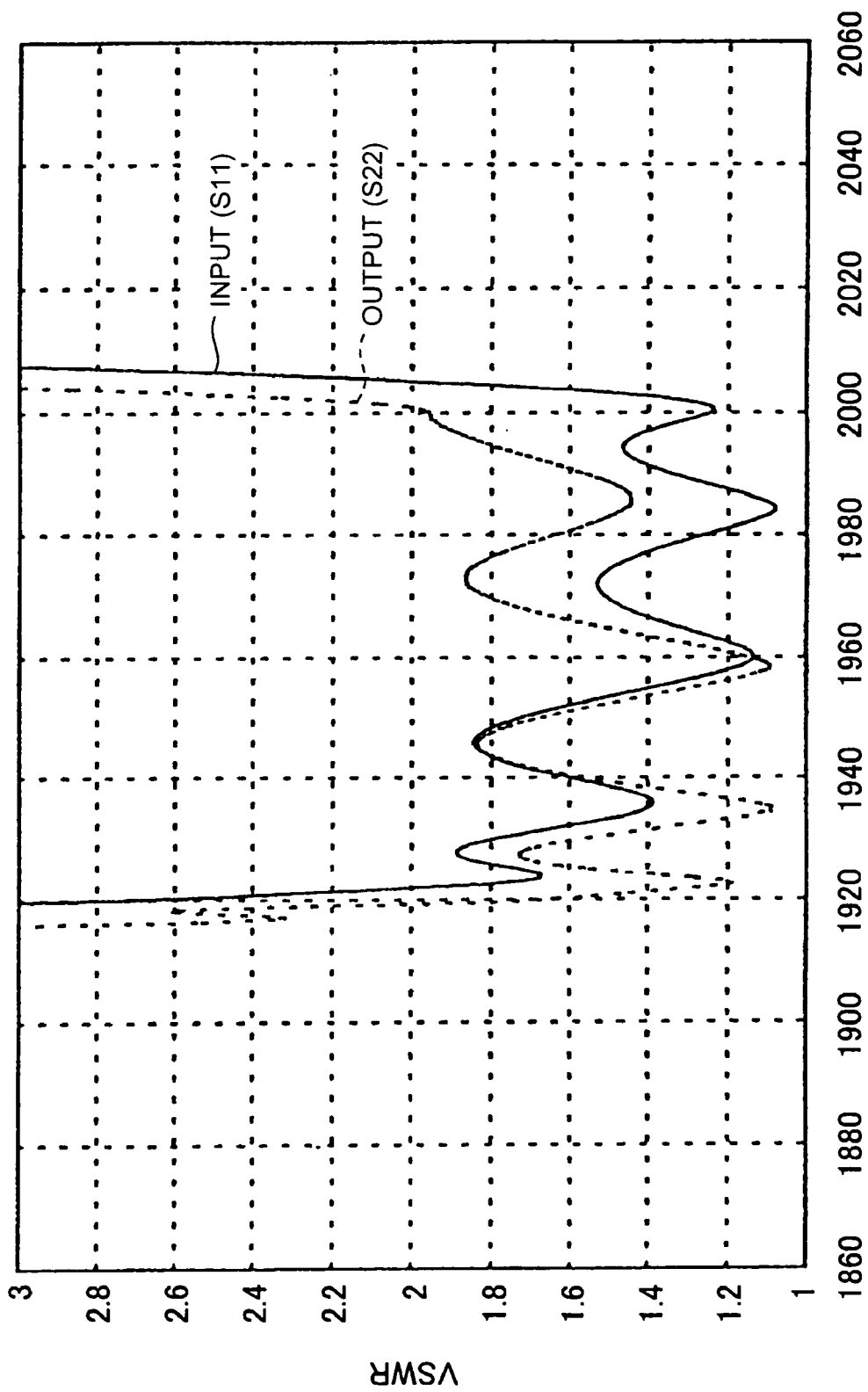
FIG. 16 is a graph showing the VSWR of the surface acoustic wave device according to Working Example 3 of the first preferred embodiment of the present invention.

The transmission characteristics, the impedance characteristics, and the VSWR near the pass band of the surface acoustic wave device according to Working Example 3 are shown in FIGS. 14, 15, and 16, respectively. In FIGS. 15 and 16, reference numeral S11 represents an input side and reference numeral S22 represents an output side.

As is clear from FIG. 16, the surface acoustic wave device according to Working Example 3 exhibits a VSWR of about 1.9. In other words, in the surface acoustic wave device according to Working Example 3, by setting the number N1 to be equal to the number N2 and by setting the pitch P1 to be smaller than the pitch P2, a VSWR of less than about 2 can be achieved. Thus, it can be seen that the impedance matching in the surface acoustic wave device can be realized by way of designing. In other words, by setting the pitch of the electrode fingers of the narrow pitch electrode finger portions of the first stage longitudinally coupled resonator type surface acoustic wave elements to be different from the pitch of the electrode fingers of the narrow pitch electrode finger portions of the second stage longitudinally coupled resonator type surface acoustic wave elements, the impedance matching in the surface acoustic wave device can be achieved.

As is clear from Working Examples 1, 2, and 3, setting the number N1 to be smaller than the number N2 or setting the pitch P1 to be smaller than the pitch P2 is a condition necessary to achieve impedance matching in a surface acoustic wave device, and it is preferable that these two conditions be satisfied at the same time.

A surface acoustic wave device according to Working Example 4 of the first preferred embodiment in which the number NA is set to be equal to the number NB with the same arrangement of the surface acoustic wave device 500 according to Working Example 1 will now be described. With respect to the design parameters for the surface acoustic wave device 500 according to Working Example 1, the surface acoustic wave device according to Working Example 4 is arranged such that the number NA of the electrode fingers of the IDTs 508 and 514 of the first stage longitudinally coupled resonator type surface acoustic wave elements 501 and 503, respectively, and the number NB of the electrode fingers of the IDTs 511 and 517 of the second stage longitudinally coupled resonator type surface acoustic wave elements 502 and 504, respectively, is preferably set to about 28.

Figure 17:
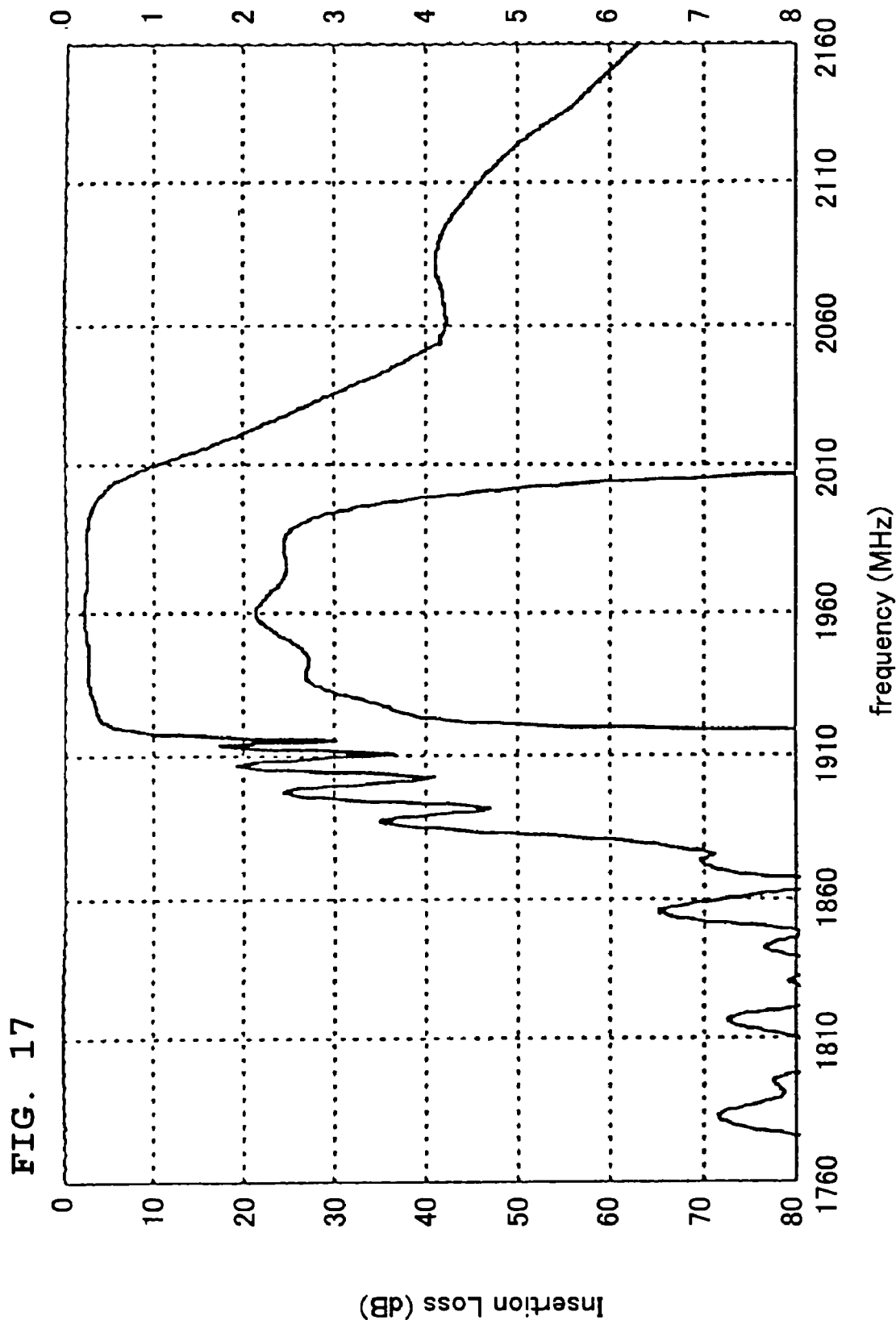
FIG. 17 is a graph showing the transmission characteristics (input to output impedance ratio of 1:2) near the pass band of a surface acoustic wave device according to Working Example 4 of the first preferred embodiment of the present invention.
Figure 19:
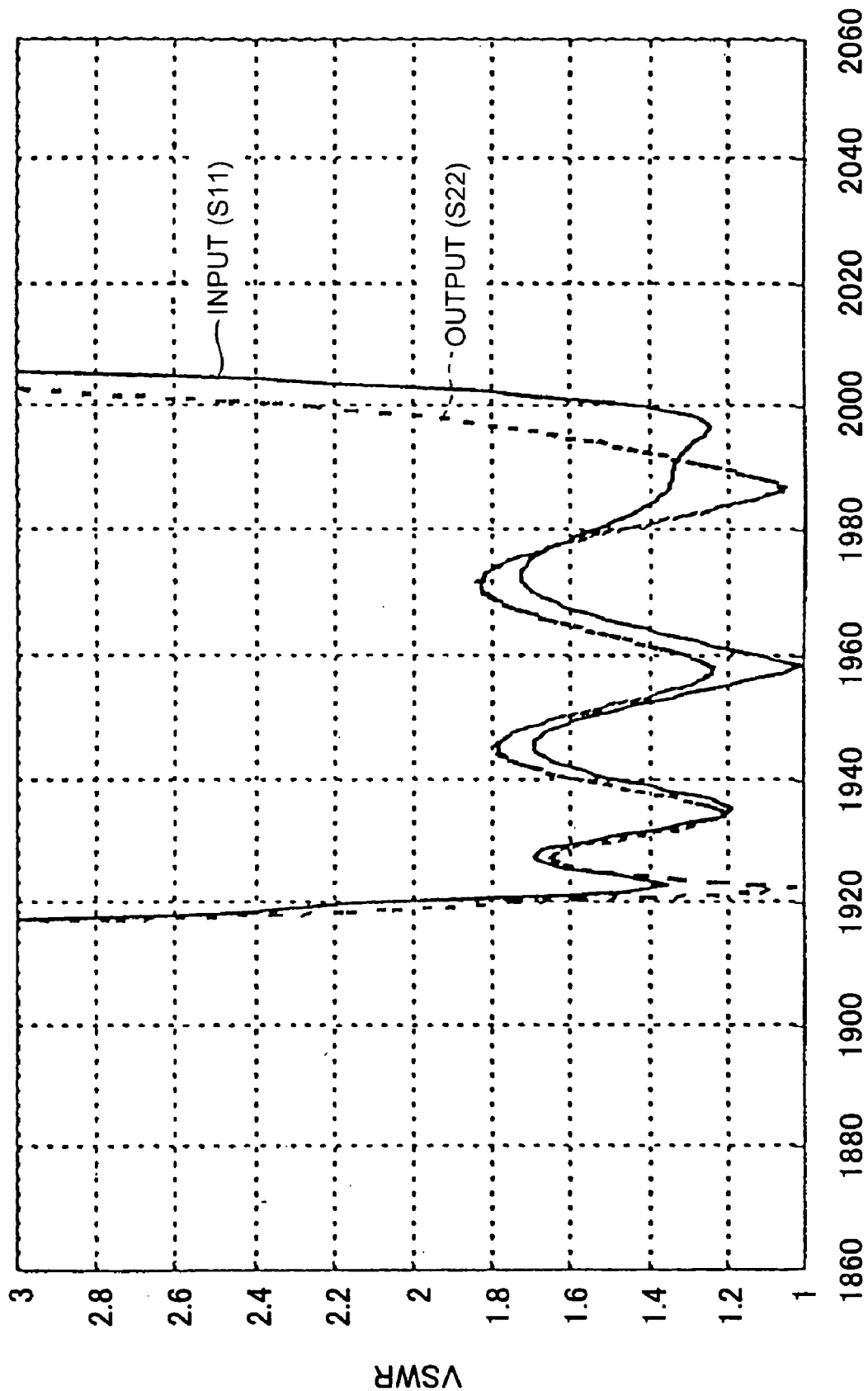
FIG. 19 is a graph showing the VSWR of the surface acoustic wave device according to Working Example 4 of the first preferred embodiment of the present invention.

The transmission characteristics, the impedance characteristics, and the VSWR near the pass band of the surface acoustic wave device according to Working Example 4 are shown in FIGS. 17, 18, and 19, respectively. In FIGS. 18 and 19, reference numeral S11 represents an input side and reference numeral S22 represents an output side.

As is clear from FIG. 19, the surface acoustic wave device according to Working Example 4 exhibits a VSWR of about 1.8. In other words, the surface acoustic wave device according to Working Example 4 achieves a VSWR of less than about 2 even if the number NA is equal to the number NB. Thus, it can be seen that the impedance matching in the surface acoustic wave device can be realized by way of designing.

A surface acoustic wave device according to Working Example 5 of the first preferred embodiment in which the impedance ratio of unbalanced signal terminal to balanced signal terminal is preferably set to approximately 1:3 with the same arrangement of the surface acoustic wave device 500 according to Working Example 1 will now be described. The design parameters of the surface acoustic wave device according to Working Example 5 are as described below. Since the arrangement of the surface acoustic wave device itself is almost the same as in Working Example 1, the same reference numerals used for the surface acoustic wave device 500 are used here.

The detailed design of the first stage longitudinally coupled resonator type surface acoustic wave elements 501 and 503 of the surface acoustic wave device according to Working Example 5 is as described below.

Cross width: about 64 $\mu$m

Number of electrode fingers of IDTs (507 and 513/508 and 514/509 and 515): 23/28/23

Number of electrode fingers of narrow pitch electrode finger portions (519 and 527/520 and 528/521 and 529/522 and 530): 4/3/3/4

Pitch P1 of narrow pitch electrode finger portions (519 and 527/520 and 528/521 and 529/522 and 530): about 0.9410 $\mu$m The detailed design of the second stage longitudinally coupled resonator type surface acoustic wave elements 502 and 504 of the surface acoustic wave device according Working Example 5 is as described below.

Cross width: about 64 $\mu$m

Number of electrode fingers of IDTs (510 and 516/511 and 517/512 and 518): 23/30/23

Number of electrode fingers of narrow pitch electrode finger portions (523 and 531/524 and 532/525 and 533/526 and 534): 4/5/5/4

Pitch P2 of narrow pitch electrode finger portions (523 and 531/524 and 532/525 and 533/526 and 534): about 0.9460 $\mu$m As described above, in the surface acoustic wave device according to Working Example 5, the cross widths of the longitudinally coupled resonator type surface acoustic wave elements 501 to 504, the pitches of the electrode fingers of the narrow pitch electrode finger portions 519 to 522, 527 to 530, 523 to 526, and 531 to 534, and the number of the electrode fingers of the narrow pitch electrode finger portions 524, 525, 532, and 533 are preferably set to be different from the surface acoustic wave device according to Working Example 1.

Figure 20:
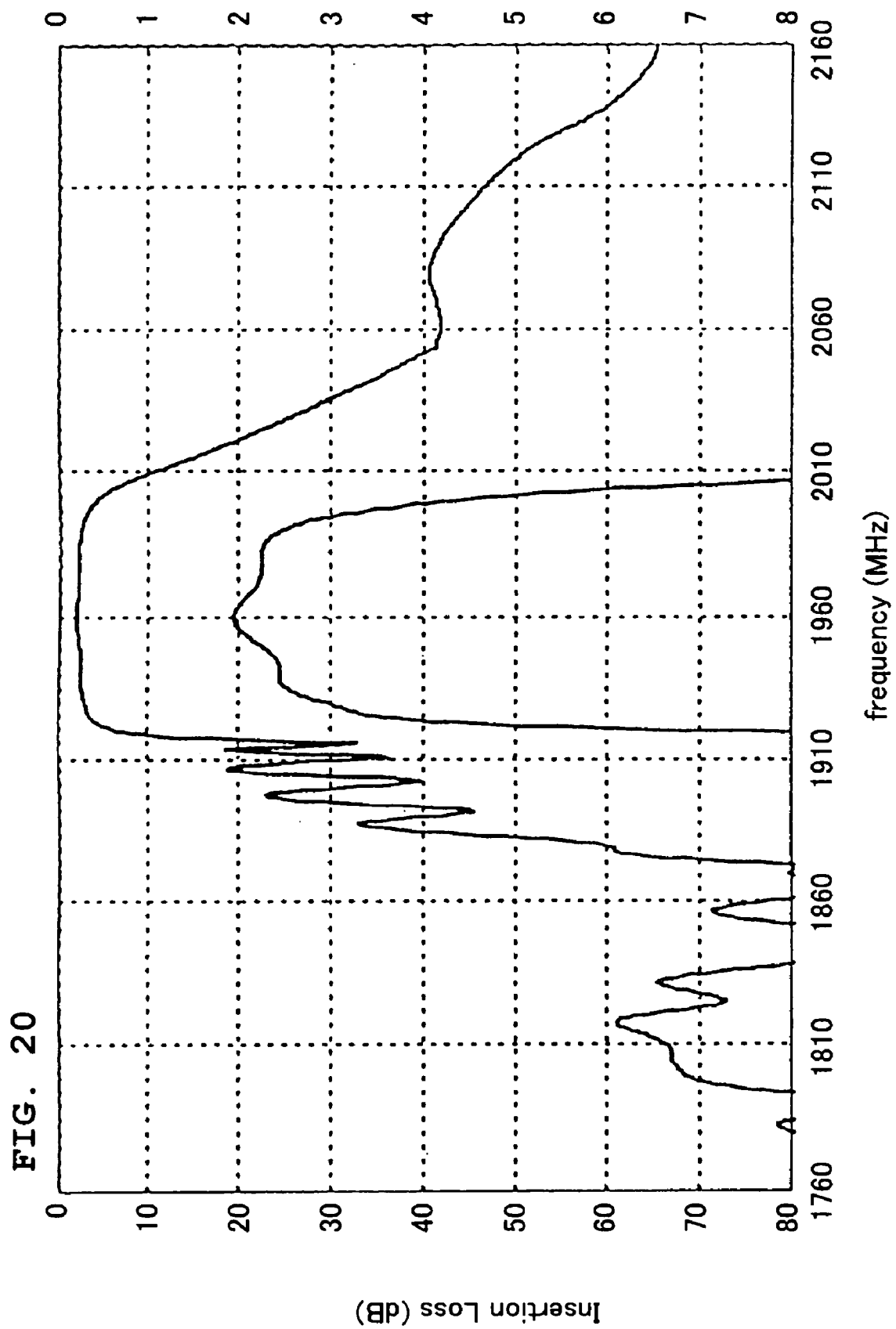
FIG. 20 is a graph showing the transmission characteristics (input to output impedance ratio of 1:3) near the pass band of a surface acoustic wave device according to Working Example 5 of the first preferred embodiment of the present invention.
Figure 22:
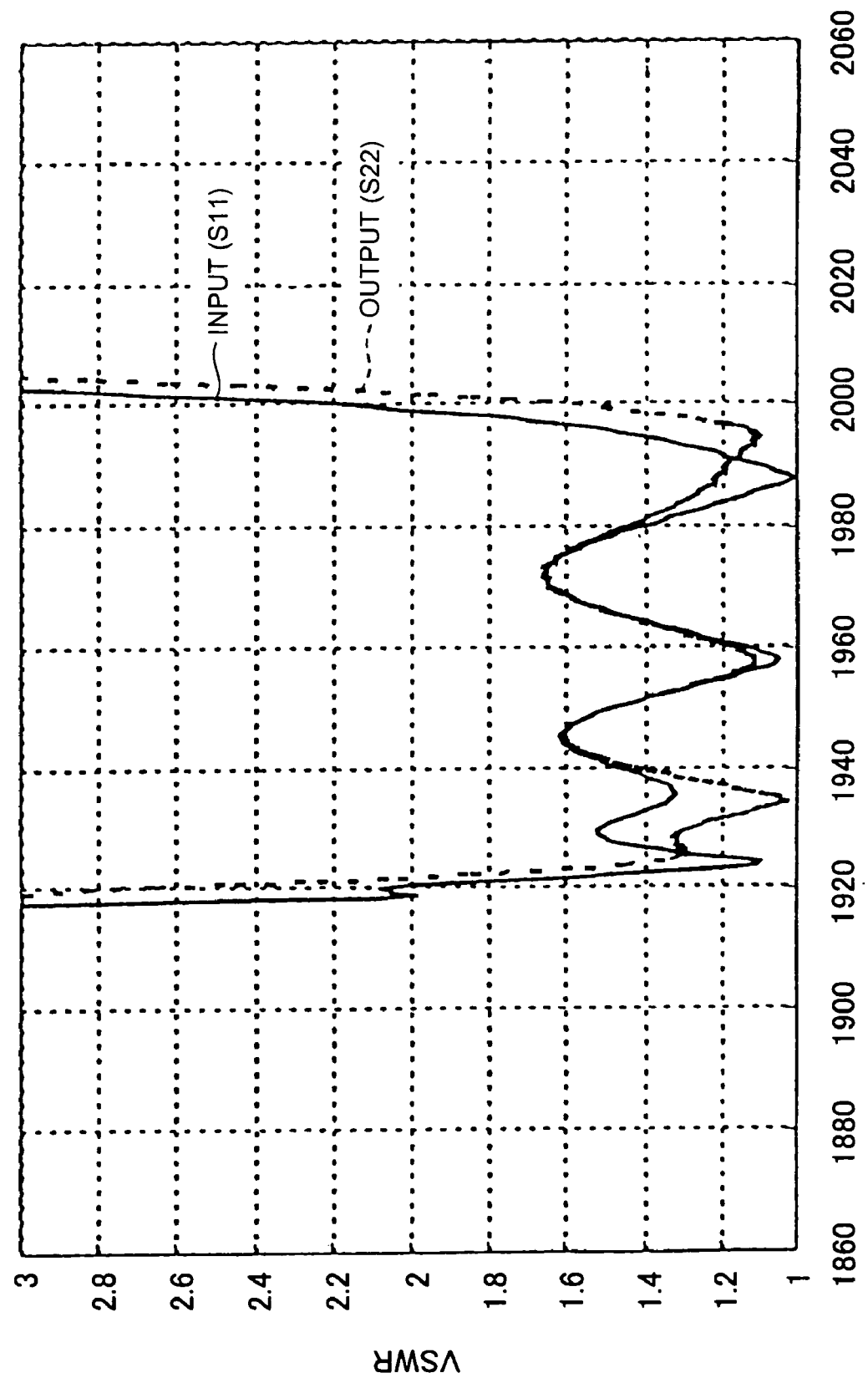
FIG. 22 is a graph showing the VSWR of the surface acoustic wave device according to Working Example 5 of the first preferred embodiment of the present invention.

The transmission characteristics, the impedance characteristics, and the VSWR near the pass band of the surface acoustic wave device according to Working Example 5 are shown in FIGS. 20, 21, and 22, respectively. In FIGS. 21 and 22, reference numeral S11 represents an input side and reference numeral S22 represents an output side.

In Working Example 5, since the number N1 is set to be smaller than the number N2 and the pitch P1 is set to be smaller than the pitch P2, the VSWR can be reduced. In other words, it can be seen that matching with an impedance ratio of about 1:3, in other words, matching with an input to output impedance ratio of about 1:3 can be achieved by setting the number N1 to be smaller than the number N2 and by setting the pitch P1 to be smaller than the pitch P2, while all the cross widths are preferably set to about 64 $\mu$m, in Working Example 5.

Although the intervals between the IDTs are set to be periodically continuous in Working Examples 1 to 5, the present invention is not necessarily limited to this. The intervals between the IDTs may be set to be discontinuous in some cases.

As described above, in the first preferred embodiment, a surface acoustic wave device including two cascaded longitudinally coupled resonator type surface acoustic wave elements is arranged such that the condition N1<N2 or the condition P1<P2 is satisfied or that, preferably, both the conditions N1<N2 and P1<P2 are satisfied, where N1 and P1 represent the number and the pitch, respectively, of narrow pitch electrode fingers of the surface acoustic wave elements on the input (or output) terminal side and N2 and P2 represent the number and the pitch, respectively, of narrow pitch electrode fingers of the surface acoustic wave elements on the output (or input) terminal side. Thus, a surface acoustic wave device in which matching is achieved with a desired impedance ratio of input terminal to output terminal can be provided. Here, the number of the IDTs of the longitudinally coupled resonator type surface acoustic wave elements is not particularly limited.

Furthermore, it is further preferable that the surface acoustic wave device be arranged such that NA is smaller than NB, where NA represents the number of electrode fingers of an IDT connected to the input (or output) terminal side and NB represents the number of electrode fingers of an IDT connected to the output (or input) terminal side. Thus, a surface acoustic wave device in which matching is achieved with a further desired impedance ratio of input terminal to output terminal can be provided.

Also, the surface acoustic wave device described above can be miniaturized since the impedance ratio of input terminal to output terminal can be matched without adding an inductance element or the like.

Figure 23:
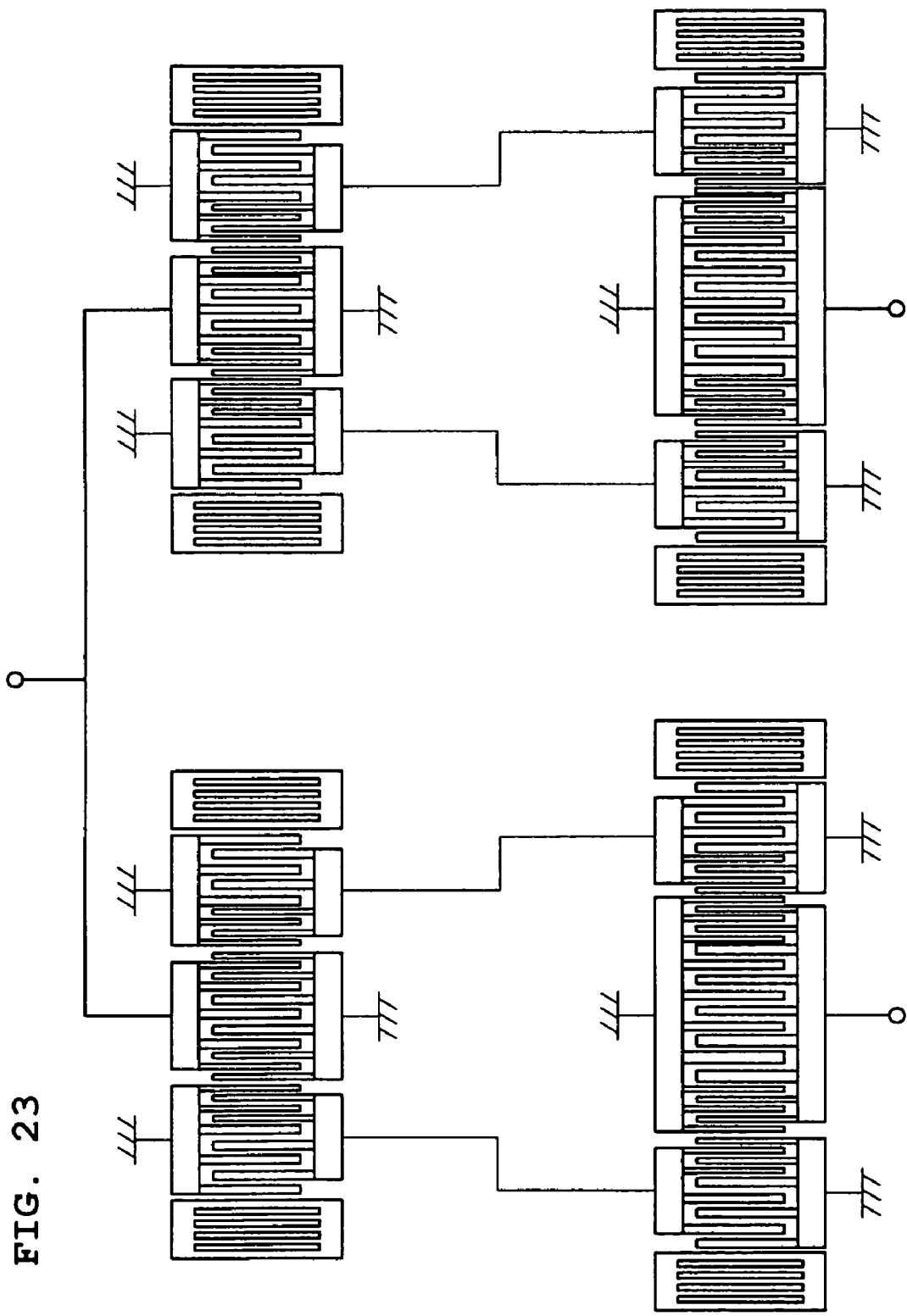
FIG. 23 is a circuit diagram showing a surface acoustic wave device according to a modification of the first preferred embodiment of the present invention.
Figure 24:
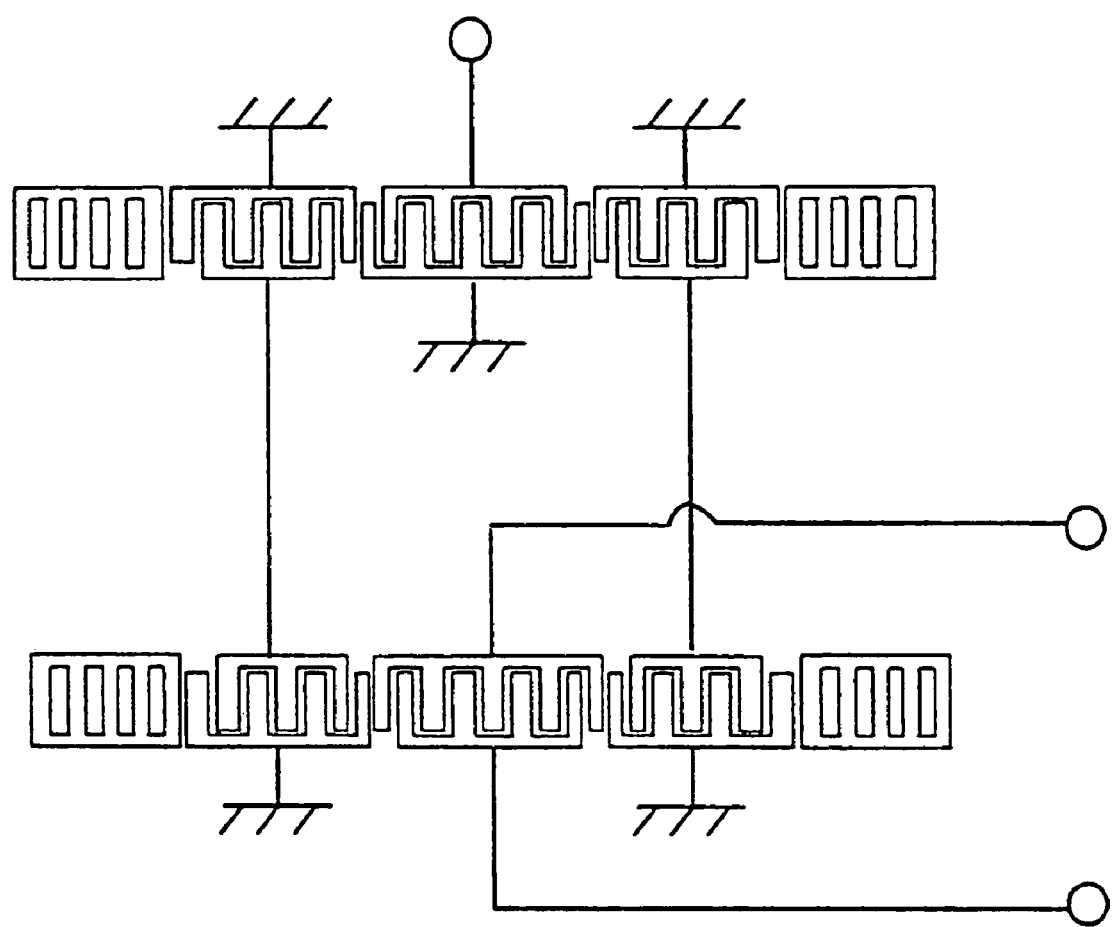
FIG. 24 is a circuit diagram showing a surface acoustic wave device according to another modification of the first preferred embodiment of the present invention.
Figure 25:
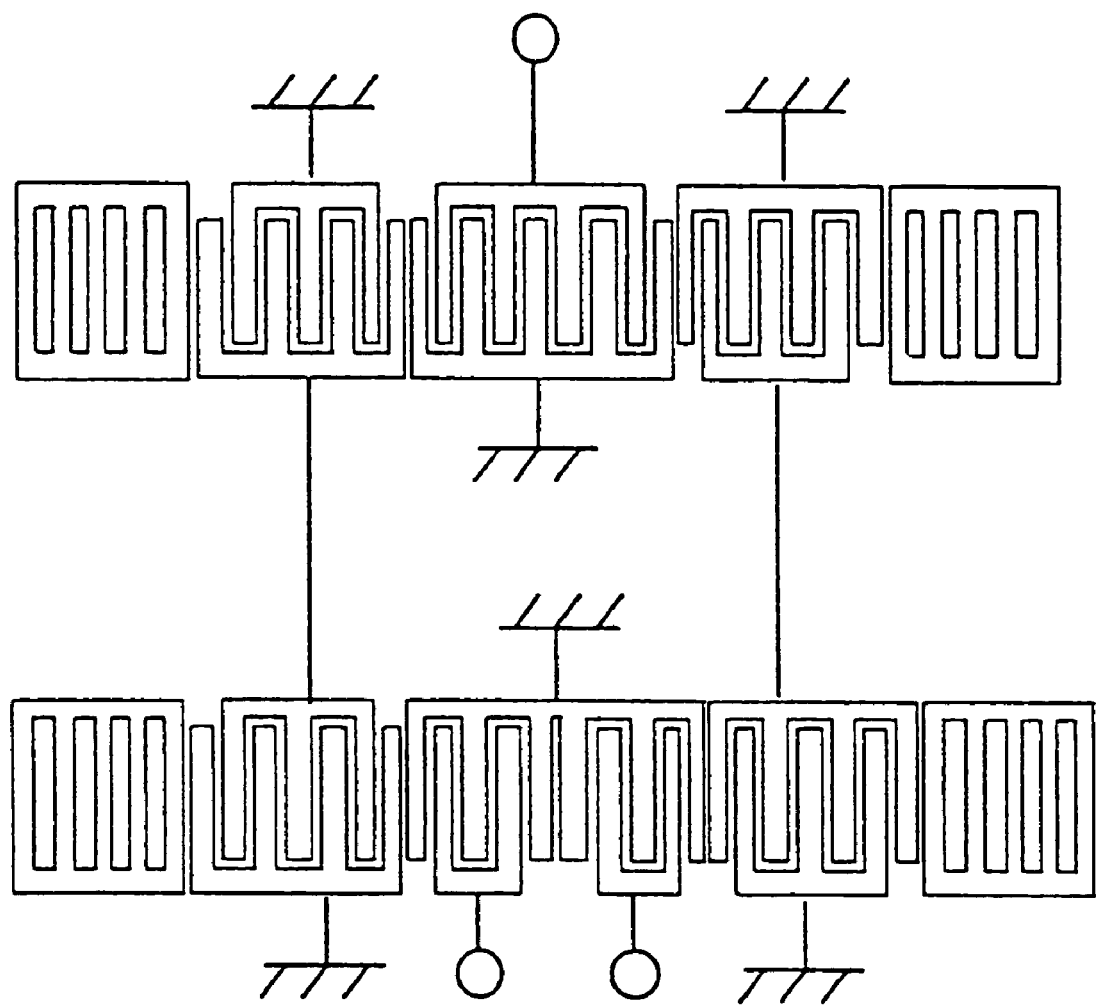
FIG. 25 is a circuit diagram showing a surface acoustic wave device according to another modification of the first preferred embodiment of the present invention.

Also, although the number of the electrode fingers of the central IDTs of the surface acoustic wave device is preferably an even number in the first preferred embodiment, the number of the electrode fingers of the central IDTs may be an odd number, as shown in FIG. 23.

Also, in the first preferred embodiment, the surface acoustic wave device preferably includes two two-stage longitudinally coupled resonator type surface acoustic wave filter elements each provided with a first stage longitudinally coupled resonator type surface acoustic wave element and a second stage longitudinally coupled resonator type surface acoustic wave element. However, impedance matching can be achieved also in a surface acoustic wave device shown in FIGS. 24 and 25 including a first stage longitudinally coupled resonator type surface acoustic wave element and a second stage longitudinally coupled resonator type surface acoustic wave element by setting the number or the pitch of the narrow pitch electrode fingers of the first stage longitudinally coupled resonator type surface acoustic wave element to be different from that of the second stage longitudinally coupled resonator type surface acoustic wave element or by setting the number and the pitch of the narrow pitch electrode fingers of the first stage longitudinally coupled resonator type surface acoustic wave element to be different from those of the second stage longitudinally coupled resonator type surface acoustic wave element.

Second Preferred Embodiment

A second preferred embodiment of the present invention will be described with reference to FIGS. 26 to 33. In the second preferred embodiment, a code division multiple access (CDMA) 800 receiving filter is described as an example. The frequency range necessary for a pass band of the CDMA 800 receiving filter is between 869 MHz and 894 MHz.

Figure 26:
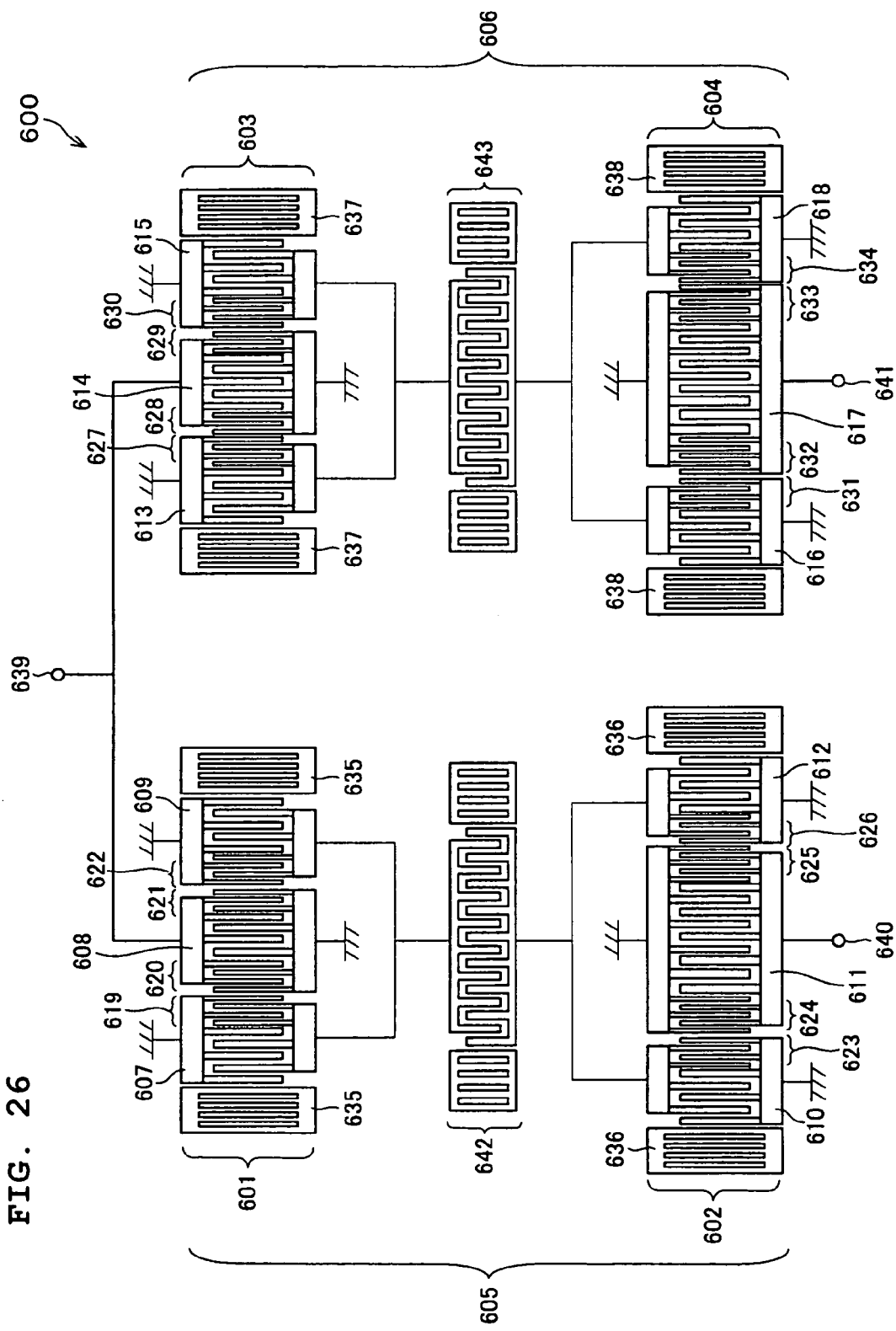
FIG. 26 is a circuit diagram showing a surface acoustic wave device according to a second preferred embodiment of the present invention.

Referring to FIG. 26, a surface acoustic wave device 600 according to the second preferred embodiment includes a longitudinally coupled resonator type surface acoustic wave filter element (first longitudinally coupled resonator type surface acoustic wave filter element) 605 and a longitudinally coupled resonator type surface acoustic wave filter element (second longitudinally coupled resonator type surface acoustic wave filter element) 606 provided on a piezoelectric substrate (not shown). The longitudinally coupled resonator type surface acoustic wave filter elements 605 and 606 are preferably formed by Al electrodes. In the second preferred embodiment, a 40±5° Y-cut X-propagation LiTaO$_3$ substrate is preferably used as the piezoelectric substrate.

The longitudinally coupled resonator type surface acoustic wave filter element 605 includes a longitudinally coupled resonator type surface acoustic wave element (first stage longitudinally coupled resonator type surface acoustic wave element) 601, a longitudinally coupled resonator type surface acoustic wave element (second stage longitudinally coupled resonator type surface acoustic wave element) 602, and a surface acoustic wave resonator 642.

The longitudinally coupled resonator type surface acoustic wave element 601 includes an interdigital transducer IDT 608 provided with a plurality of electrode fingers, IDTs 607 and 609 arranged so as to sandwich the IDT 608, and reflectors 635 provided on the left and right sides of the IDTs 607 to 609. Also, as shown in FIG. 26, some electrode fingers between the adjacent IDTs 607 and 608 and between the adjacent IDTs 608 and 609, in other words, narrow pitch electrode finger portions 619, 620, 621, and 622 have a pitch smaller than the other portion of each of the IDTs 607 to 609.

Similarly, the longitudinally coupled resonator type surface acoustic wave element 602 includes an IDT 611, IDTs 610 and 612 arranged so as to sandwich the IDT 611, and reflectors 636 provided on the left and right sides of the IDTs 610 to 612. Also, as shown in FIG. 26, some electrode fingers between the adjacent IDTs 610 and 611 and between the adjacent IDTs 611 and 612, in other words, narrow pitch electrode finger portions 623, 624, 625, and 626 have a pitch smaller than the other portion of each of the IDTs 610 to 612. The phase relationship of input and output signals of the longitudinally coupled resonator type surface acoustic wave element 602 is approximately the same as that of the longitudinally coupled resonator type surface acoustic wave element 601.

The surface acoustic wave resonator 642 includes an IDT and reflectors provided on the left and right sides of the IDT.

In the longitudinally coupled resonator type surface acoustic wave filter element 605, the surface acoustic wave resonator 642 is arranged between the longitudinally coupled resonator type surface acoustic wave element 601 and the longitudinally coupled resonator type surface acoustic wave element 602. More specifically, the surface acoustic wave resonator 642 is cascaded to the IDT 607 of the longitudinally coupled resonator type surface acoustic wave element 601 and to the IDT 610 of the longitudinally coupled resonator type surface acoustic wave element 602 and is cascaded to the IDT 609 of the longitudinally coupled resonator type surface acoustic wave element 601 and to the IDT 612 of the longitudinally coupled resonator type surface acoustic wave element 602. In other words, the longitudinally coupled resonator type surface acoustic wave filter element 605 is a two-stage connection surface acoustic wave filter.

The longitudinally coupled resonator type surface acoustic wave filter element 606 includes a longitudinally coupled resonator type surface acoustic wave element (first stage longitudinally coupled resonator type surface acoustic wave element) 603, a longitudinally coupled resonator type surface acoustic wave element (second stage longitudinally coupled resonator type surface acoustic wave element) 604, and a surface acoustic wave resonator 643.

The longitudinally coupled resonator type surface acoustic wave element 603 includes an IDT 614, IDTs 613 and 615 arranged so as to sandwich the IDT 614, and reflectors 637 provided on the left and right sides of the IDTs 613 to 615. Also, as shown in FIG. 26, some electrode fingers between the adjacent IDTs 613 and 614 and between the adjacent IDTs 614 and 615, in other words, narrow pitch electrode finger portions 627, 628, 629, and 630 have a pitch smaller than the other portion of each of the IDTs 613 to 615. The phase relationship of input and output signals of the longitudinally coupled resonator type surface acoustic wave element 603 is approximately the same as that of the longitudinally coupled resonator type surface acoustic wave element 601.

The longitudinally coupled resonator type surface acoustic wave element 604 includes an IDT 617, IDTs 616 and 618 arranged so as to sandwich the IDT 617, and reflectors 638 provided on the left and right sides of the IDTs 616 to 618. Also, as shown in FIG. 26, some electrode fingers between the adjacent IDTs 616 and 617 and between the adjacent IDTs 617 and 618, in other words, narrow pitch electrode finger portions 631, 632, 633, and 634 have a pitch smaller than the other portion of each of the IDTs 616 to 618. The phase relationship of input and output signals of the longitudinally coupled resonator type surface acoustic wave element 604 is set to be approximately 180 degrees different from the longitudinally coupled resonator type surface acoustic wave element 601.

The surface acoustic wave resonator 643 includes an IDT and reflectors provided on the left and right sides of the IDT.

In the longitudinally coupled resonator type surface acoustic wave filter element 606, the surface acoustic wave resonator 643 is arranged between the longitudinally coupled resonator type surface acoustic wave element 603 and the longitudinally coupled resonator type surface acoustic wave element 604. More specifically, the surface acoustic wave resonator 643 is cascaded to the IDT 613 of the longitudinally coupled resonator type surface acoustic wave element 603 and to the IDT 616 of the longitudinally coupled resonator type surface acoustic wave element 604 and is cascaded to the IDT 615 of the longitudinally coupled resonator type surface acoustic wave element 603 and to the IDT 618 of the longitudinally coupled resonator type surface acoustic wave element 604. In other words, the longitudinally coupled resonator type surface acoustic wave filter element 606 is a two-stage connection surface acoustic wave filter.

The IDT 608 of the longitudinally coupled resonator type surface acoustic wave filter element 605 and the IDT 614 of the longitudinally coupled resonator type surface acoustic wave filter element 606 are connected in parallel to an unbalanced signal terminal (input terminal) 639. Also, the IDT 611 of the longitudinally coupled resonator type surface acoustic wave filter element 605 and the IDT 617 of the longitudinally coupled resonator type surface acoustic wave filter element 606 are connected to balanced signal terminals (output terminals) 640 and 641, respectively.

In FIG. 26, for the sake of a simple explanation, the number of the electrode fingers is smaller than it really is.

An example of a detailed design of the first stage longitudinally coupled resonator type surface acoustic wave elements 601 and 603, the second stage longitudinally coupled resonator type surface acoustic wave elements 602 and 604, and the surface acoustic wave resonators 642 and 643 in the surface acoustic wave device 600 according to Working Example 6 of the second preferred embodiment will now be described.

The detailed design of the first stage longitudinally coupled resonator type surface acoustic wave elements 601 and 603 is as described below.

Cross width: about 150 μm

Number of electrode fingers of IDTs (607 and 613/608 and 614/609 and 615): 27/31/27

Number of electrode fingers of narrow pitch electrode finger portions (619 and 627/620 and 628/621 and 629/622 and 630): 4/3/3/4

Pitch P1 of narrow pitch electrode finger portions (619 and 627/620 and 628/621 and 629/622 and 630): about 2.0258 μm The detailed design of the second stage longitudinally coupled resonator type surface acoustic wave elements 602 and 604 is as described below.

Cross width: about 150 μm

Number of electrode fingers of IDTs (610 and 616/611 and 617/612 and 618): 27/39/27

Number of electrode fingers of narrow pitch electrode finger portions (623 and 631/624 and 632/625 and 633/626 and 634): 4/5/5/4

Pitch P2 of narrow pitch electrode finger portions (623 and 631/624 and 632/625 and 633/626 and 634): about 2.0732 μm The intervals between the IDTs are set to be periodically continuous.

The detailed design of the surface acoustic wave resonators 642 and 643 is as described below.

Cross width: about 70 μm

Number of electrode fingers of IDT: 231

Pitch of electrode fingers of IDT: about 2.2078 μm

Also, in the surface acoustic wave device according to Working Example 6, in accordance with the design parameters described above, the input impedance is preferably set to about 50 Ω and the output impedance is preferably set to about 100 Ω. In other words, the input to output impedance ratio is set to approximately 1:2. Also, in the surface acoustic wave device according to Working Example 6, the number NA of the electrode fingers of the central IDTs 608 and 614 of the longitudinally coupled resonator type surface acoustic wave elements 601 and 603, respectively, is different from the number NB of the electrode fingers of the central IDTs 611 and 617 of the longitudinally coupled resonator type surface acoustic wave elements 602 and 604, respectively (in Working Example 6, the number NA is set to be smaller than the number NB).

Figure 27:
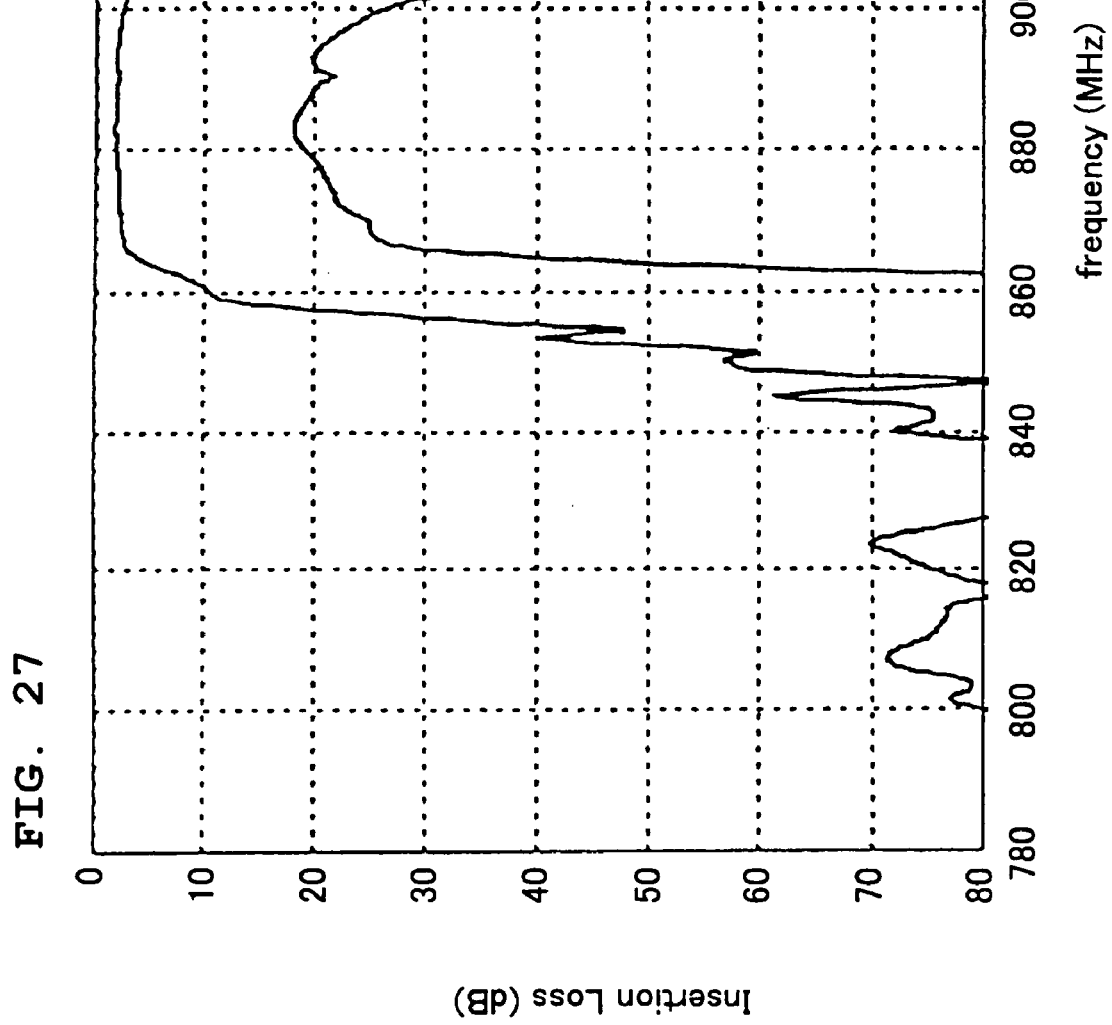
FIG. 27 is a graph showing the transmission characteristics (input to output impedance ratio of 1:2) near the pass band of a surface acoustic wave device according to Working Example 6 of the second preferred embodiment of the present invention.
Figure 29:
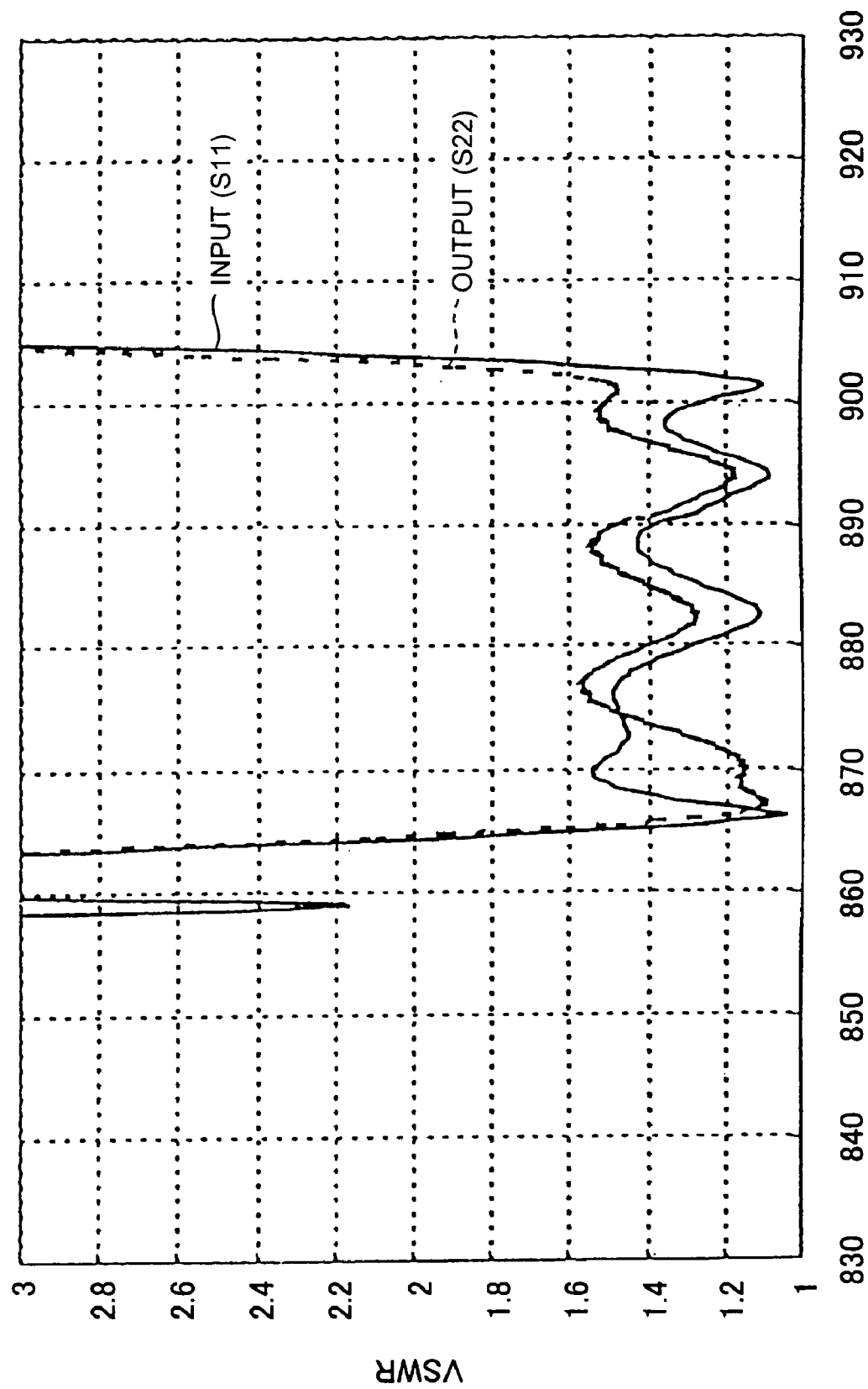
FIG. 29 is a graph showing the VSWR of the surface acoustic wave device according to Working Example 6 of the second preferred embodiment of the present invention.

The transmission characteristics, the impedance characteristics, and the VSWR near the pass band of the surface acoustic wave device 600 according to Working Example 6 are shown in FIGS. 27, 28, and 29, respectively. In FIGS. 28 and 29, reference numeral S11 represents an input side and reference numeral S22 represents an output side.

As is clear from FIG. 27, in particular, characteristics in which the attenuation in an area higher than the pass band is ensured and in which the attenuation changes abruptly can be achieved. Also, as is clear from FIG. 28, the relationship of the impedance ratio of unbalanced signal terminal to balanced signal terminal is about 1:2. Furthermore, as is clear from FIG. 29, an excellent VSWR of about 1.7 is achieved.

Figure 30:
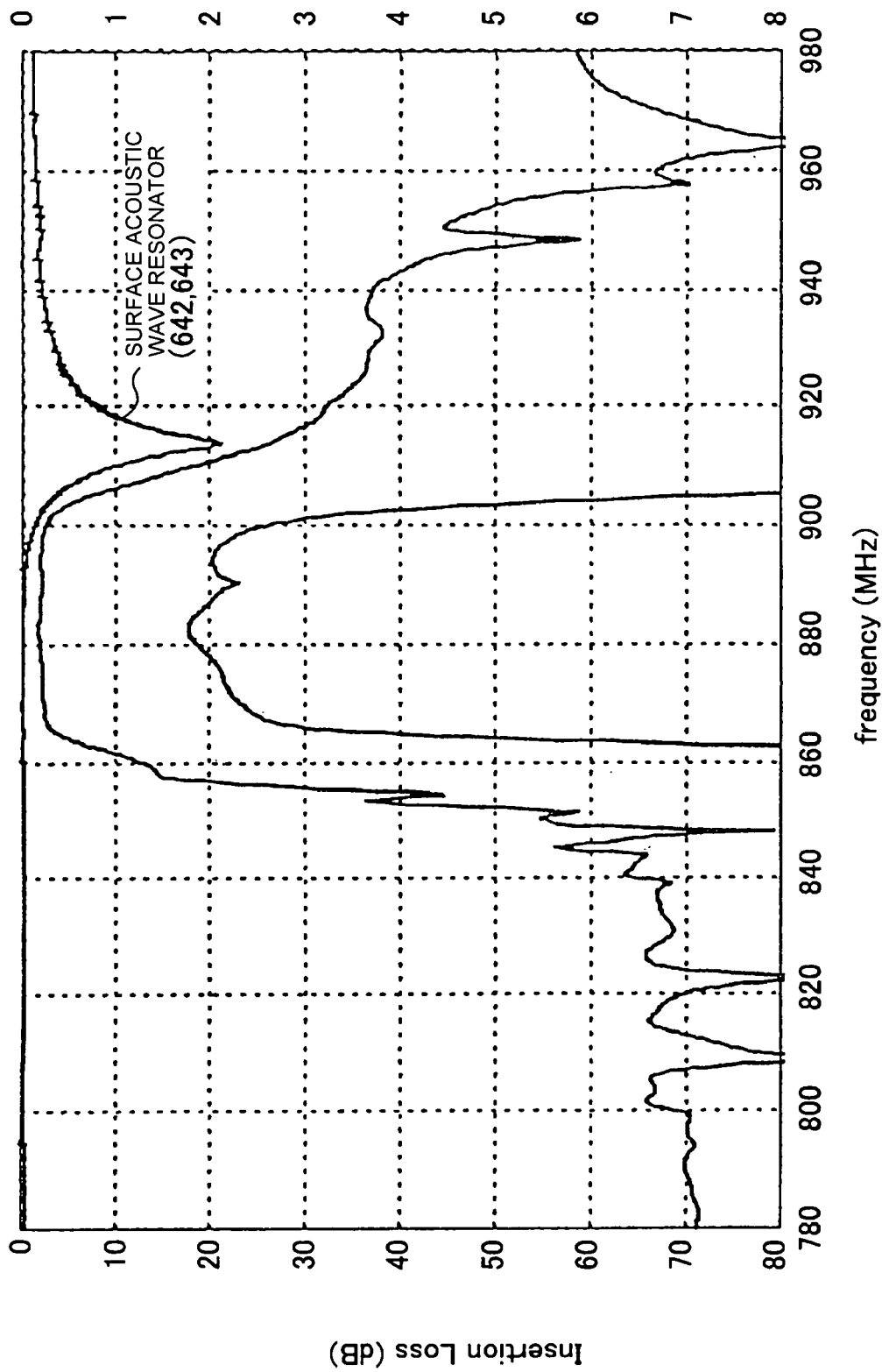
FIG. 30 is a graph showing the transmission characteristics (input to output impedance ratio of 1:2) near the pass band of a surface acoustic wave device when surface acoustic wave resonators are eliminated from the surface acoustic wave device according to Working Example 6 of the second preferred embodiment of the present invention.
Figure 32:
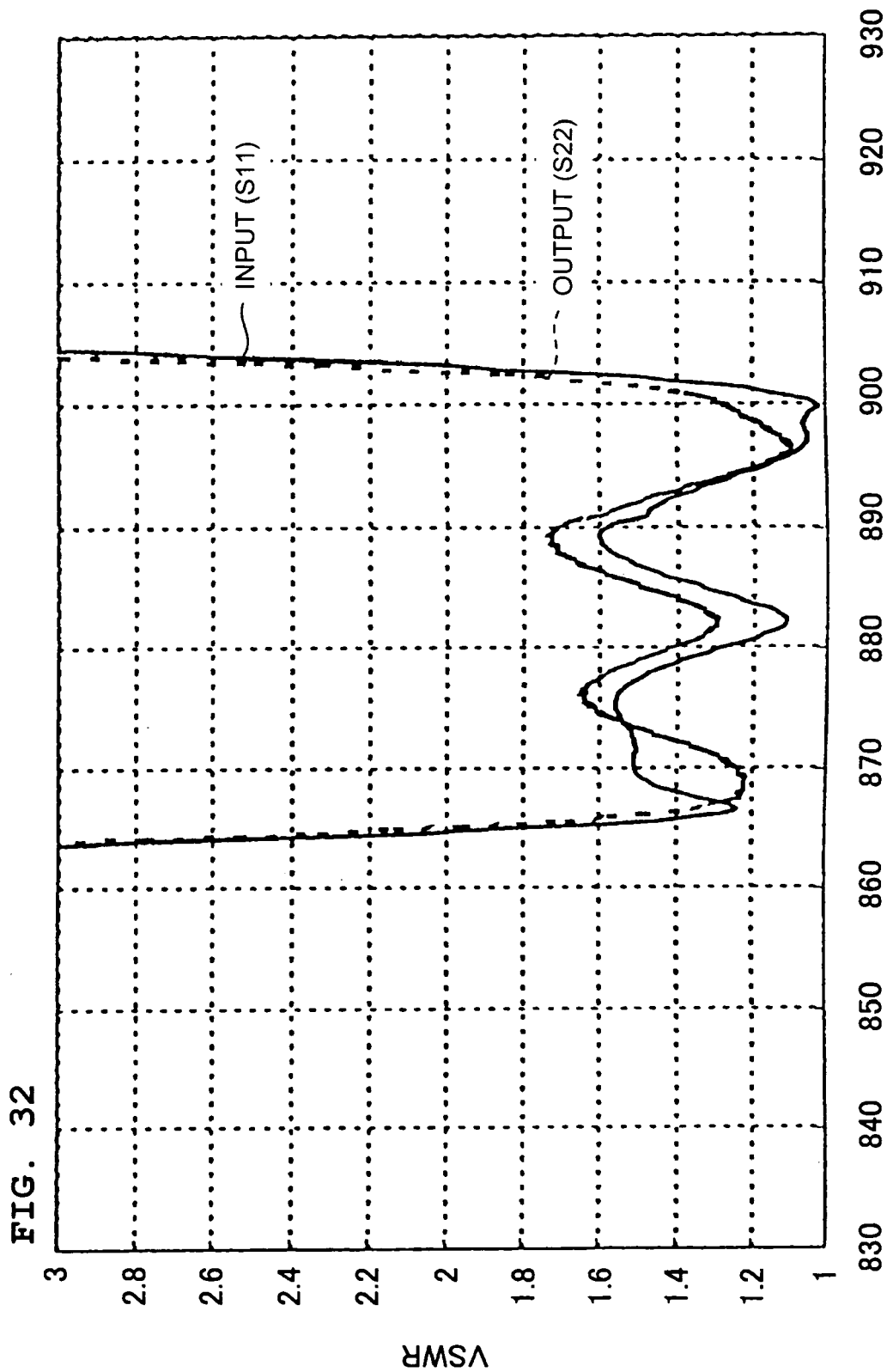
FIG. 32 is a graph showing the VSWR of the surface acoustic wave device when the surface acoustic wave resonators are eliminated from the surface acoustic wave device according to Working Example 6 of the second preferred embodiment of the present invention.

The effects of the surface acoustic wave resonators 642 and 643 will now be explained with reference to FIGS. 30 to 32. The graphs in FIGS. 30 to 32 show the characteristics of a surface acoustic wave device in which the surface acoustic wave resonators 642 and 643 are eliminated from the surface acoustic wave device according to Working Example 6 so as to be arranged in a similar manner to the surface acoustic wave device according to Working Example 1. The transmission characteristics, the impedance characteristics, and the VSWR near the pass band of the surface acoustic wave device are shown in FIGS. 30, 31, and 32, respectively. In FIGS. 31 and 32, reference numeral S11 represents an input side and reference numeral S22 represents an output side. Also, the frequency characteristics of the surface acoustic wave resonators 642 and 643 are shown in FIG. 30.

It can be seen from FIGS. 31 and 32 that the impedance ratio of unbalanced signal terminal to balanced signal terminal is about 1:2 even in a case where the surface acoustic wave resonators 642 and 643 are not provided. As shown in FIG. 30, the surface acoustic wave resonators 642 and 643 are designed to have frequency characteristics exhibiting an anti-resonance point near 915 MHz. In other words, due to such frequency characteristics of the surface acoustic wave resonators 642 and 643, characteristics exhibiting an excellent attenuation near 915 MHz can be achieved in the surface acoustic wave device according to Working Example 6.

As described above, in the second preferred embodiment, a surface acoustic wave device including two cascaded longitudinally coupled resonator type surface acoustic wave elements is arranged such that the condition N1<N2 or the condition P1<P2 is satisfied or that, preferably, both the conditions N1<N2 and P1<P2 are satisfied, where N1 and P1 represent the number and the pitch, respectively, of narrow pitch electrode fingers of the surface acoustic wave elements on the input (or output) terminal side and N2 and P2 represent the number and the pitch, respectively, of narrow pitch electrode fingers of the surface acoustic wave elements on the output (or input) terminal side and that a surface acoustic wave resonator (surface acoustic wave element) is provided so as to be cascaded to the joined portion of the two longitudinally coupled resonator type surface acoustic wave elements. Thus, a surface acoustic wave device in which matching is achieved with a desired impedance ratio of input terminal to output terminal and in which an excellent out-of-band attenuation is achieved can be provided. Here, the number of the IDTs of the longitudinally coupled resonator type surface acoustic wave elements is not particularly limited.

Furthermore, it is further preferable that the surface acoustic wave device be arranged such that NA is smaller than NB, where NA represents the number of electrode fingers of an IDT connected to the input (or output) side and NB represents the number of electrode fingers of an IDT connected to the output (or input) side. Thus, a surface acoustic wave device in which matching is achieved with a further desired impedance ratio of input terminal to output terminal can be provided.

Also, the surface acoustic wave device described above can be miniaturized since the impedance ratio of input terminal to output terminal can be matched without adding an inductance element or the like.

Figure 33:
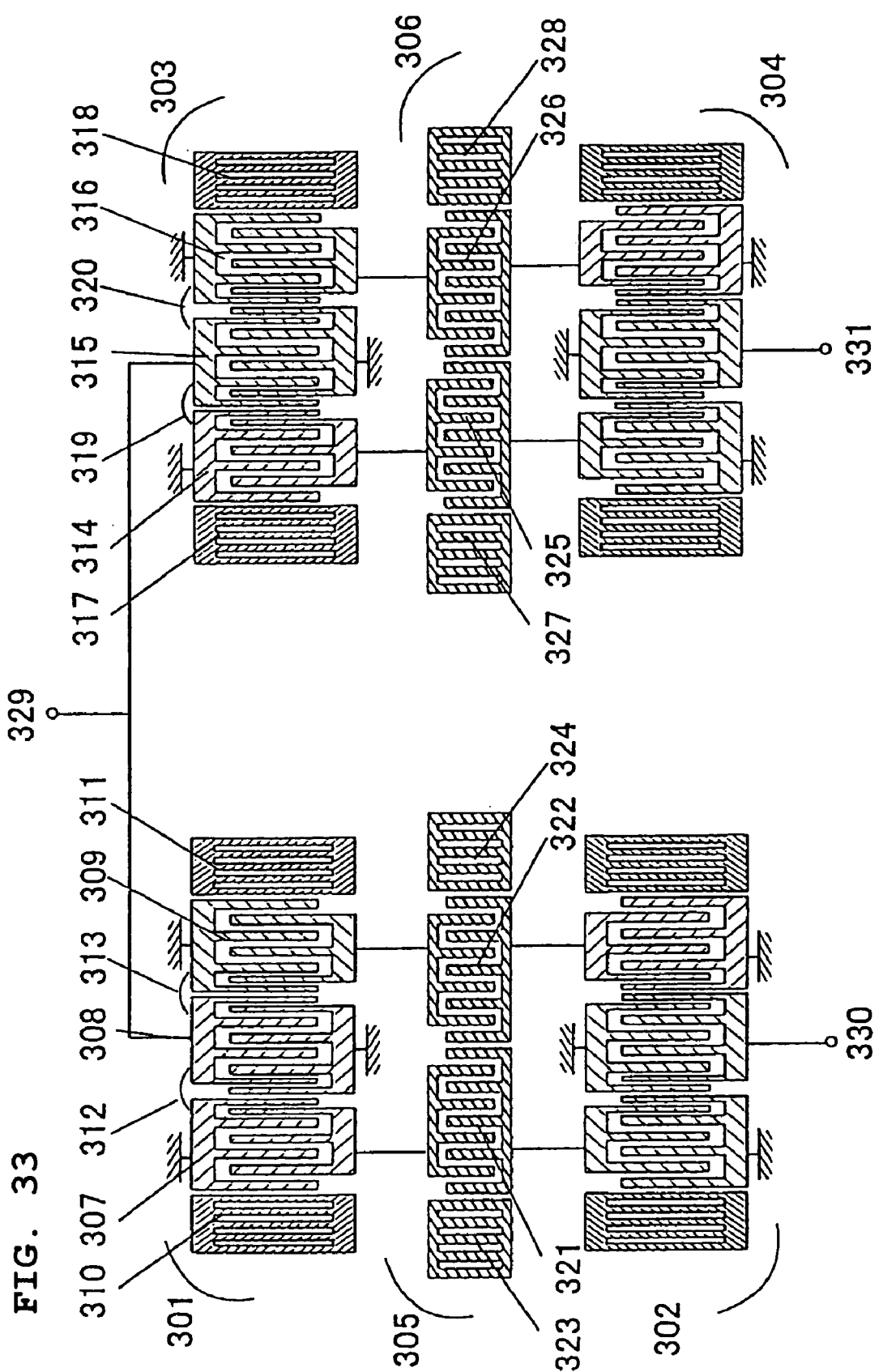
FIG. 33 is a circuit diagram showing a surface acoustic wave device according to a modification of the second preferred embodiment of the present invention.

Although the surface acoustic wave resonator including one IDT is used in the surface acoustic wave device according to the second preferred embodiment, a surface acoustic wave resonator including two or more IDTs may be used in the surface acoustic wave device, as shown in FIG. 33. Impedance matching can also be achieved in the surface acoustic wave device using the surface acoustic wave resonator including two or more IDTs.

A communication apparatus 1300 including a surface acoustic wave device according to various preferred embodiments of the present invention described above will now be described with reference to FIG. 34. The communication apparatus 1300 includes, as a receiver side (Rx side), an antenna 1301, an antenna duplexer/RF Top filter 1302, an amplifier 1303, an Rx inter-stage filter 1304, a mixer 1305, a 1st IF filter 1306, a mixer 1307, a 2nd IF filter 1308, a 1st+2nd local synthesizer 1311, a temperature compensated crystal oscillator (TCXO) 1312, a divider 1313, and a local filter 1314.

Figure 34:
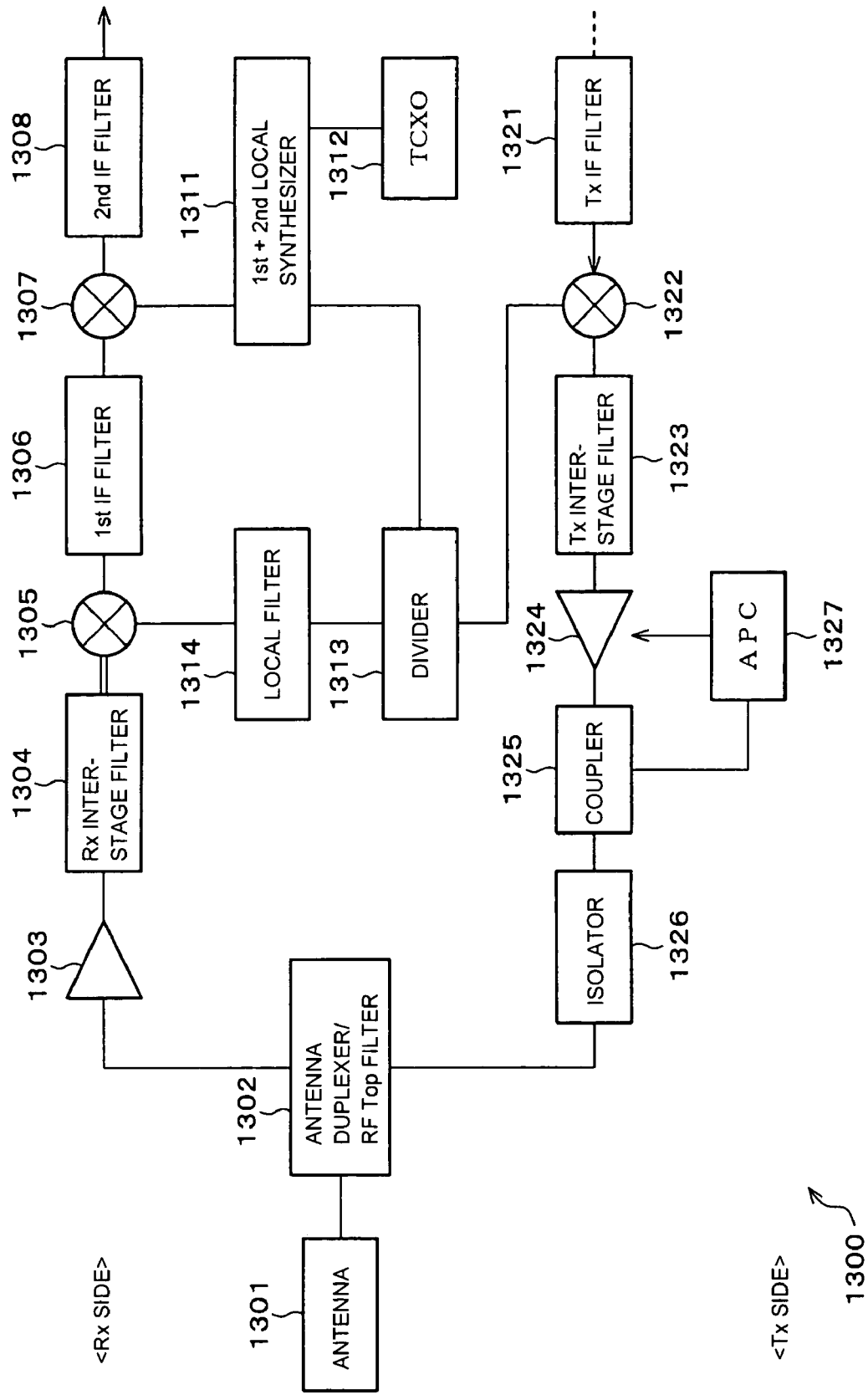
FIG. 34 is a block diagram showing a principal portion of a communication apparatus using the surface acoustic wave device according to various preferred embodiments of the present invention described above.
Figure 35:
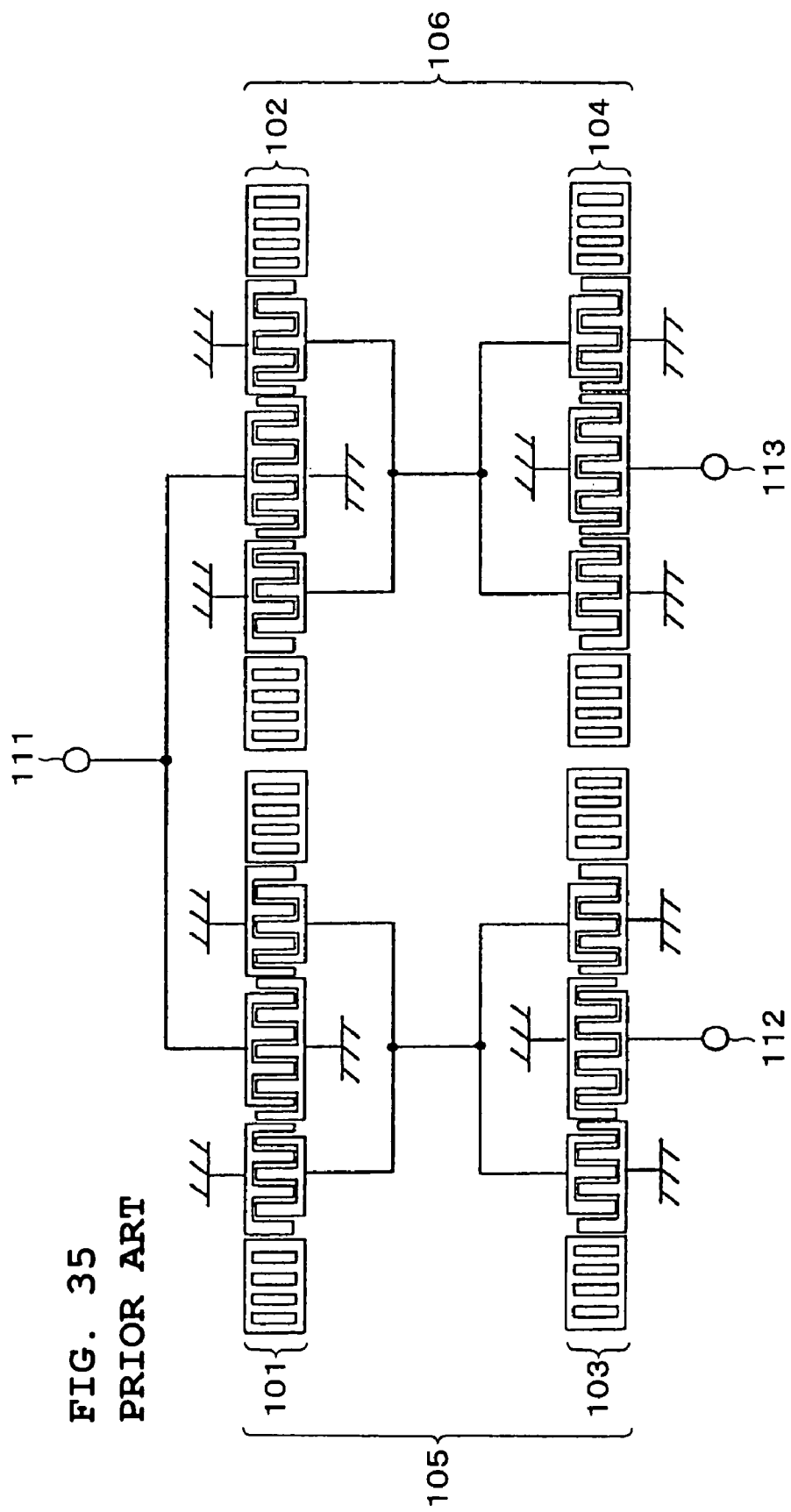
FIG. 35 is a circuit diagram showing a surface acoustic wave device according to Conventional Example 1.
Figure 36:
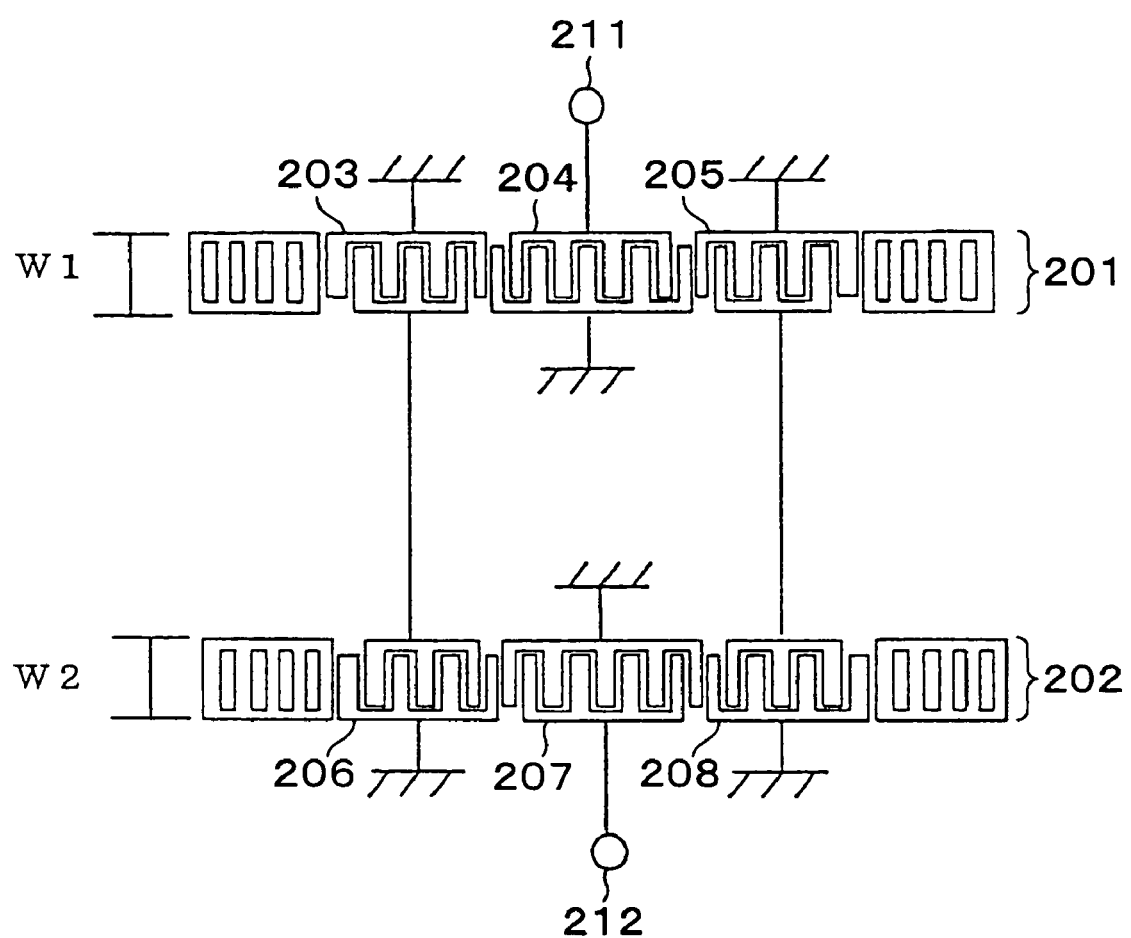
FIG. 36 is a circuit diagram showing a surface acoustic wave device according to Conventional Example 2.
Figure 37:
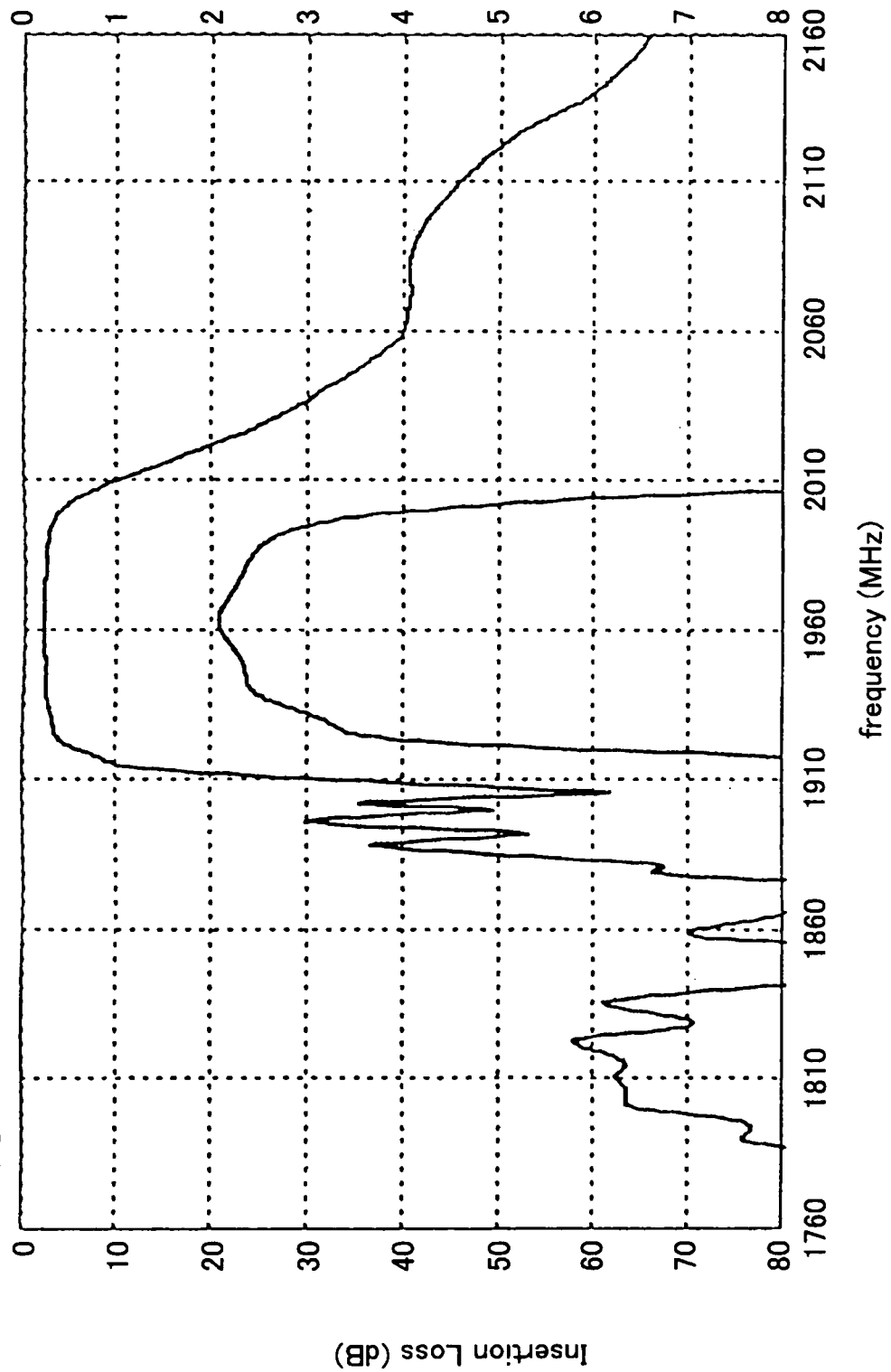
FIG. 37 is a graph showing the transmission characteristics (input to output impedance ratio of 1:4) near the pass band of the surface acoustic wave device according to Conventional Example 1.
Figure 39:
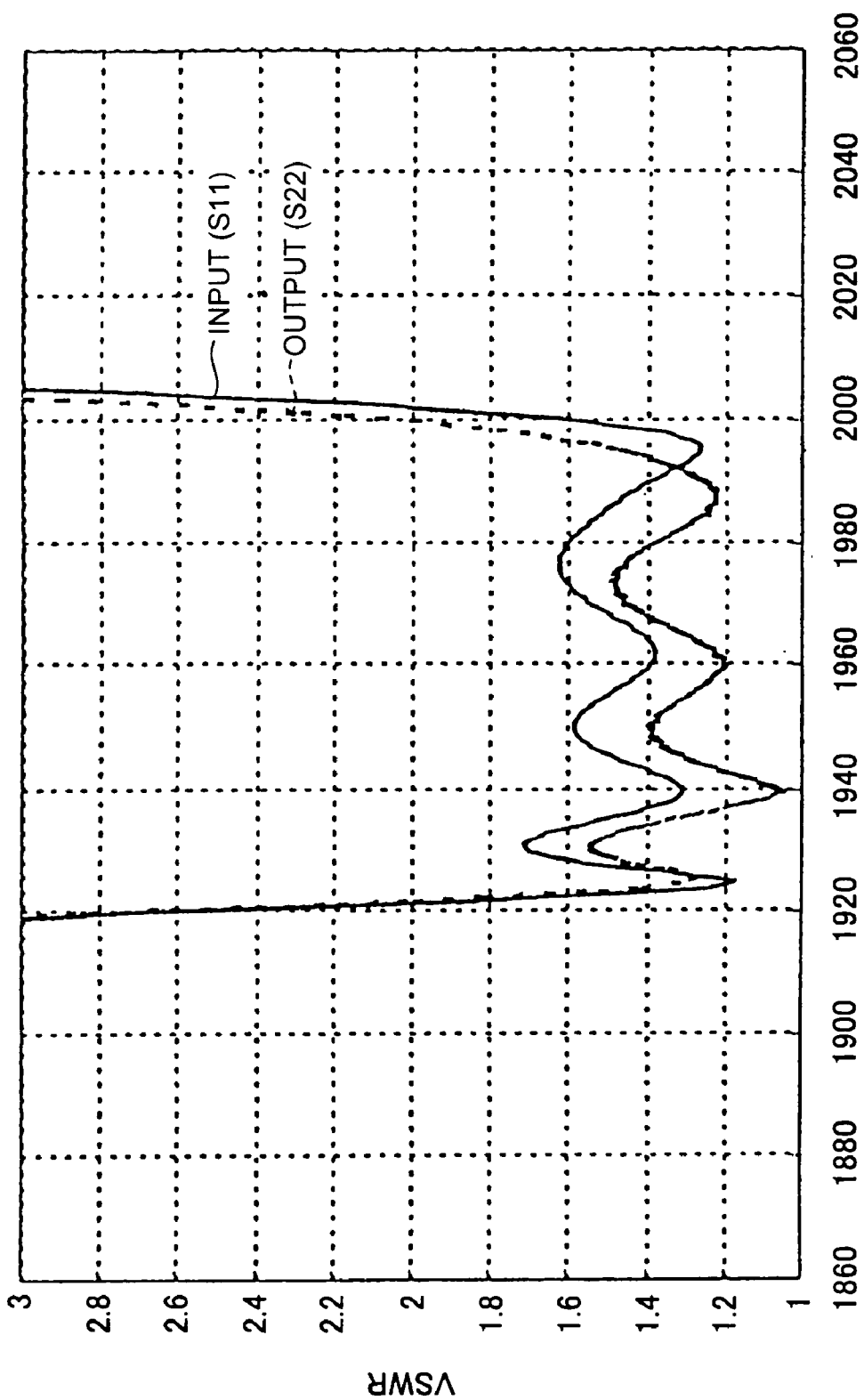
FIG. 39 is a graph showing the VSWR of the surface acoustic wave device according to Conventional Example 1.
Figure 40:
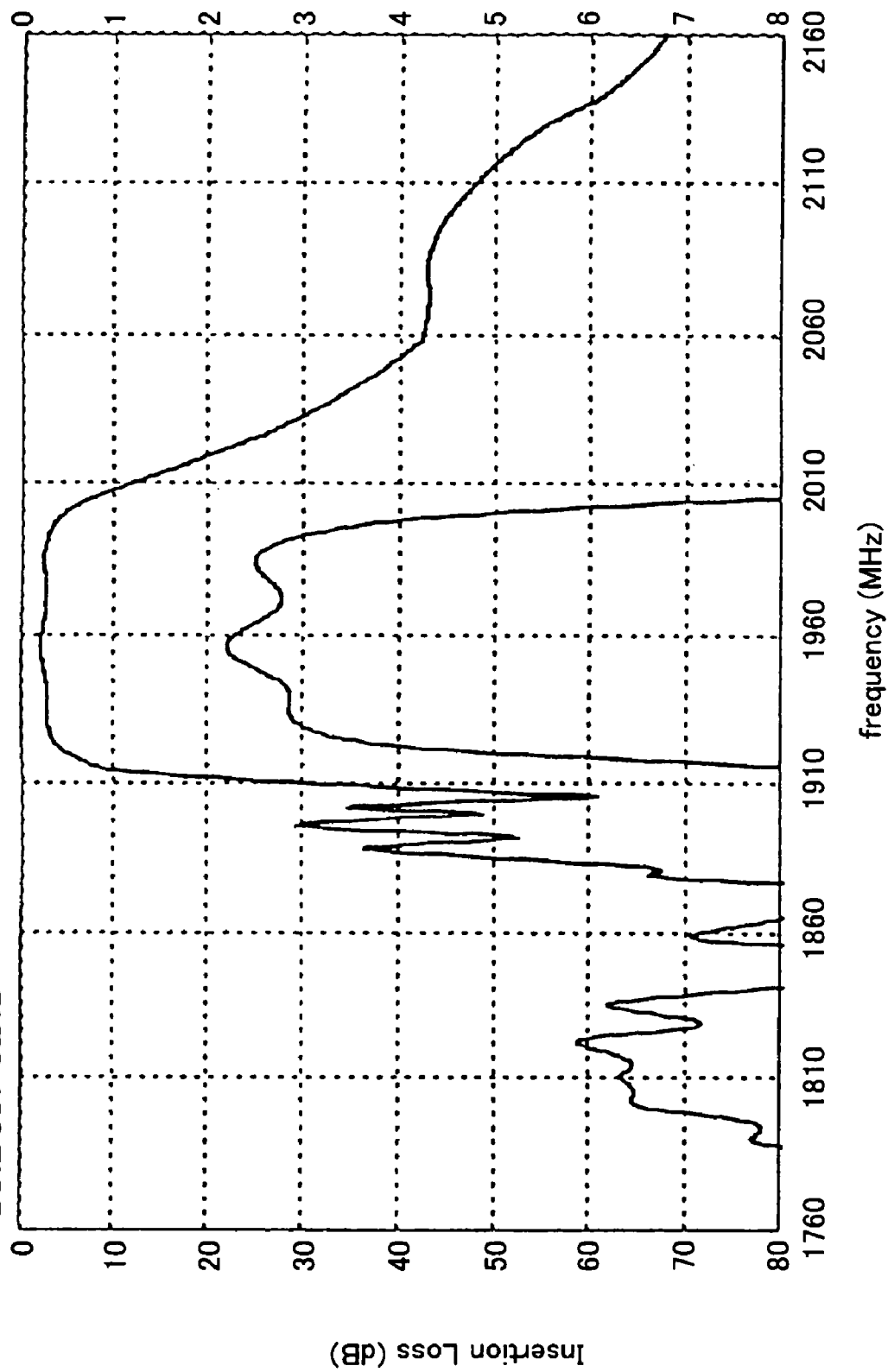
FIG. 40 is a graph showing the transmission characteristics (input to output impedance ratio of 1:3) near the pass band of a surface acoustic wave device arranged by a combination of Conventional Example 1 and Conventional Example 2.
Figure 42:
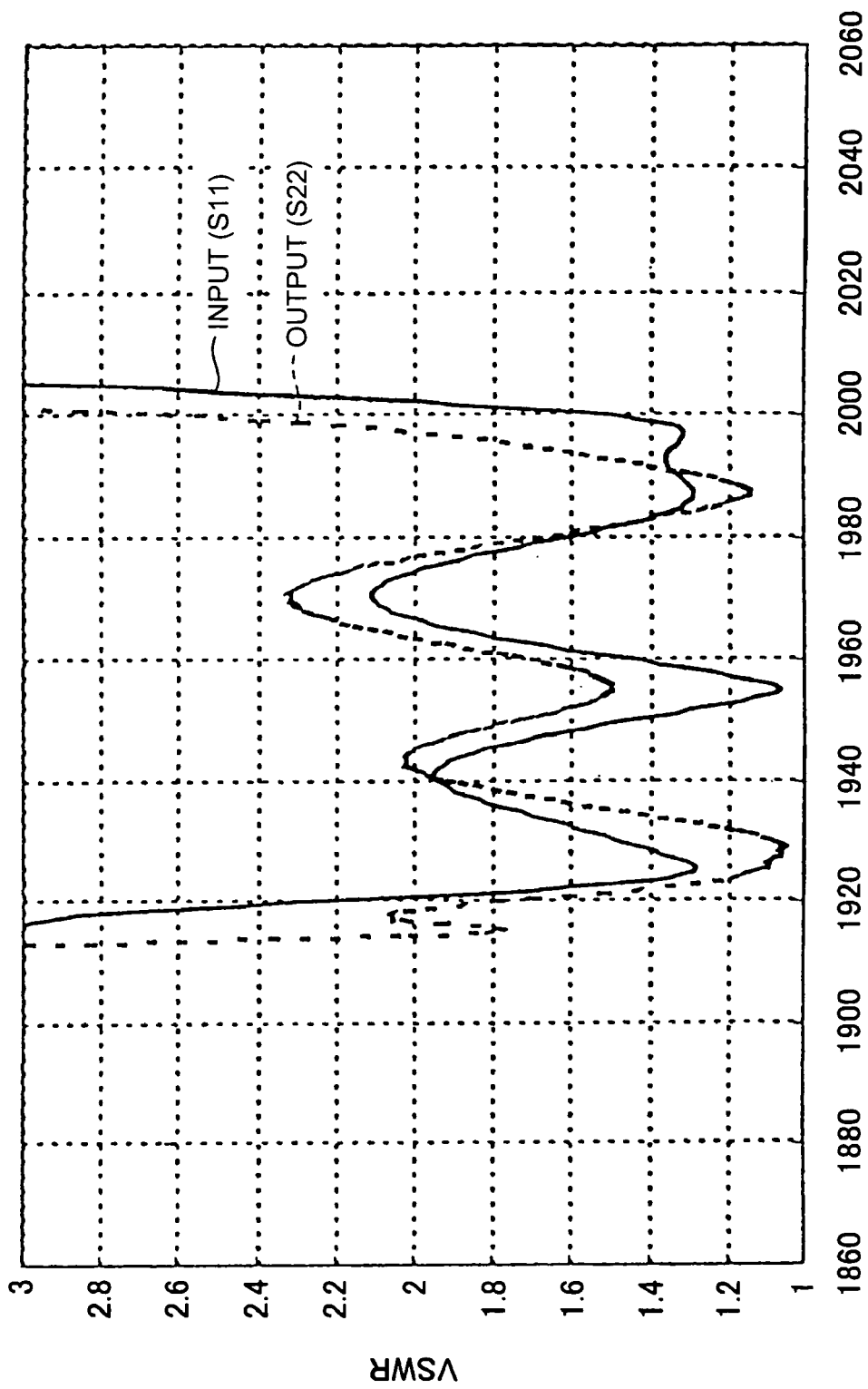
FIG. 42 is a graph showing the VSWR of the surface acoustic wave device arranged by the combination of Conventional Example 1 and Conventional Example 2.

It is preferable that balanced signals be transmitted from the Rx inter-stage filter 1304 to the mixer 1305 for balancing, as shown by the double lines in FIG. 34.

The communication apparatus 1300 includes, as a transmitter side (Tx side), a Tx IF filter 1321, a mixer 1322, a Tx inter-stage filter 1323, an amplifier 1324, a coupler 1325, an isolator 1326, and an automatic power control (APC) 1327, in addition to the shared antenna 1301 and the antenna duplexer/RF Top filter 1302.

A surface acoustic wave device according to any of the various preferred embodiments described above can be suitably used for the Rx inter-stage filter 1304, the 1st IF filter 1306, the Tx IF filter 1321, and the Tx inter-stage filter 1323.

The surface acoustic wave device according to preferred embodiments of the present invention has excellent characteristics providing impedance matching. Thus, the communication apparatus according to another preferred embodiment of the present invention including the surface acoustic wave device described above is capable of improving the transmission characteristics.

The present invention is not limited to each of the preferred embodiments described above. Various changes and modifications may be possible within the scope of the claims. An embodiment obtained by appropriately combining the technical means disclosed in different embodiments is also included in the technological scope of the present invention.

What is claimed is:

1. A surface acoustic wave device comprising:
   a first longitudinally coupled resonator type surface acoustic wave element including at least three interdigital transducers arranged along the direction of transmission of a surface acoustic wave, each of the interdigital transducers being provided with a plurality of electrode fingers; and
   a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein
   at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;
   the number and the pitch of the electrode fingers of the narrow pitch electrode finger portion of the first longitudinally coupled resonator type surface acoustic wave element are different from the number and the pitch of the electrode fingers of the narrow pitch electrode finger portion of the second longitudinally coupled resonator type surface acoustic wave element; and
   each of the first and second longitudinally coupled resonator type surface acoustic wave elements includes three interdigital transducers, and the number of the electrode fingers of a central interdigital transducer of the first longitudinally coupled resonator type surface acoustic wave element is different from the number of the electrode fingers of a central interdigital transducer of the second longitudinally coupled resonator type surface acoustic wave element.

2. A surface acoustic wave device comprising:
   a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

N1 is not equal to N2, where N1 represents the number of the electrode fingers of the narrow pitch electrode finger portion of the first longitudinally coupled resonator type surface acoustic wave element and N2 represents the number of the electrode fingers of the narrow pitch electrode finger portion of the second longitudinally coupled resonator type surface acoustic wave element; and each of the first and second longitudinally coupled resonator type surface acoustic wave elements includes three interdigital transducers, and the number of the electrode fingers of a central interdigital transducer of the first longitudinally coupled resonator type surface acoustic wave element is different from the number of the electrode fingers of a central interdigital transducer of the second longitudinally coupled resonator type surface acoustic wave element.

3. A surface acoustic wave device comprising:
a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

wherein P1 is not equal to P2, where P1 represents the pitch of the electrode fingers of the narrow pitch electrode finger portion of the first longitudinally coupled resonator type surface acoustic wave element and P2 represents the pitch of the electrode fingers of the narrow pitch electrode finger portion of the second longitudinally coupled resonator type surface acoustic wave element; and each of the first and second longitudinally coupled resonator type surface acoustic wave elements includes three interdigital transducers, and the number of the electrode fingers of a central interdigital transducer of the first longitudinally coupled resonator type surface acoustic wave element is different from the number of the electrode fingers of a central interdigital transducer of the second longitudinally coupled resonator type surface acoustic wave element.

4. A surface acoustic wave device comprising:
a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

the number and the pitch of the electrode fingers of the narrow pitch electrode finger portion of the first longitudinally coupled resonator type surface acoustic wave element are different from the number and the pitch of the electrode fingers of the narrow pitch electrode finger portion of the second longitudinally coupled resonator type surface acoustic wave element; and at least one surface acoustic wave resonator is cascaded between the first longitudinally coupled resonator type surface acoustic wave element and the second longitudinally coupled resonator type surface acoustic wave element.

5. A surface acoustic wave device comprising:
a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

N1 is not equal to N2, where N1 represents the number of the electrode fingers of the narrow pitch electrode finger portion of the first longitudinally coupled resonator type surface acoustic wave element and N2 represents the number of the electrode fingers of the narrow pitch electrode finger portion of the second longitudinally coupled resonator type surface acoustic wave element; and at least one surface acoustic wave resonator is cascaded between the first longitudinally coupled resonator type surface acoustic wave element and the second longitudinally coupled resonator type surface acoustic wave element.

6. A surface acoustic wave device comprising:

a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

wherein P1 is not equal to P2, where P1 represents the pitch of the electrode fingers of the narrow pitch electrode finger portion of the first longitudinally coupled resonator type surface acoustic wave element and P2 represents the pitch of the electrode fingers of the narrow pitch electrode finger portion of the second longitudinally coupled resonator type surface acoustic wave element; and at least one surface acoustic wave resonator is cascaded between the first longitudinally coupled resonator type surface acoustic wave element and the second longitudinally coupled resonator type surface acoustic wave element.

7. A surface acoustic wave device comprising:

a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

the number and the pitch of the electrode fingers of the narrow pitch electrode finger portion of the first longitudinally coupled resonator type surface acoustic wave element are different from the number and the pitch of the electrode fingers of the narrow pitch electrode finger portion of the second longitudinally coupled resonator type surface acoustic wave element; and the ratio of input impedance to output impedance is about 1:2 or about 1:3 or the ratio of output impedance to input impedance is about 1:2 or about 1:3.

8. A surface acoustic wave device comprising:

a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

N1 is not equal to N2, where N1 represents the number of the electrode fingers of the narrow pitch electrode finger portion of the first longitudinally coupled resonator type surface acoustic wave element and N2 represents the number of the electrode fingers of the narrow pitch electrode finger portion of the second longitudinally coupled resonator type surface acoustic wave element; and the ratio of input impedance to output impedance is about 1:2 or about 1:3 or the ratio of output impedance to input impedance is about 1:2 or about 1:3.

9. A surface acoustic wave device comprising:

a first longitudinally coupled resonator type surface acoustic wave element including at least three interdigital transducers arranged along the direction of transmission of a surface acoustic wave, each of the interdigital transducers being provided with a plurality of electrode fingers; and a second longitudinally coupled resonator type surface acoustic wave element including at least three interdigital transducers arranged along the direction of transmission of the surface acoustic wave, each of the interdigital transducers of the second longitudinally coupled resonator type surface acoustic wave element being provided with a plurality of electrode fingers, the first longitudinally coupled resonator type surface acoustic wave element and the second longitudinally coupled resonator type surface acoustic wave element being cascaded to each other and being arranged on a piezoelectric substrate; wherein at least one of the interdigital transducers of each of the first and second longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

wherein P1 is not equal to P2, where P1 represents the pitch of the electrode fingers of the narrow pitch electrode finger portion of the first longitudinally coupled resonator type surface acoustic wave element and P2 represents the pitch of the electrode fingers of the narrow pitch electrode finger portion of the second longitudinally coupled resonator type surface acoustic wave element; and the ratio of input impedance to output impedance is about 1:2 or about 1:3 or the ratio of output impedance to input impedance is about 1:2 or about 1:3.

10. A surface acoustic wave device comprising:

a first surface acoustic wave filter element including a first longitudinally coupled resonator type surface acoustic wave element provided with at least three interdigital transducers arranged along the direction of transmission of a surface acoustic wave, each of the interdigital transducers being provided with a plurality of electrode fingers, and a second longitudinally coupled resonator type surface acoustic wave element provided with at least three interdigital transducers arranged along the direction of transmission of the surface acoustic wave, each of the interdigital transducers being provided with a plurality of electrode fingers, the first longitudinally coupled resonator type surface acoustic wave element and the second longitudinally coupled resonator type surface acoustic wave element being cascaded to each other and being arranged on a piezoelectric substrate; and a second surface acoustic wave filter element including a third longitudinally coupled resonator type surface acoustic wave element provided with at least three interdigital transducers arranged along the direction of transmission of the surface acoustic wave, each of the interdigital transducers being provided with a plurality of electrode fingers, and a fourth longitudinally coupled resonator type surface acoustic wave element provided with at least three interdigitate transducers arranged along the direction of transmission of the surface acoustic wave, each of the interdigital transducers being provided with a plurality of electrode fingers, the third longitudinally coupled resonator type surface acoustic wave element and the fourth longitudinally coupled resonator type surface acoustic wave element being cascaded to each other and being arranged on the piezoelectric substrate, the phase of input and output signals of the second surface acoustic wave filter element being approximately 180 degrees different from the phase of input and output signals of the first surface acoustic wave filter element, one terminal of the first surface acoustic wave filter element and one terminal of the second surface acoustic wave filter element being electrically connected in parallel, the other terminal of the first surface acoustic wave filter element and the other terminal of the second surface acoustic wave filter element being electrically connected in series; wherein at least one of the interdigital transducers of each of the first, second, third, and fourth longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;

the number and the pitch of the electrode fingers of the narrow pitch electrode finger portion of the first longitudinally coupled resonator type surface acoustic wave element are different from the number and the pitch of the electrode fingers of the narrow pitch electrode finger portion of the second longitudinally coupled resonator type surface acoustic wave element; and the number and the pitch of the electrode fingers, of the narrow pitch electrode finger portion of the third longitudinally coupled resonator type surface acoustic wave element are different from the number and the pitch of the electrode fingers of the narrow pitch electrode finger portion of the fourth longitudinally coupled resonator type surface acoustic wave element.

11. A surface acoustic wave device comprising:

a first surface acoustic wave filter element including a first longitudinally coupled resonator type surface acoustic wave element provided with at least three interdigital transducers arranged along the direction of transmission of a surface acoustic wave, each of the interdigital transducers being provided with a plurality of electrode fingers, and a second longitudinally coupled resonator type surface acoustic wave element provided with at least three interdigital transducers arranged along the direction of transmission of the surface acoustic wave, each of the interdigital transducers being provided with a plurality of electrode fingers, the first longitudinally coupled resonator type surface acoustic wave element and the second longitudinally coupled resonator type surface acoustic wave element being cascaded to each other and being arranged on a piezoelectric substrate; and a second surface acoustic wave filter element including a third longitudinally coupled resonator type surface acoustic wave element provided with at least three interdigital transducers arranged along the direction of transmission of the surface acoustic wave, each of the interdigital transducers being provided with a plurality of electrode fingers, and a fourth longitudinally coupled resonator type surface acoustic wave element provided with at least three interdigital transducers arranged along the direction of transmission of the surface acoustic wave, each of the interdigital transducers being provided with a plurality of electrode fingers, the third longitudinally coupled resonator type surface acoustic wave element and the fourth longitudinally coupled resonator type surface acoustic wave element being cascaded to each other and being arranged on the piezoelectric substrate, the phase of input and output signals of the second surface acoustic wave filter element being approximately 180 degrees different from the phase of input and output signals of the first surface acoustic wave filter element, one terminal of the first surface acoustic wave filter element and one terminal of the second surface acoustic wave filter element being electrically connected in parallel, the other terminal of the first surface acoustic wave filter element and the other terminal of the second surface acoustic wave filter element being electrically connected in series; wherein
at least one of the interdigital transducers of each of the first, second, third, and fourth longitudinally coupled resonator type surface acoustic wave elements has a narrow pitch electrode finger portion near the adjacent interdigital transducer, the pitch of the electrode fingers of the narrow pitch electrode finger portion being smaller than the pitch of the other electrode fingers;
the number of the electrode fingers of the narrow pitch electrode finger portion of the first longitudinally coupled resonator type surface acoustic wave element is different from the number of the electrode fingers of the narrow pitch electrode finger portion of the second longitudinally coupled resonator type surface acoustic wave element; and
wherein the number of the electrode fingers of the narrow pitch electrode finger portion of the third longitudinally coupled resonator type surface acoustic wave element is different from the number of the electrode fingers of the narrow pitch electrode finger portion of the fourth longitudinally coupled resonator type surface acoustic wave element.

12. A surface acoustic wave device comprising:
a first surface acoustic wave filter element including a first longitudinally coupled resonator type surface acoustic wave element provided with at least three interdigital transducers arranged along the direction of transmission of a surface acoustic wave, each of the interdigital transducers being provided with a plurality of electrode fingers, and a second longitudinally coupled resonator type surface acoustic wave element provided with at least three interdigital transducers arranged along the direction of transmission of the surface acoustic wave, each of the interdigital transducers being provided with a plurality of electrode fingers, the first longitudinally coupled resonator type surface acoustic wave element and the second longitudinally coupled resonator type surface acoustic wave element being cascaded to each other and being arranged on a piezoelectric substrate; and
a second surface acoustic wave filter element including a third longitudinally coupled resonator type surface acoustic wave element provided with at least three interdigital transducers arranged along the direction of transmission of the surface acoustic wave, each of the interdigital transducers being provided with a plurality of electrode fingers, and a fourth longitudinally coupled resonator type surface acoustic wave element provided with at least three interdigital transducers arranged along the direction of transmission of the surface acoustic wave, each of the interdigital transducers being provided with a plurality of electrode fingers, the third longitudinally coupled resonator type surface acoustic wave element and the fourth longitudinally coupled resonator type surface acoustic wave element being cascaded to each other and being arranged on the piezoelectric substrate, the phase of input and output signals of the second surface acoustic wave filter element being approximately 180 degrees different from the phase of input and output signals of the first surface acoustic wave filter element, one terminal of the first surface acoustic wave filter element and one terminal of the second surface acoustic wave filter element being electrically connected in parallel, the other terminal of the first surface acoustic wave filter element and the other terminal of the second surface acoustic wave filter element being electrically connected in series; wherein
at least one of the interdigital transducers of each of the first, second, third, and fourth longitudinally coupled resonator type surface acoustic wave elements has a narrow pitch electrode finger portion located near the adjacent interdigital transducer, the pitch of the electrode fingers of the narrow pitch electrode finger portion being smaller than the pitch of the other electrode fingers;
the pitch of the electrode fingers of the narrow pitch electrode finger portion of the first longitudinally coupled resonator type surface acoustic wave element is different from the pitch of the electrode fingers of the narrow pitch electrode finger portion of the second longitudinally coupled resonator type surface acoustic wave element; and
the pitch of the electrode fingers of the narrow pitch electrode finger portion of the third longitudinally coupled resonator type surface acoustic wave element is different from the pitch of the electrode fingers of the narrow pitch electrode finger portion of the fourth longitudinally coupled resonator type surface acoustic wave element.

13. A surface acoustic wave device according to claim 10, wherein each of the first, second, third, and fourth longitudinally coupled resonator type surface acoustic wave elements includes three interdigital transducers, the number of the electrode fingers of a central interdigital transducer of the first longitudinally coupled resonator type surface acoustic wave element is different from the number of the electrode fingers of a central interdigital transducer of the second longitudinally coupled resonator type surface acoustic wave element, and the number of the electrode fingers of the central interdigital transducer of the third longitudinally coupled resonator type surface acoustic wave element is different from the number of the electrode fingers of the central interdigital transducer of the fourth longitudinally coupled resonator type surface acoustic wave element.

14. A surface acoustic wave device according to claim 11, wherein each of the first, second, third, and fourth longitudinally coupled resonator type surface acoustic wave elements includes three interdigital transducers, the number of the electrode fingers of a central interdigital transducer of the first longitudinally coupled resonator type surface acoustic wave element is different from the number of the electrode fingers of a central interdigital transducer of the second longitudinally coupled resonator type surface acoustic wave element, and the number of the electrode fingers of the central interdigital transducer of the third longitudinally coupled resonator type surface acoustic wave element is different from the number of the electrode fingers of the central interdigital transducer of the fourth longitudinally coupled resonator type surface acoustic wave element.

15. A surface acoustic wave device according to claim 12, wherein each of the first, second, third, and fourth longitudinally coupled resonator type surface acoustic wave elements includes three interdigital transducers, the number of the electrode lingers of a central interdigital transducer of the first longitudinally coupled resonator type surface acoustic wave element is different from the number of the electrode fingers of a central interdigital transducer of the second longitudinally coupled resonator type surface acoustic wave element, and the number of the electrode lingers of the central interdigital transducer of the third longitudinally coupled resonator type surface acoustic wave element is different from the number of the electrode fingers of the central interdigital transducer of the fourth longitudinally coupled resonator type surface acoustic wave element.

16. A surface acoustic wave device according to claim 10, wherein at least one surface acoustic wave resonator is cascaded between the first longitudinally coupled resonator type surface acoustic wave element and the second longitudinally coupled resonator type surface acoustic wave element and between the third longitudinally coupled resonator type surface acoustic wave element and the fourth longitudinally coupled resonator type surface acoustic wave element.

17. A surface acoustic wave device according to claim 11, wherein at least one surface acoustic wave resonator is cascaded between the first longitudinally coupled resonator type surface acoustic wave element and the second longitudinally coupled resonator type surface acoustic wave element and between the third longitudinally coupled resonator type surface acoustic wave element and the fourth longitudinally coupled resonator type surface acoustic wave element.

18. A surface acoustic wave device according to claim 12, wherein at least one surface acoustic wave resonator is cascaded between the first longitudinally coupled resonator type surface acoustic wave element end the second longitudinally coupled resonator type surface acoustic wave element and between the third longitudinally coupled resonator type surface acoustic wave element and the fourth longitudinally coupled resonator type surface acoustic wave element.

19. A surface acoustic wave device according to claim 10, wherein the ratio of input impedance to output impedance is about 1:2 or about 1:3 or the ratio of output impedance to input impedance is about 1:2 or about 1:3.

20. A surface acoustic wave device according to claim 11, wherein the ratio of input impedance to output impedance is about 1:2 or about 1:3 or the ratio of output impedance to input impedance is about 1:2 or about 1:3.

21. A surface acoustic wave device according to claim 12, wherein the ratio of input impedance to output impedance is about 1:2 or about 1:3 or the ratio of output impedance to input impedance is about 1:2 or about 1:3.

22. A surface acoustic wave device according to claim 10, wherein a balanced-unbalanced conversion function is provided.

23. A surface acoustic wave device according to claim 11, wherein a balanced-unbalanced conversion function is provided.

24. A surface acoustic wave device according to claim 12, wherein a balanced-unbalanced conversion function is provided.

25. A communication apparatus comprising the surface acoustic wave device as set forth in claim 10.

26. A communication apparatus comprising the surface acoustic wave device as set forth in claim 11.

27. A communication apparatus comprising the surface acoustic wave device as set forth in claim 12.

\* \* \* \* \*